United States Patent
Hoshino

(10) Patent No.: US 12,062,677 B2
(45) Date of Patent: Aug. 13, 2024

(54) IMAGING APPARATUS

(71) Applicant: Sony Semiconductor Solutions Corporation, Kanagawa (JP)

(72) Inventor: Kozo Hoshino, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/360,601

(22) Filed: Jul. 27, 2023

(65) Prior Publication Data

US 2023/0387155 A1 Nov. 30, 2023

Related U.S. Application Data

(63) Continuation of application No. 17/766,368, filed as application No. PCT/JP2021/042408 on Nov. 18, 2021, now Pat. No. 11,769,776.

(30) Foreign Application Priority Data

Dec. 16, 2020 (JP) ................................. 2020-208541

(51) Int. Cl.
*H01L 27/146* (2006.01)
*H04N 25/13* (2023.01)
(Continued)

(52) U.S. Cl.
CPC .. *H01L 27/14621* (2013.01); *H01L 27/14627* (2013.01); *H04N 25/134* (2023.01); *H04N 25/704* (2023.01); *H04N 25/75* (2023.01)

(58) Field of Classification Search
CPC ......... H01L 27/14621; H01L 27/14627; H01L 27/14623; H01L 27/1463; H01L 27/14641; H01L 27/14625; H01L 27/14603; H04N 25/134; H04N 25/704; H04N 25/75; H04N 25/42
See application file for complete search history.

(56) References Cited

U.S. PATENT DOCUMENTS 9,386,285 B2 * 7/2016 Okigawa ........... H01L 27/14627
2013/0222546 A1 * 8/2013 Takahashi ......... H01L 27/14629
348/46

(Continued)

FOREIGN PATENT DOCUMENTS

JP 2001-250931 A 9/2001
JP 2013254076 A 12/2013
(Continued)

OTHER PUBLICATIONS

International Search Report (PCT/ISA/210), International Application No. PCT/JP2021/042408, dated Jan. 11, 2022.
(Continued)

*Primary Examiner* — Nhan T Tran
(74) *Attorney, Agent, or Firm* — Michael Best & Friedrich LLP

(57) ABSTRACT

An imaging apparatus of the present disclosure includes: a plurality of pixel blocks that each includes a plurality of light-receiving pixels including color filters of mutually the same color, the plurality of light-receiving pixels being divided into a plurality of pixel pairs each including two light-receiving pixels; and a plurality of lenses provided at respective positions corresponding to the plurality of pixel pairs.

23 Claims, 42 Drawing Sheets

(51) Int. Cl.
  *H04N 25/704*   (2023.01)
  *H04N 25/75*    (2023.01)

(56) References Cited

U.S. PATENT DOCUMENTS

| | | | |
|---|---|---|---|
| 2014/0118577 A1* | 5/2014 | Masuda | H04N 23/69 |
| | | | 348/240.2 |
| 2014/0204251 A1 | 7/2014 | Ishida | |
| 2014/0253808 A1* | 9/2014 | Tachi | H04N 9/64 |
| | | | 348/624 |
| 2015/0028404 A1* | 1/2015 | Kunikiyo | H01L 27/14603 |
| | | | 257/292 |
| 2015/0092092 A1* | 4/2015 | Okigawa | H01L 27/14605 |
| | | | 348/280 |
| 2017/0099449 A1* | 4/2017 | Kang | H04N 23/67 |
| 2017/0347042 A1* | 11/2017 | Borthakur | H04N 23/672 |
| 2017/0353679 A1* | 12/2017 | Negishi | H04N 25/583 |
| 2018/0350856 A1 | 12/2018 | Masagaki | |
| 2020/0280659 A1* | 9/2020 | Galor Gluskin | H04N 25/533 |
| 2020/0358989 A1* | 11/2020 | Hoshino | H01L 27/14621 |

FOREIGN PATENT DOCUMENTS

| | | |
|---|---|---|
| JP | 2014183026 A | 9/2014 |
| WO | 2016/098640 A1 | 6/2016 |
| WO | 2019/102887 A1 | 5/2019 |
| WO | 2020/017337 A1 | 1/2020 |

OTHER PUBLICATIONS

Notification of Transmittal of the International Search Report and the Written Opinion of the International Searching Authority, or the Declaration (PCT/ISA/220), International Application No. PCT/JP2021/042408, dated Jan. 11, 2022.

Written Opinion of the International Search Authority (PCT/ISA/237), International Application No. PCT/JP2021/042408, dated Jan. 11, 2022.

* cited by examiner

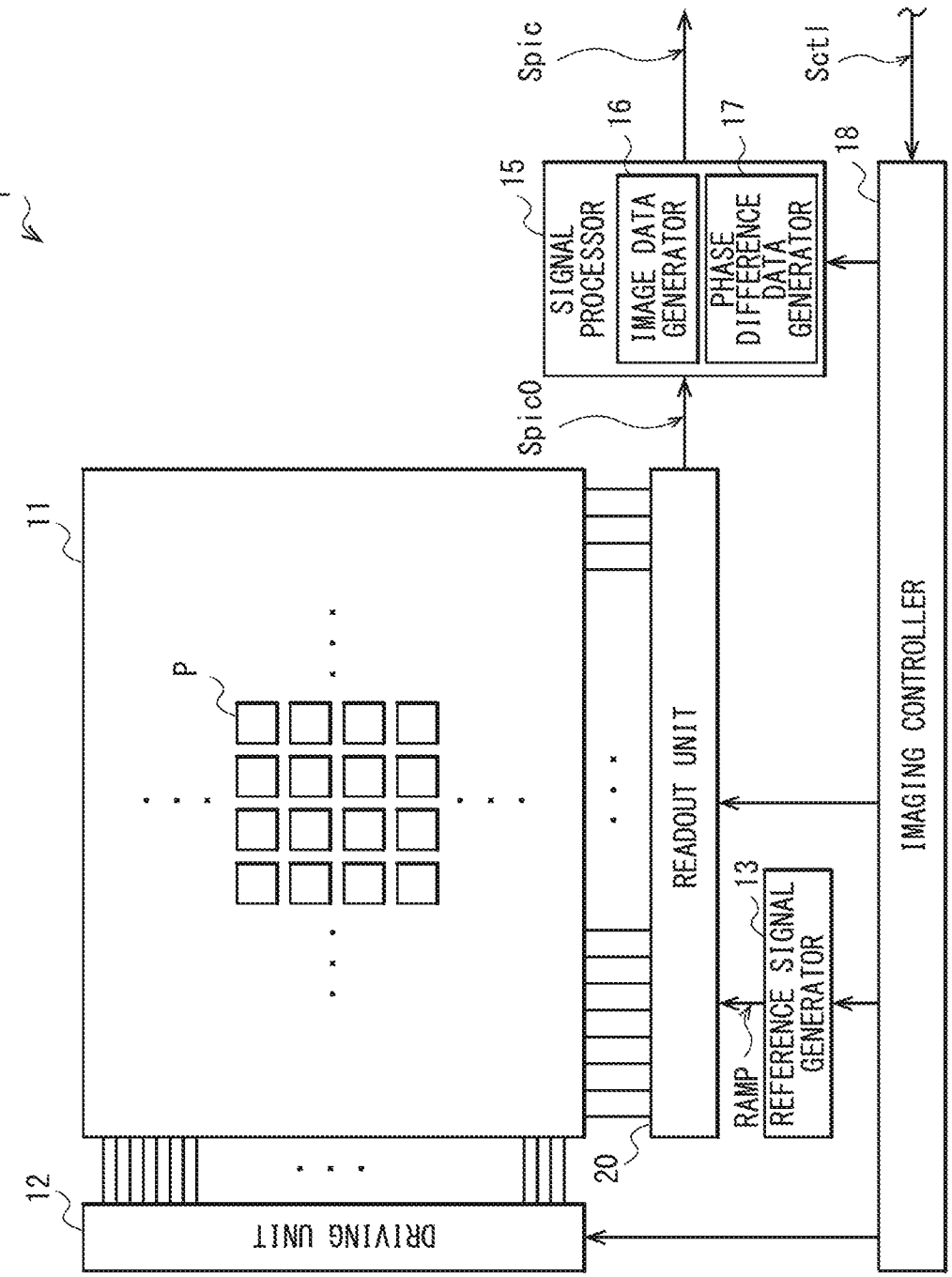

[FIG. 2]
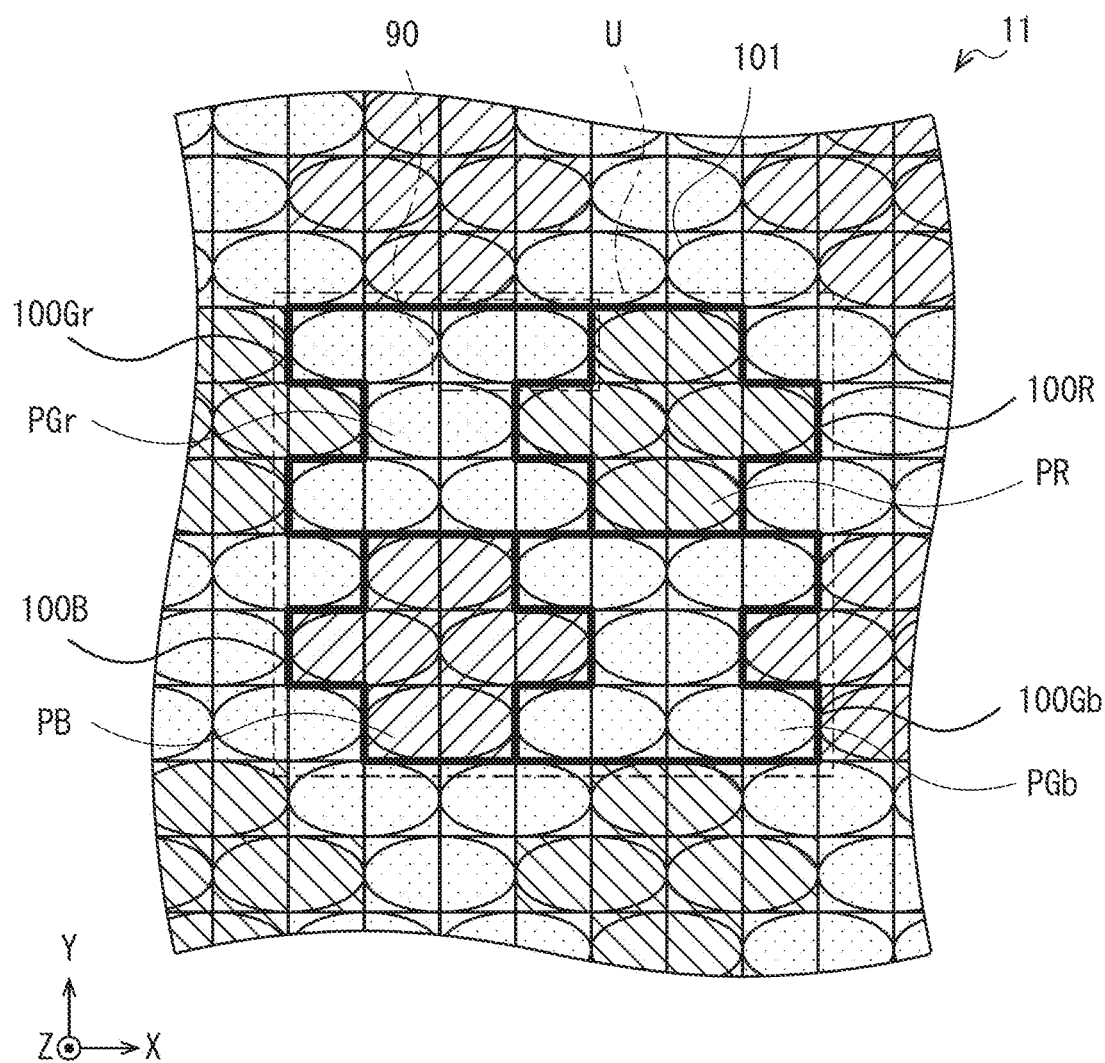

[FIG. 3]
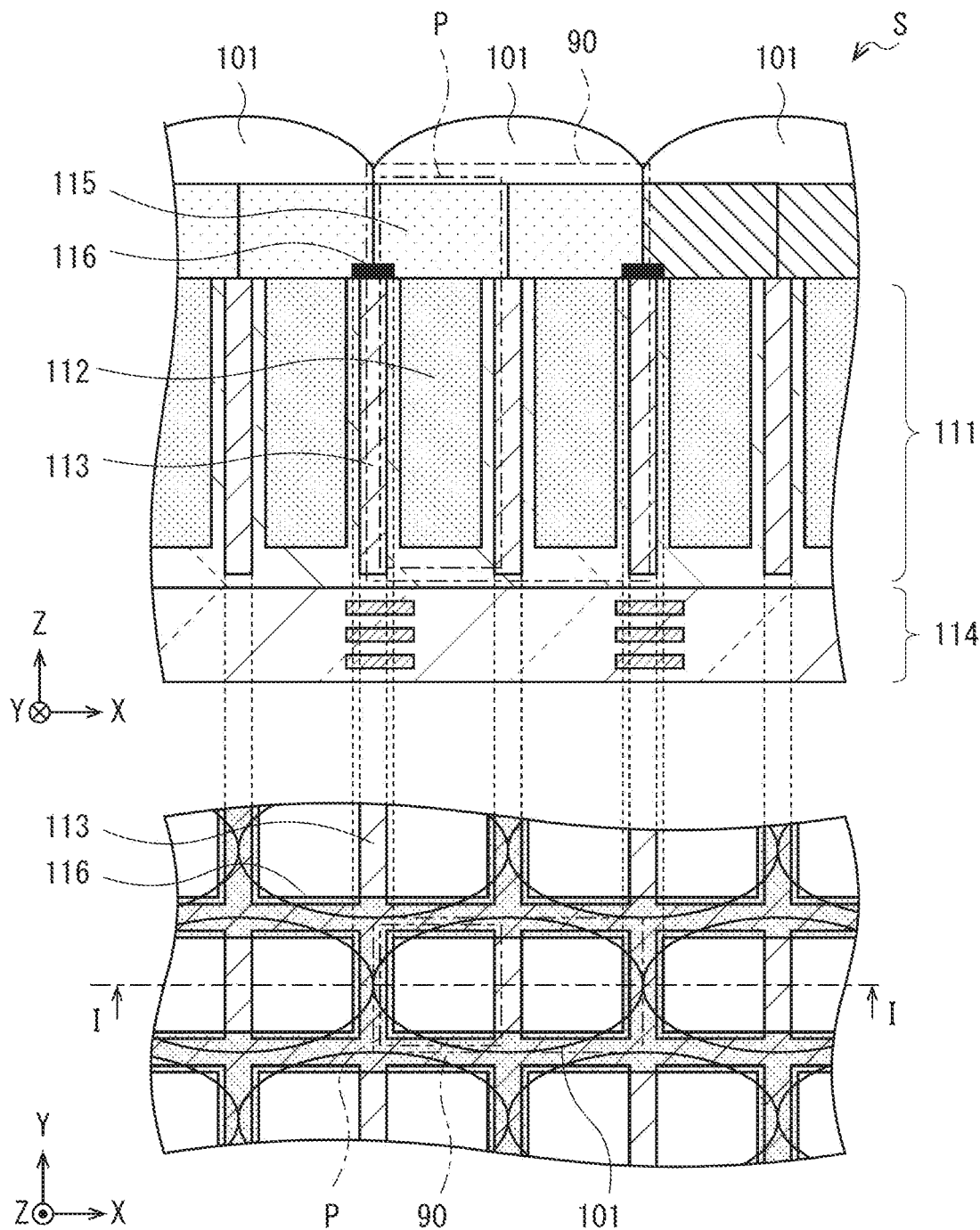

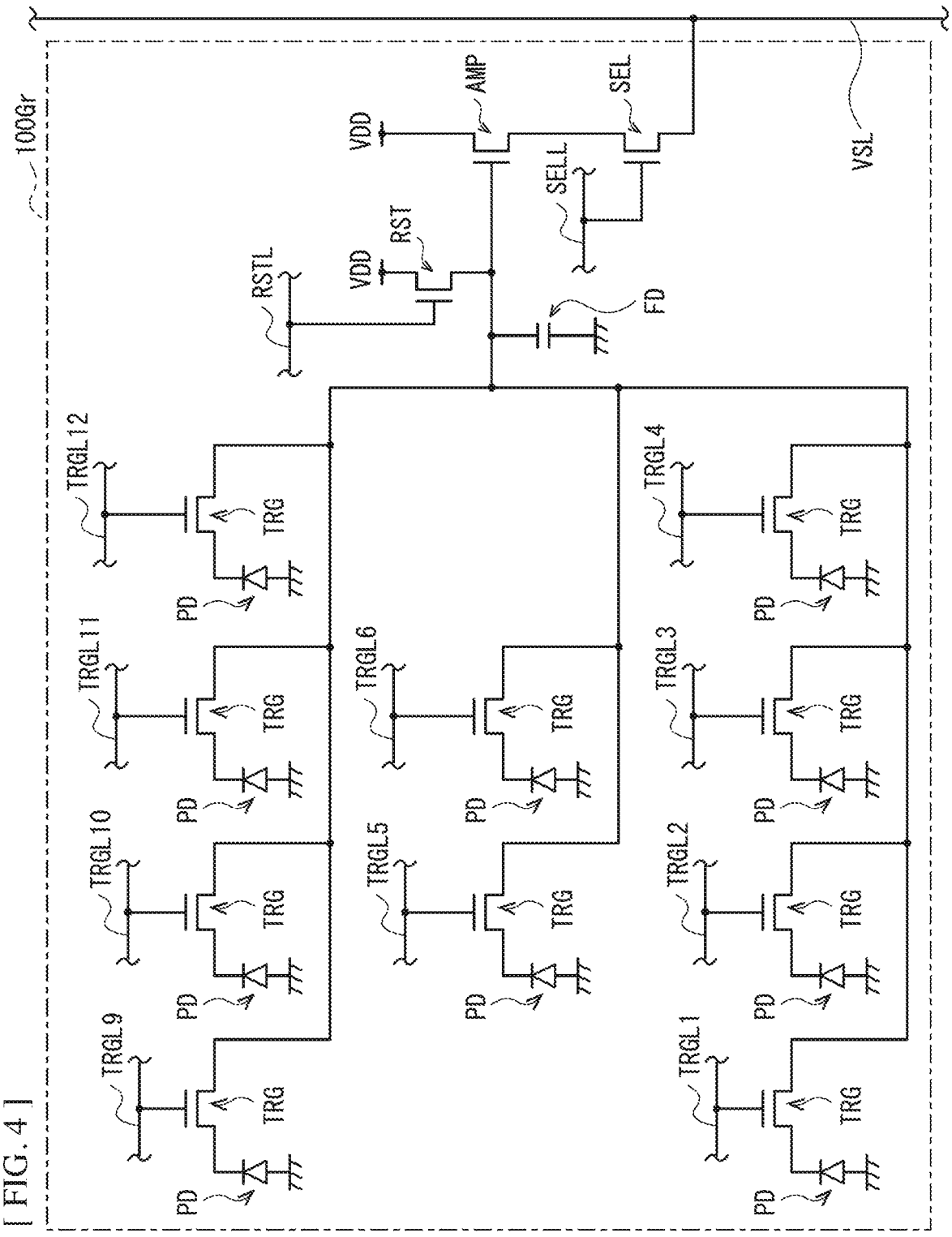
[FIG. 4]

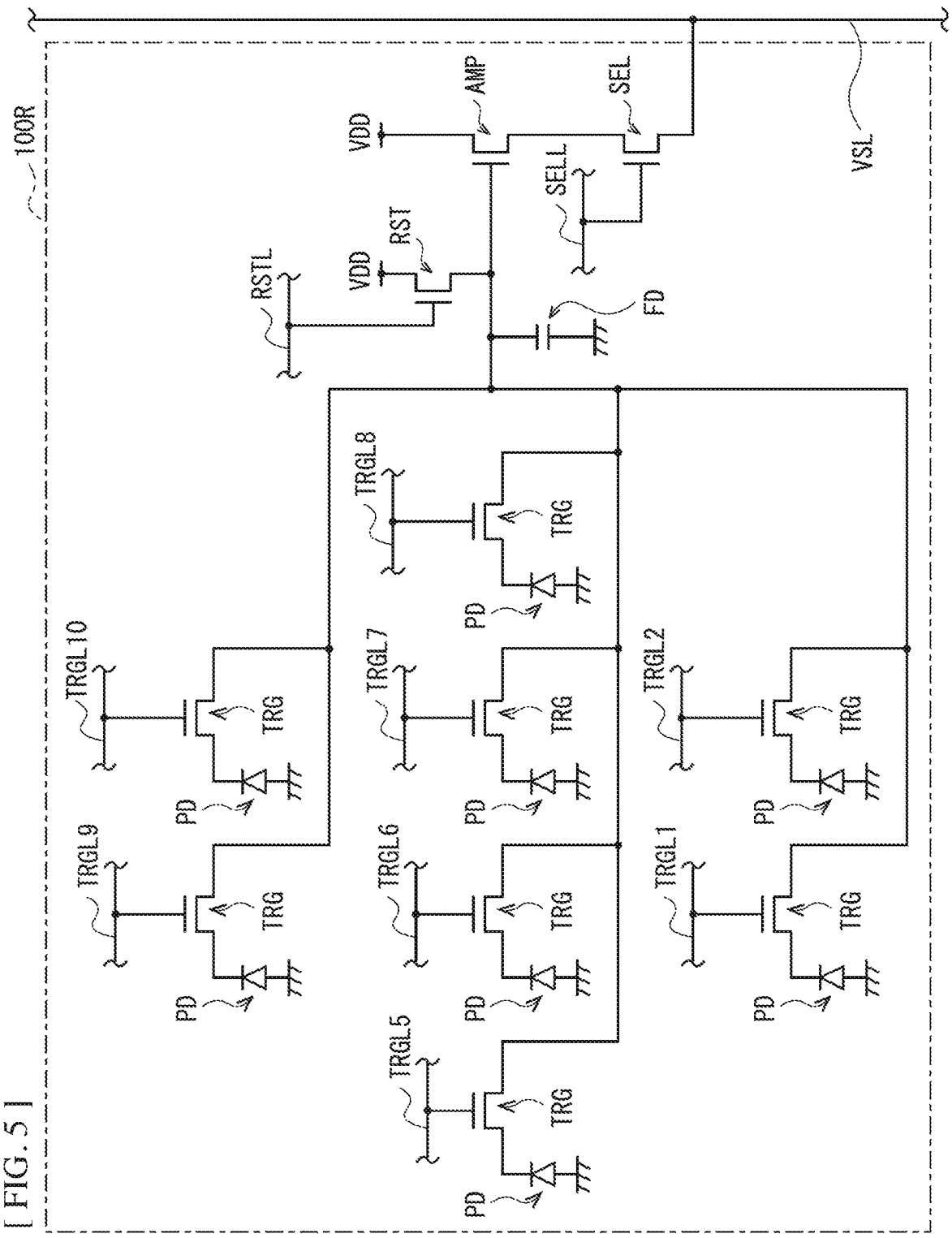

[FIG. 6]
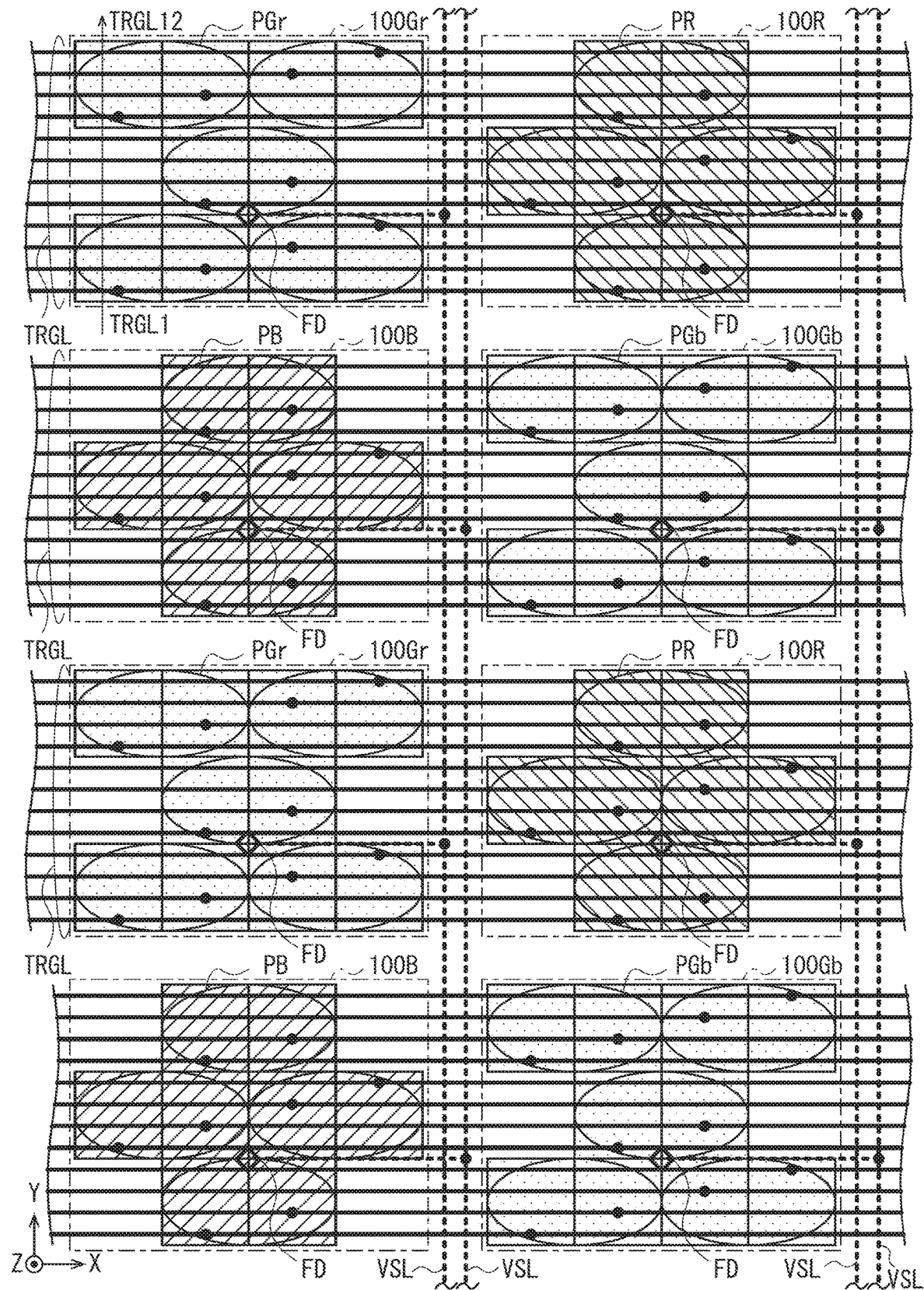

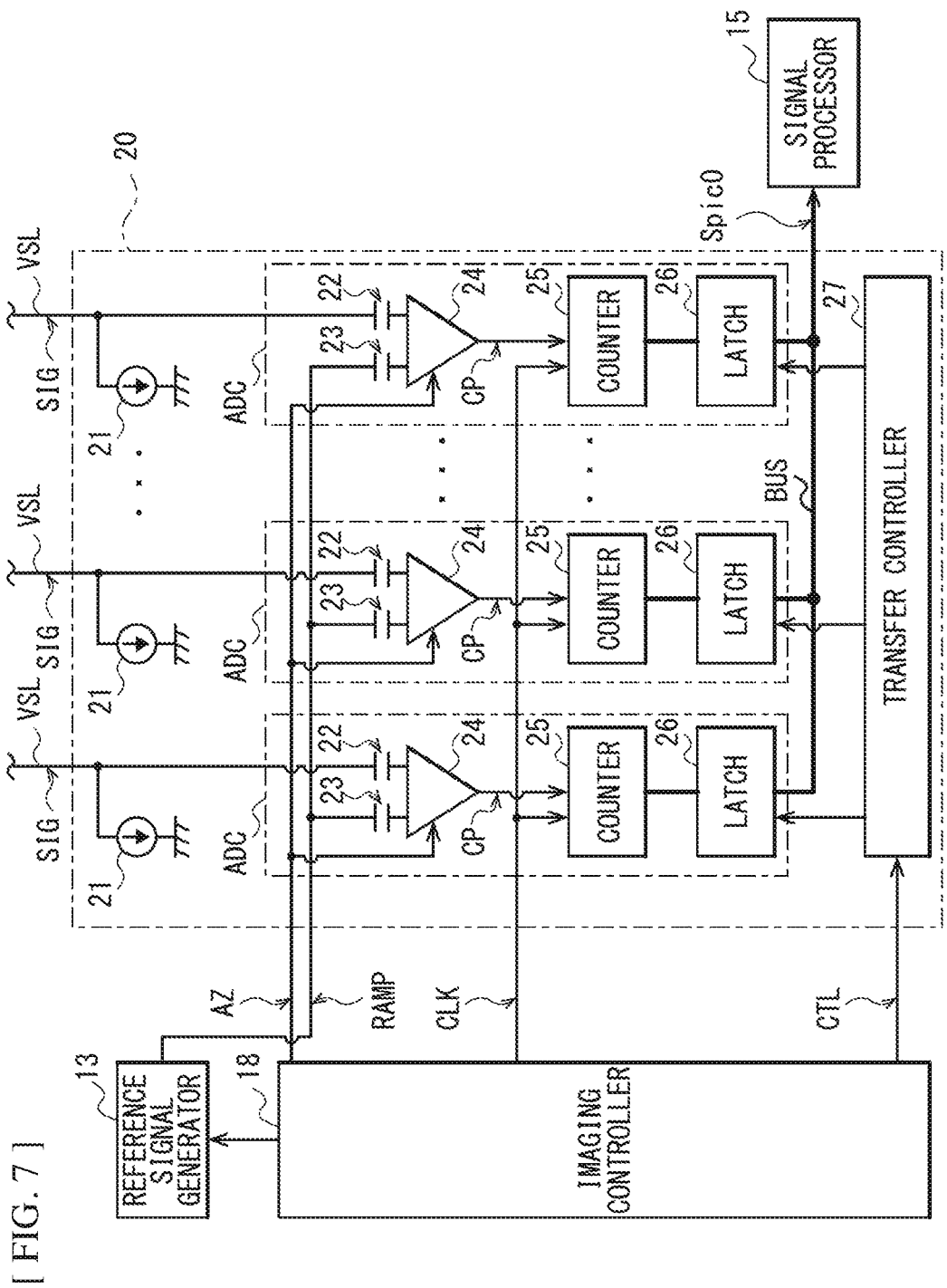

[FIG. 8]
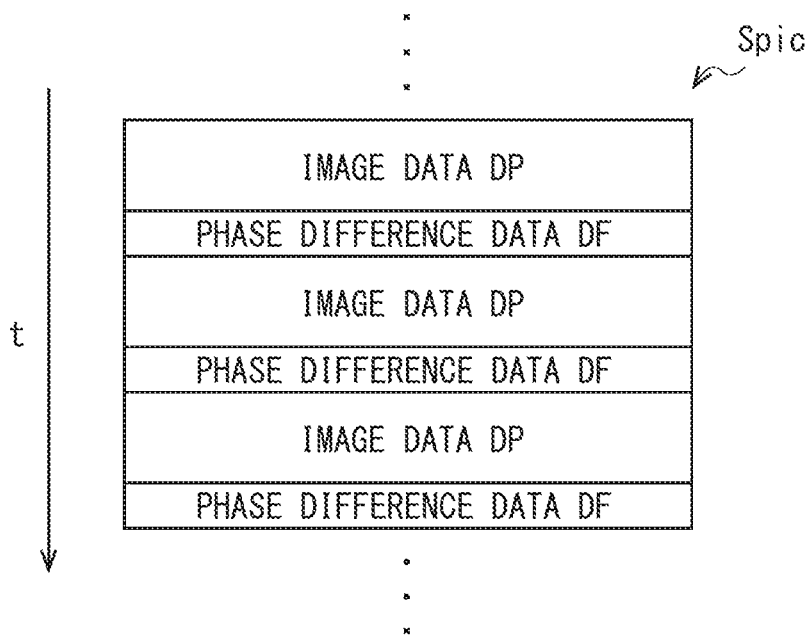

[FIG. 9]
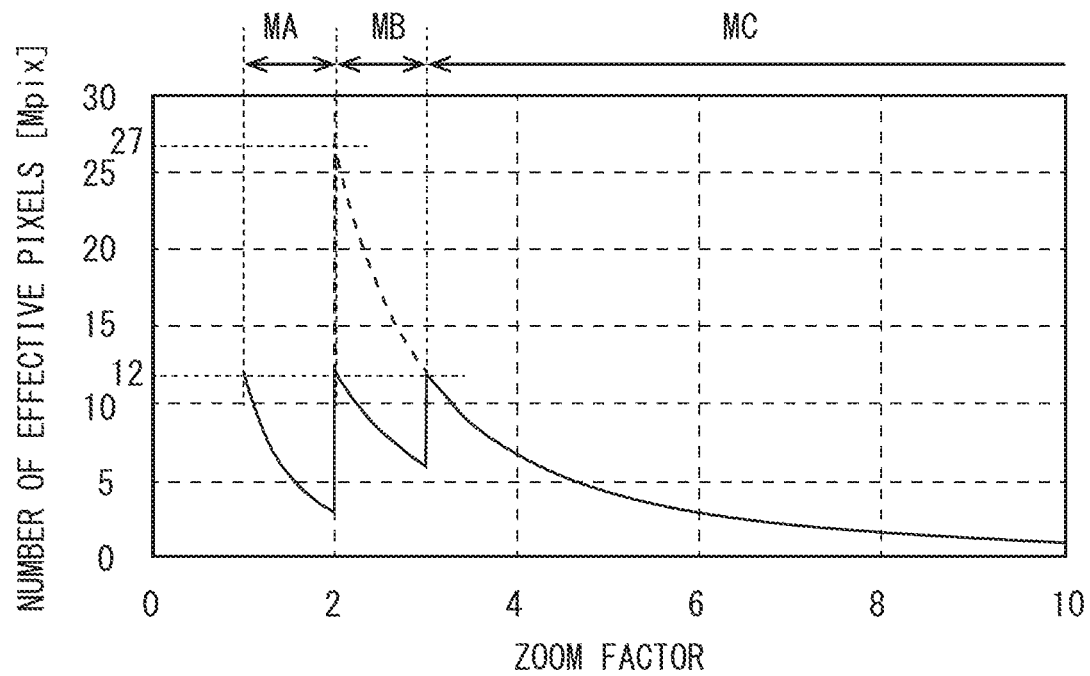

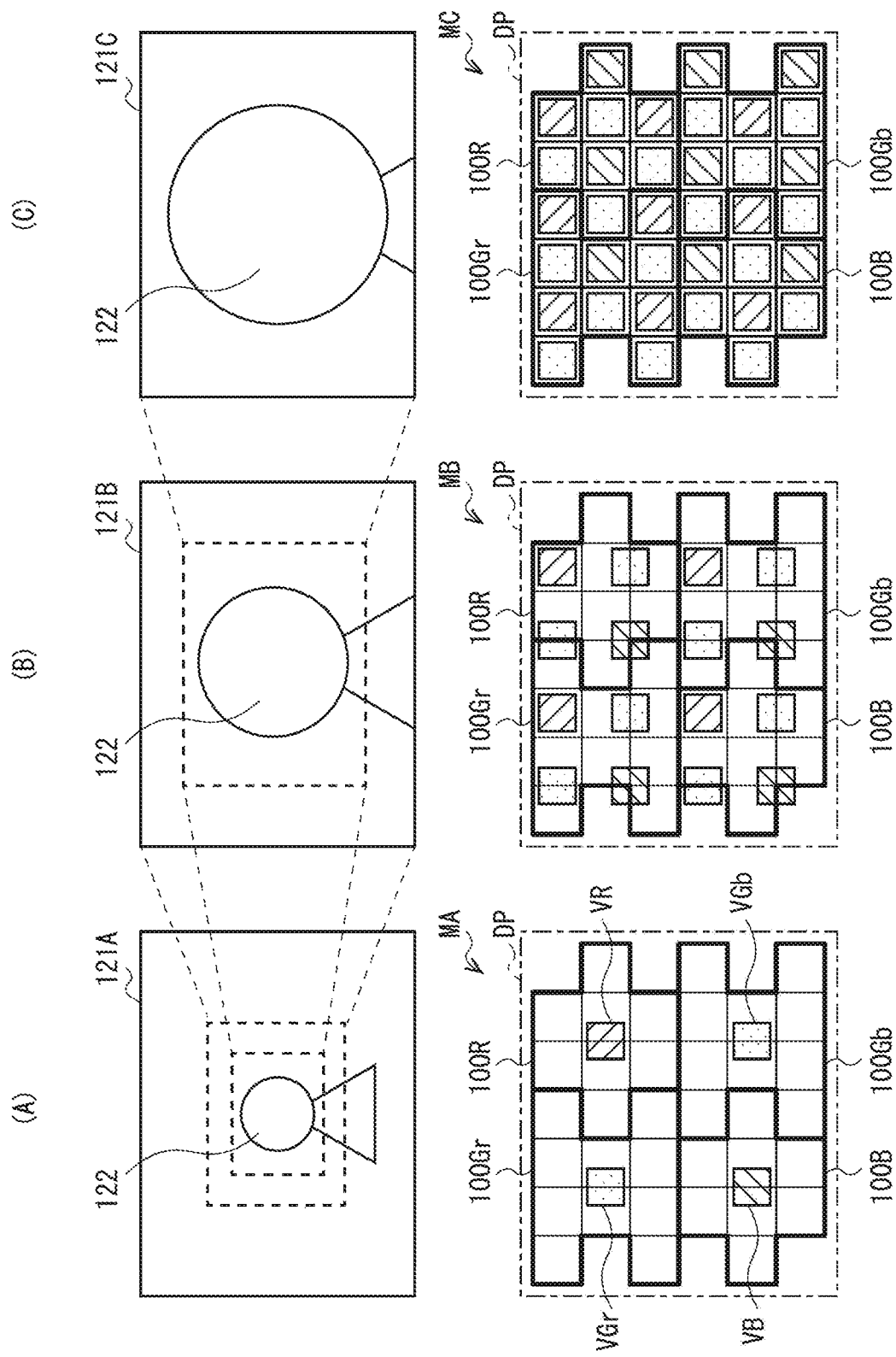
[FIG. 10]

[ FIG. 11 ]
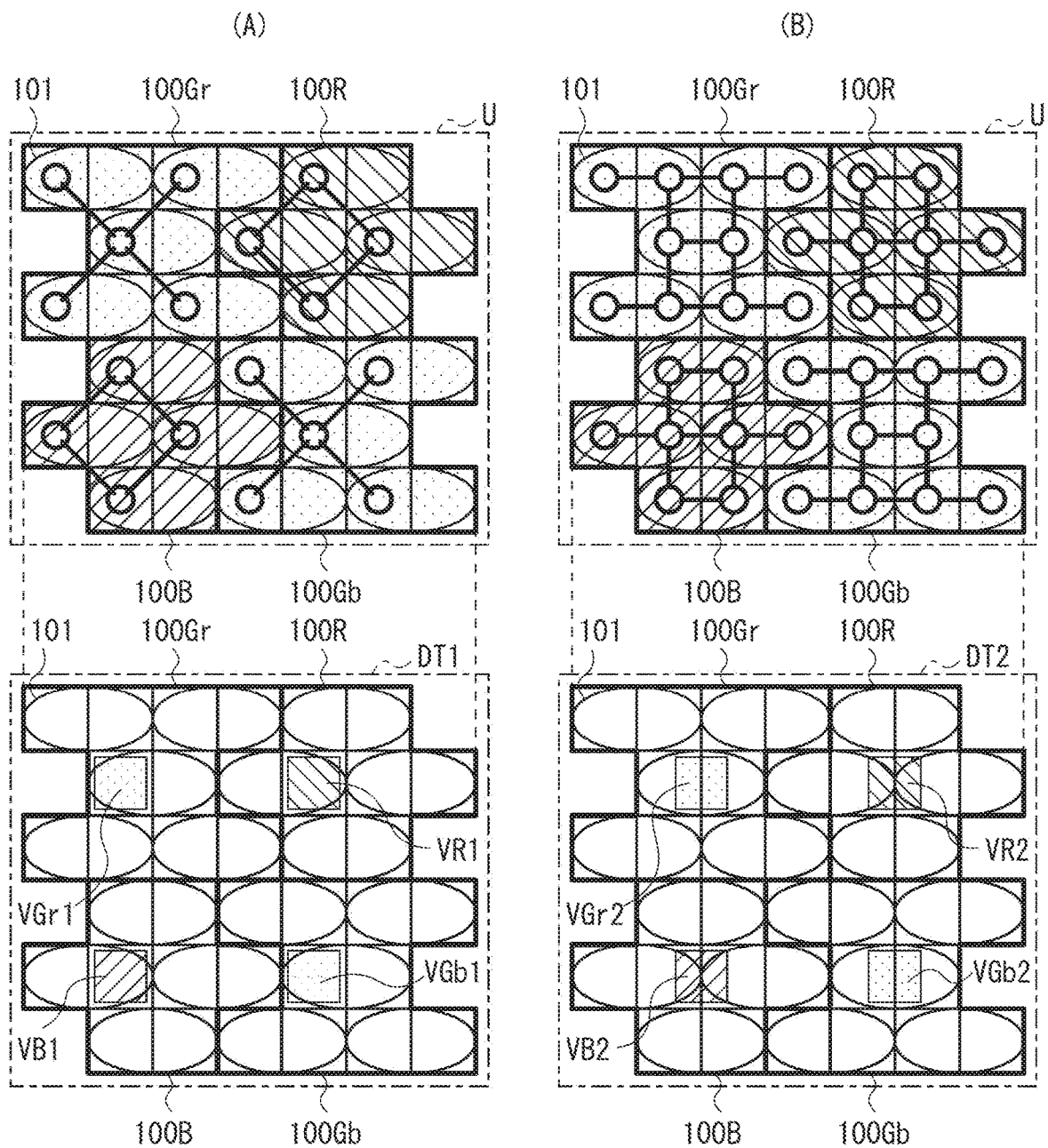

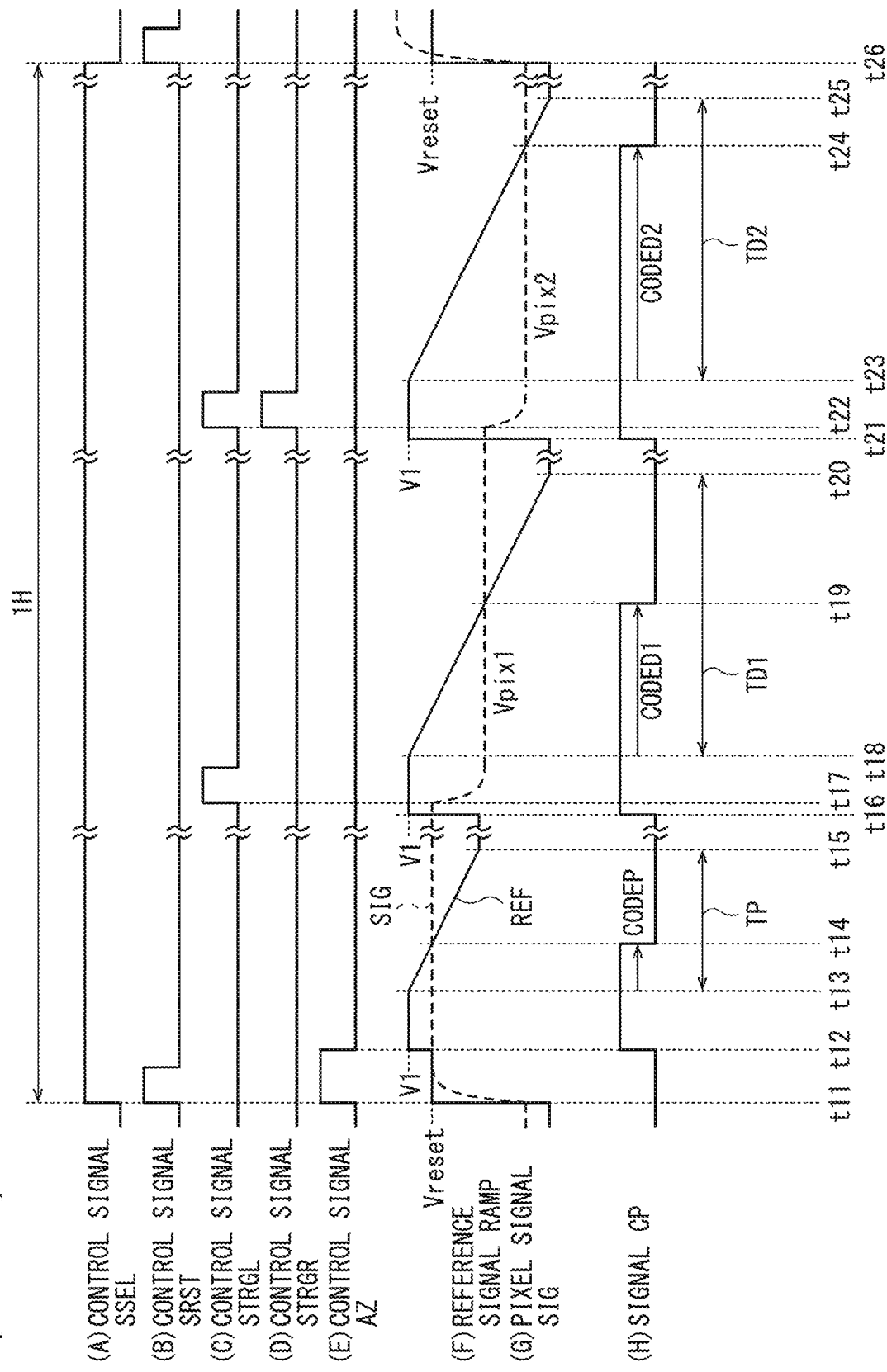

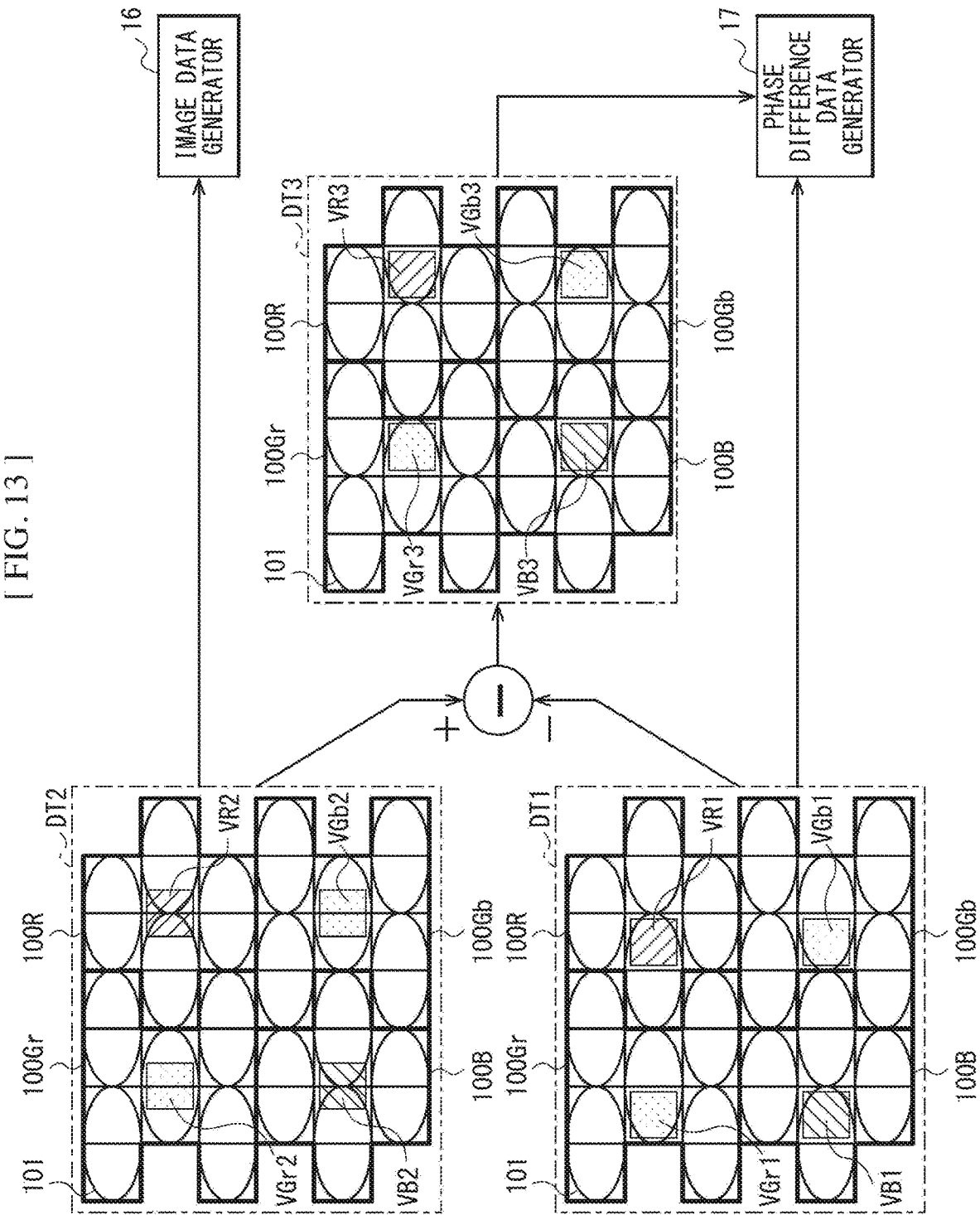
[FIG. 13]

[ FIG. 14 ]
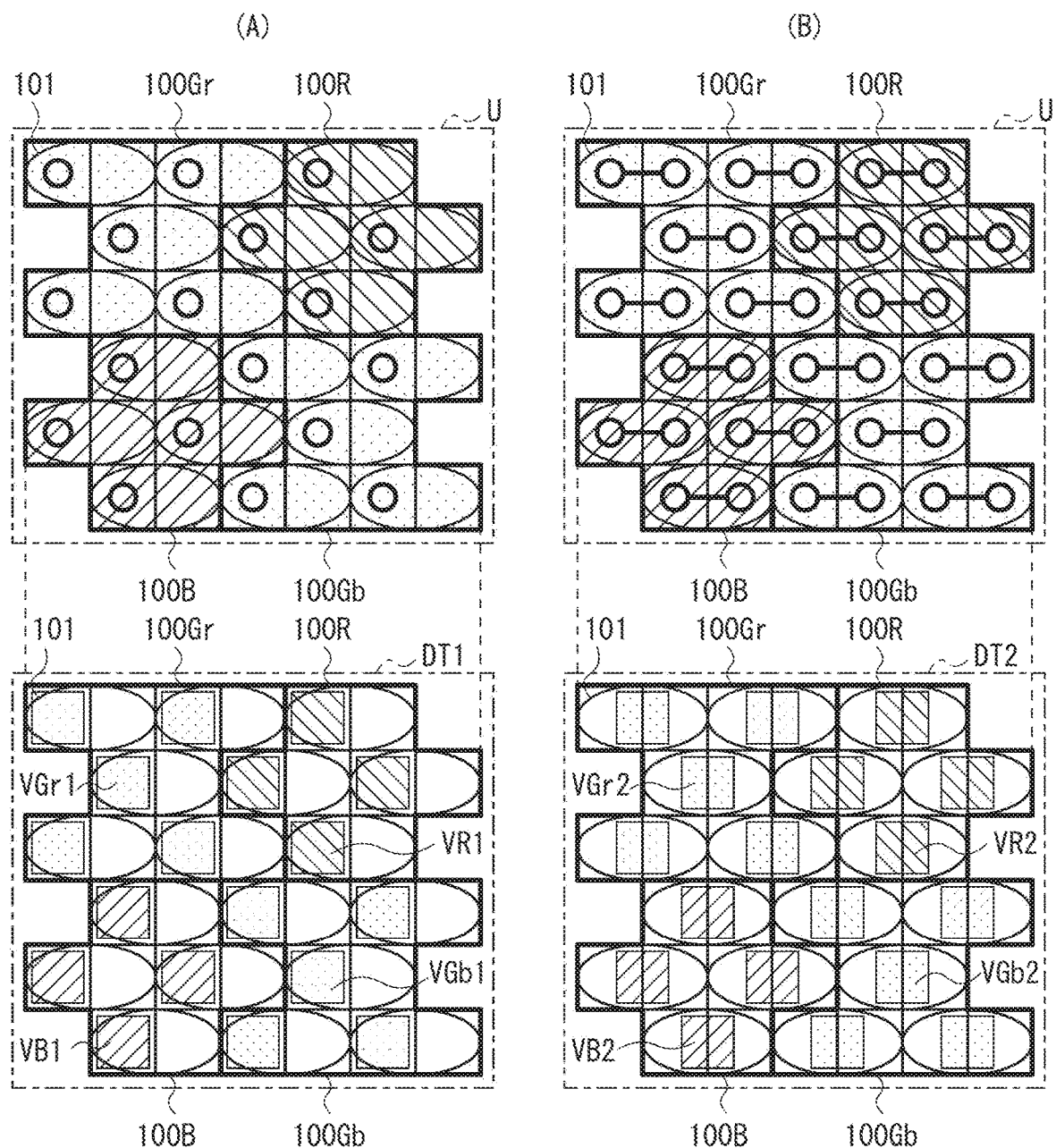

[FIG. 15]
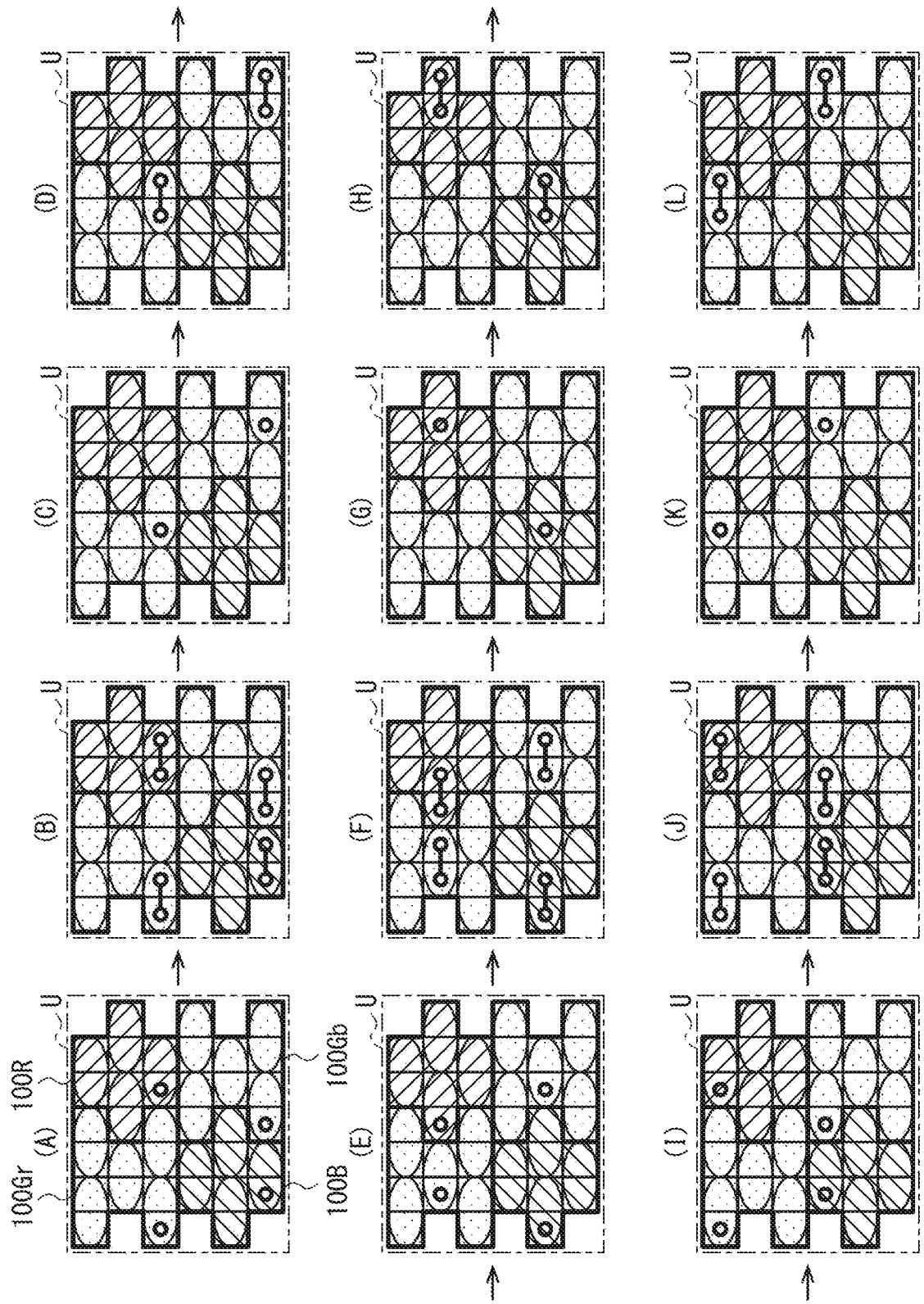

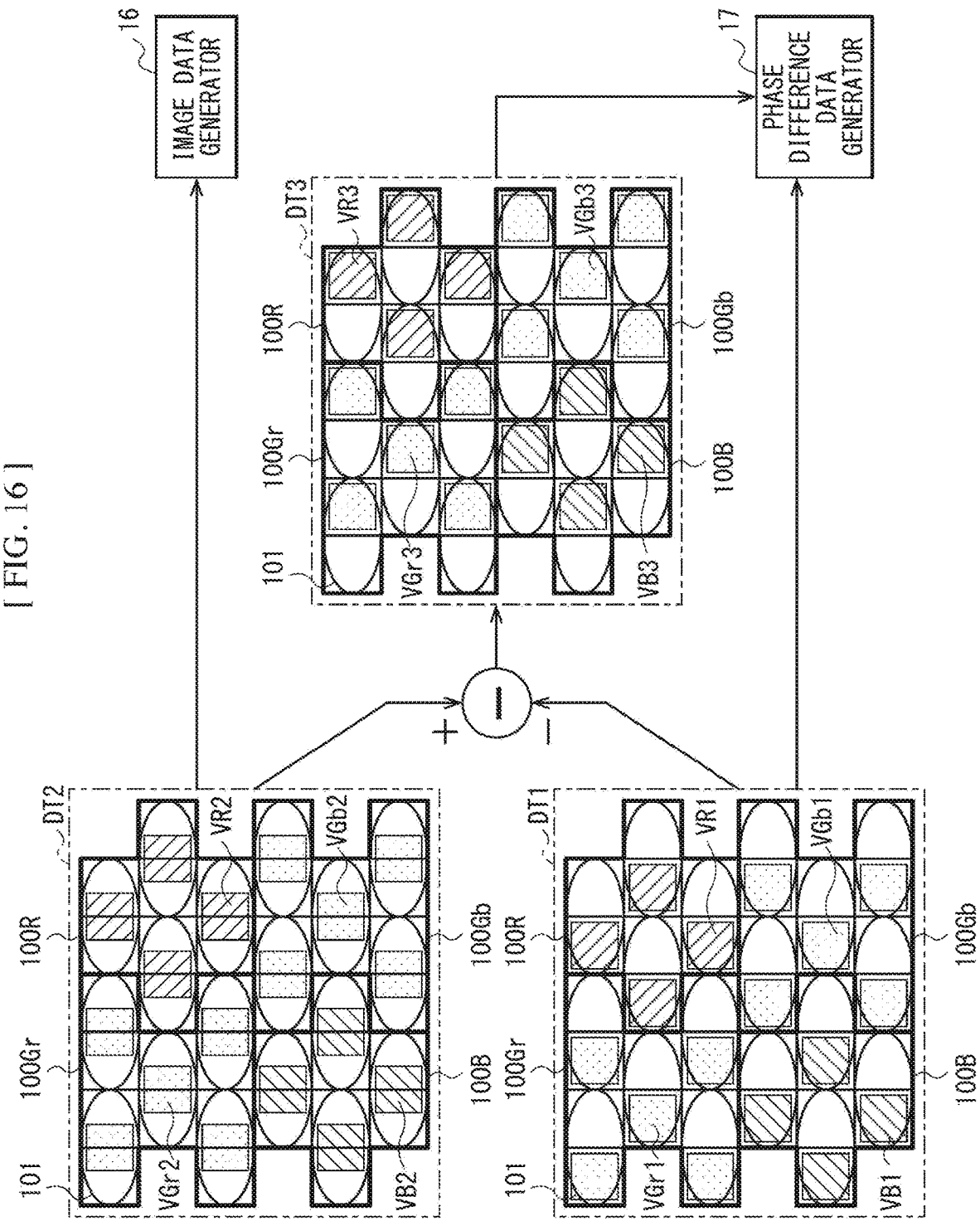

[FIG. 17]
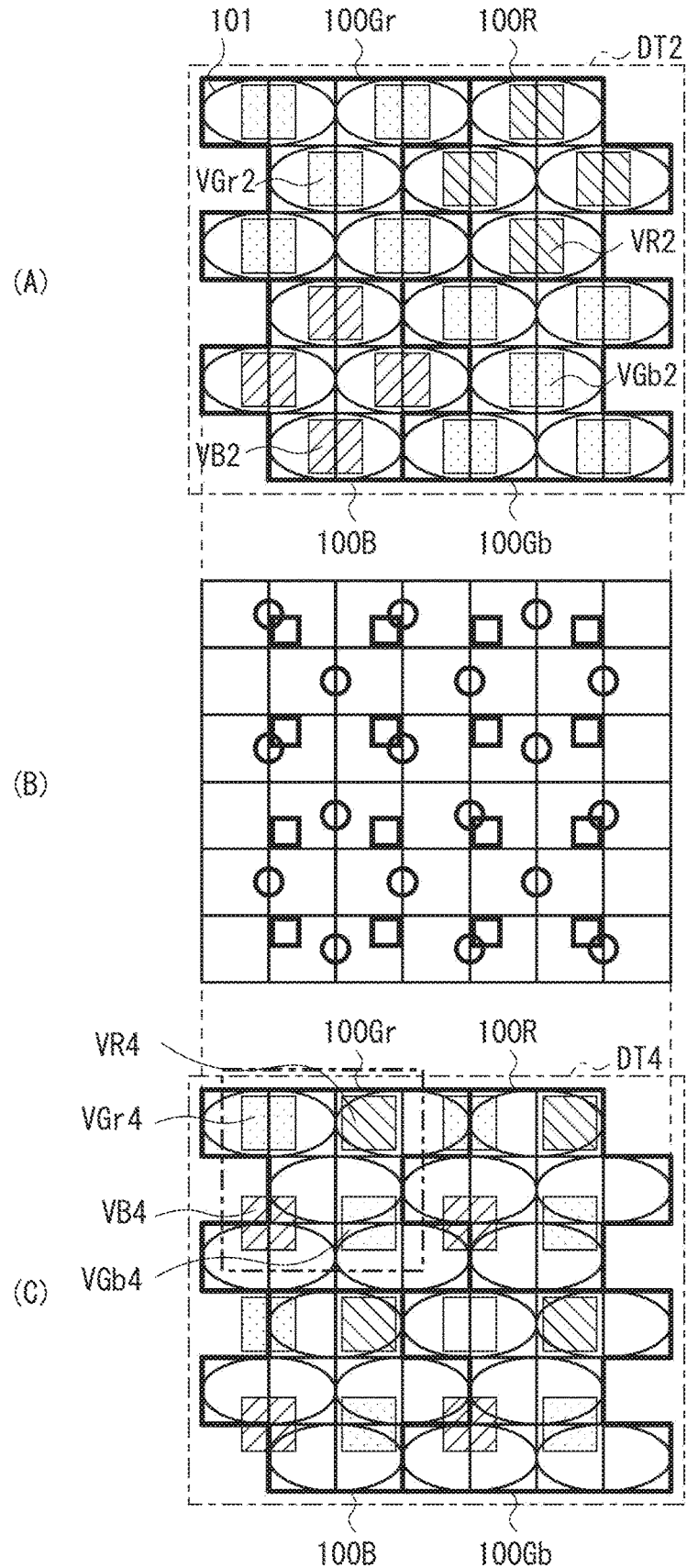

[FIG. 18A]
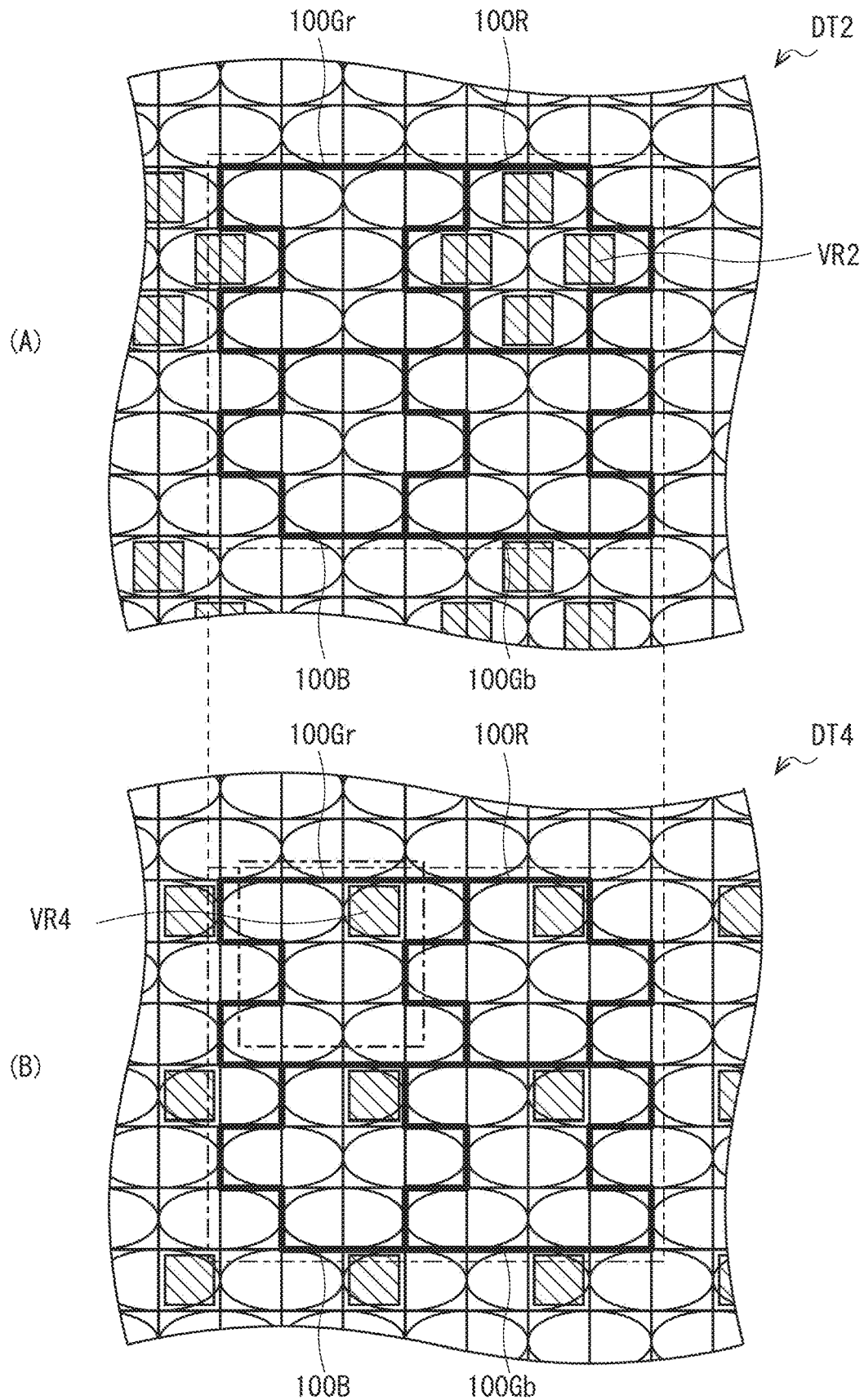

[FIG. 18B]
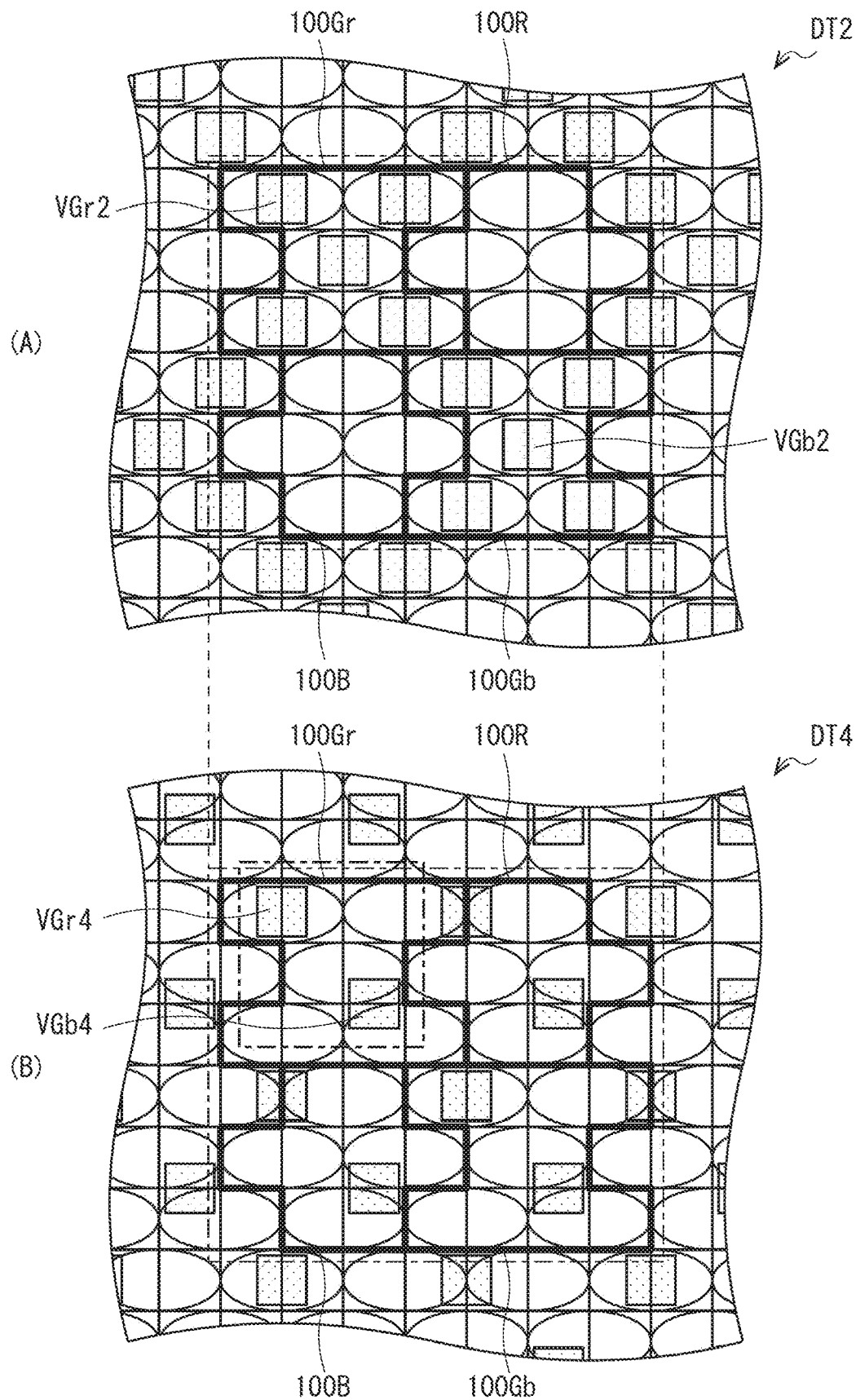

[FIG. 18C]
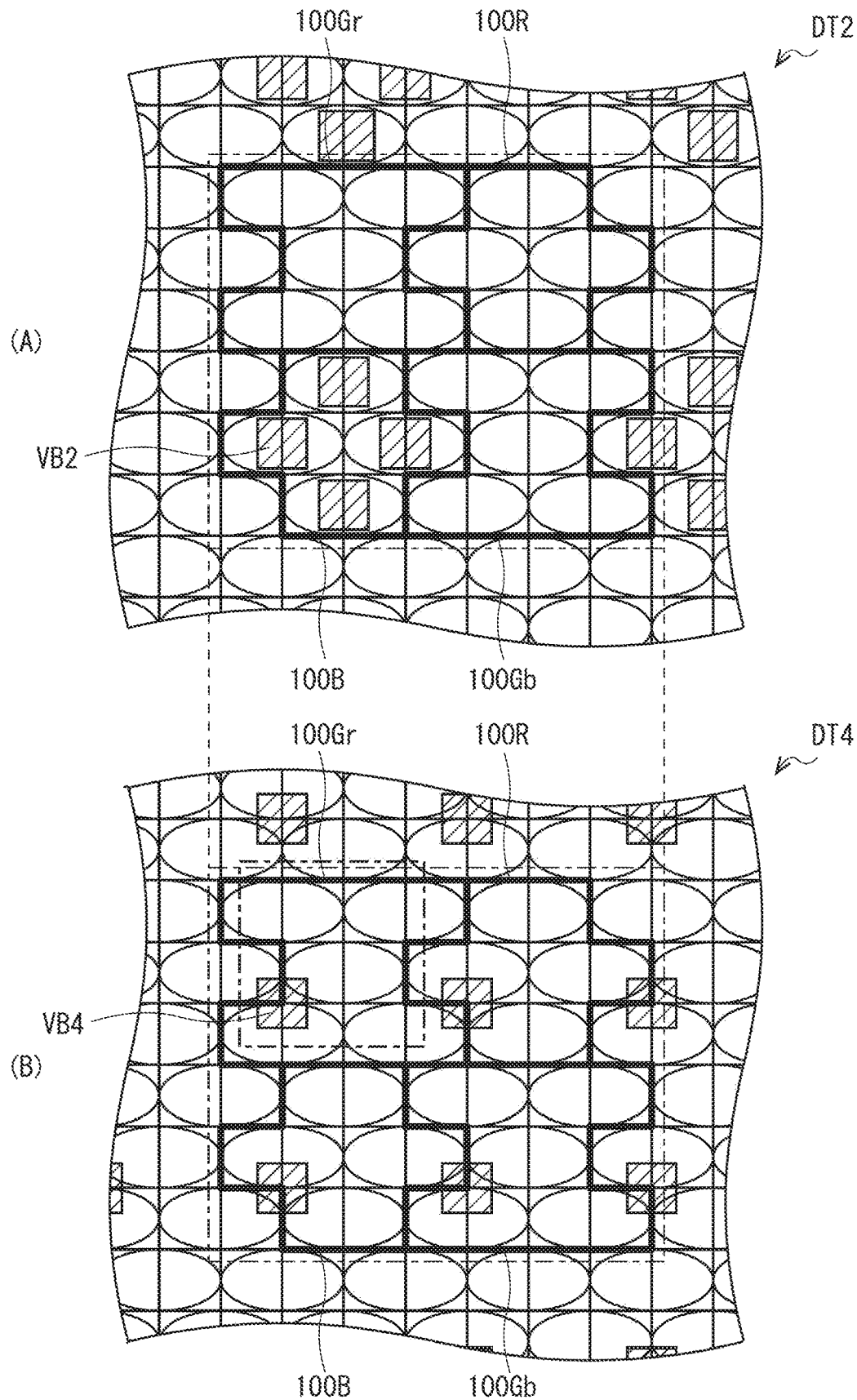

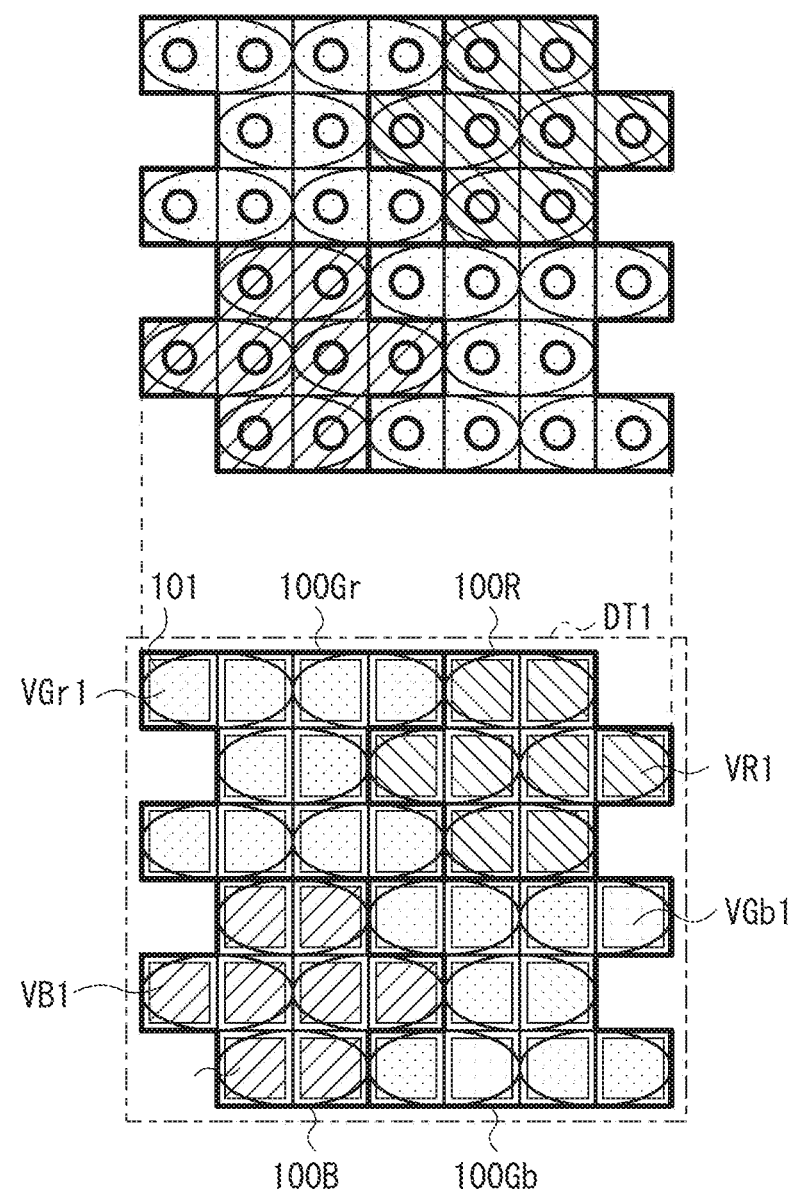
[FIG. 19]

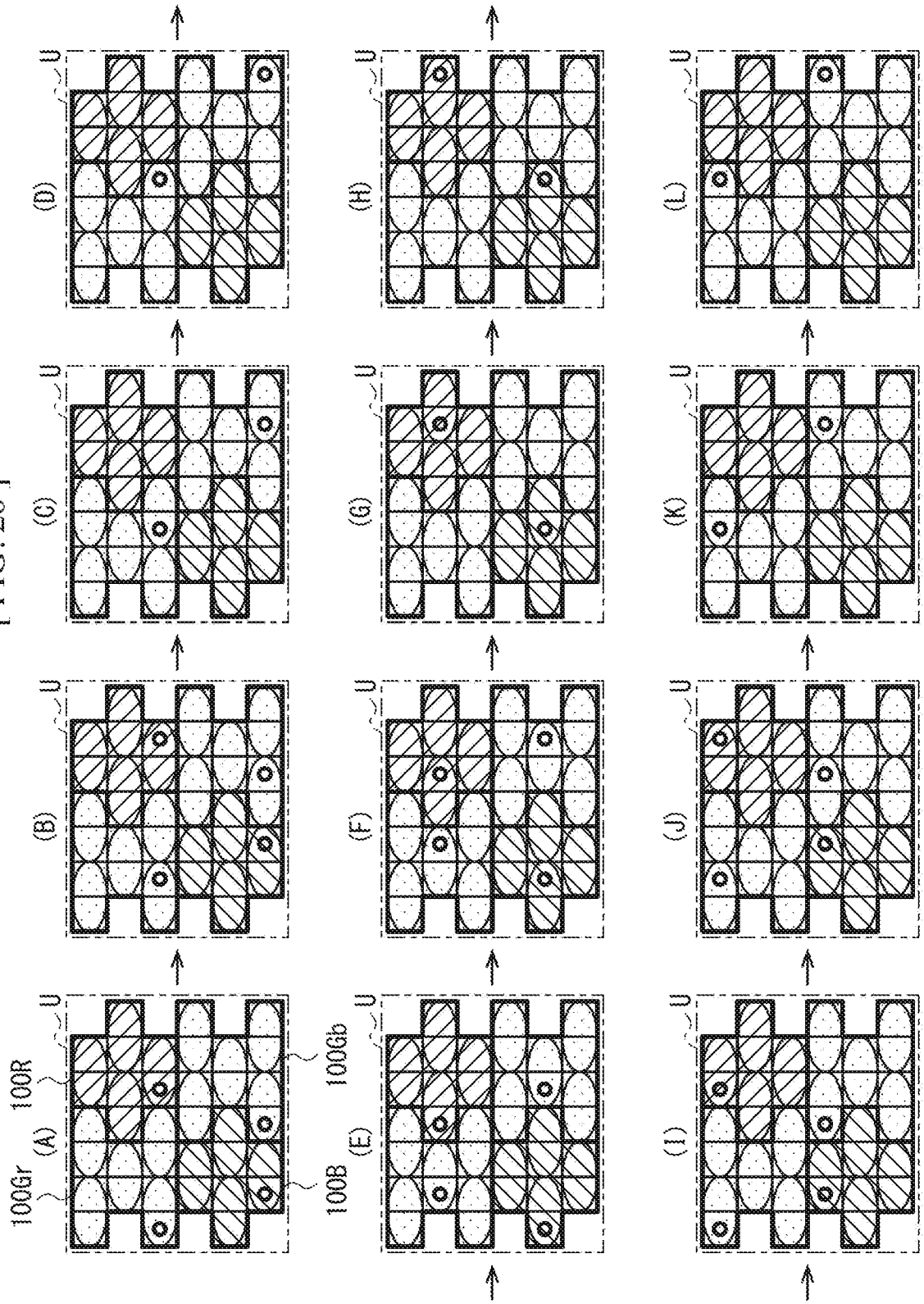
[FIG. 20]

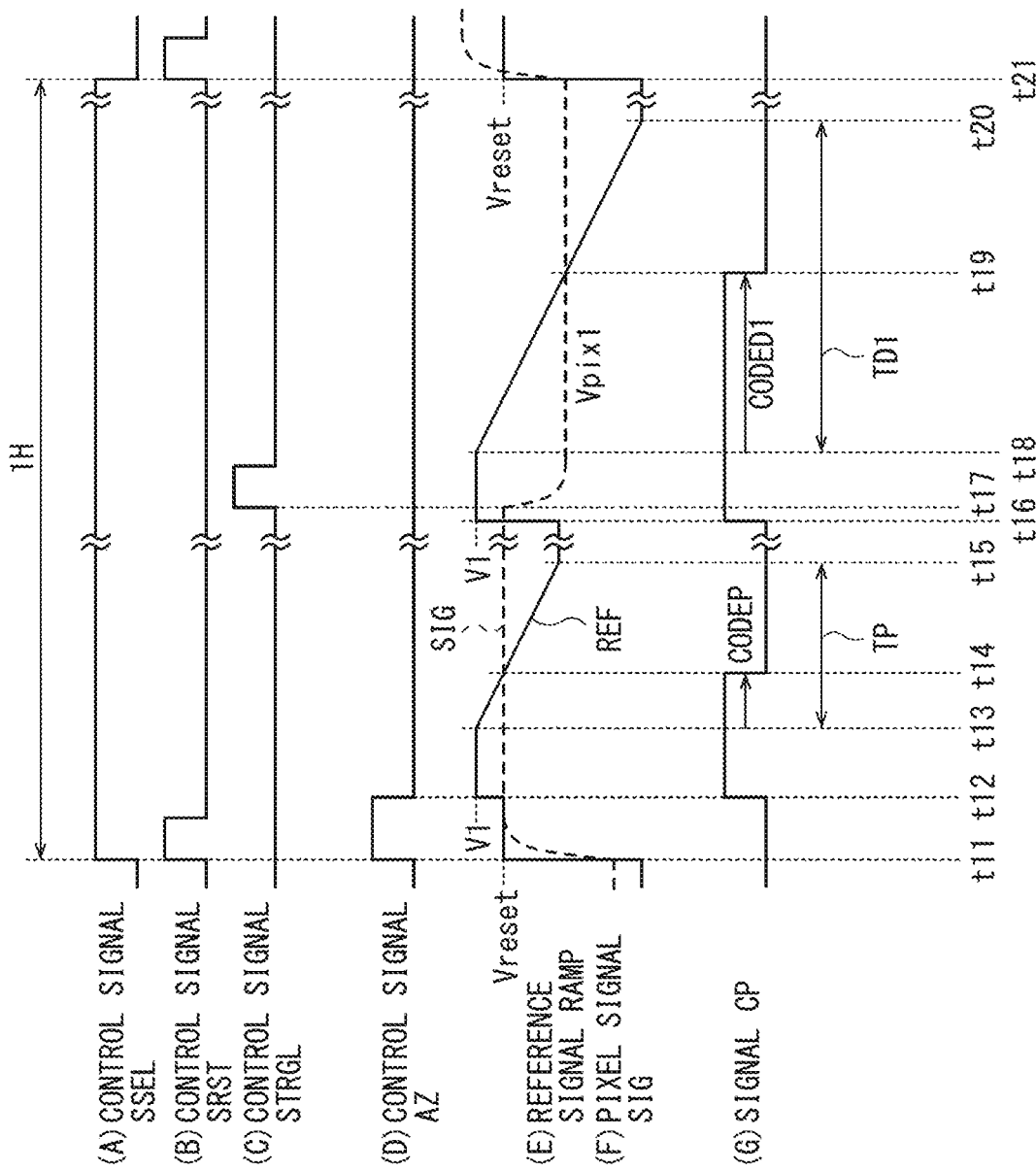

[ FIG. 22 ]
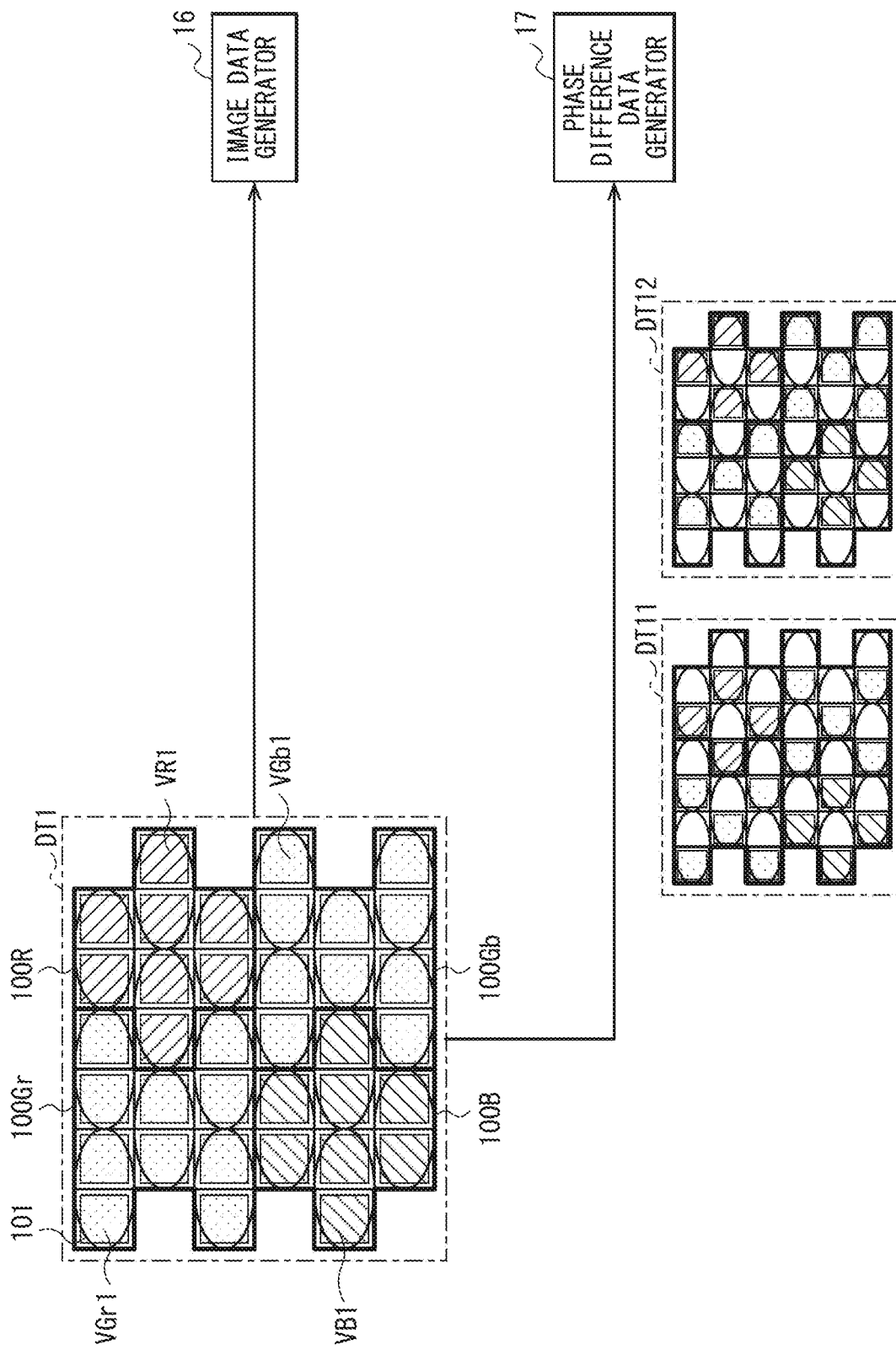

[FIG. 23]
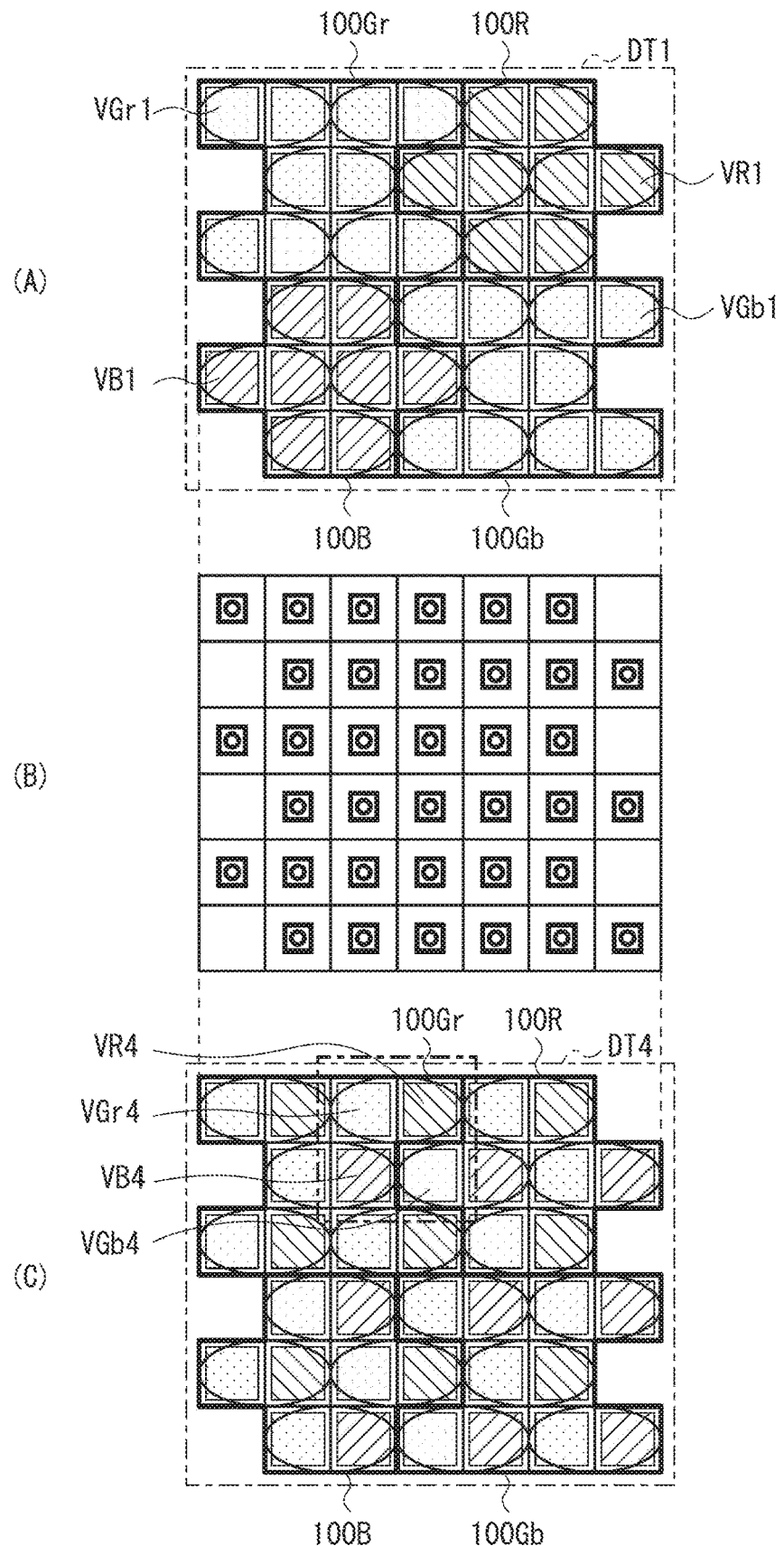

[FIG. 24A]
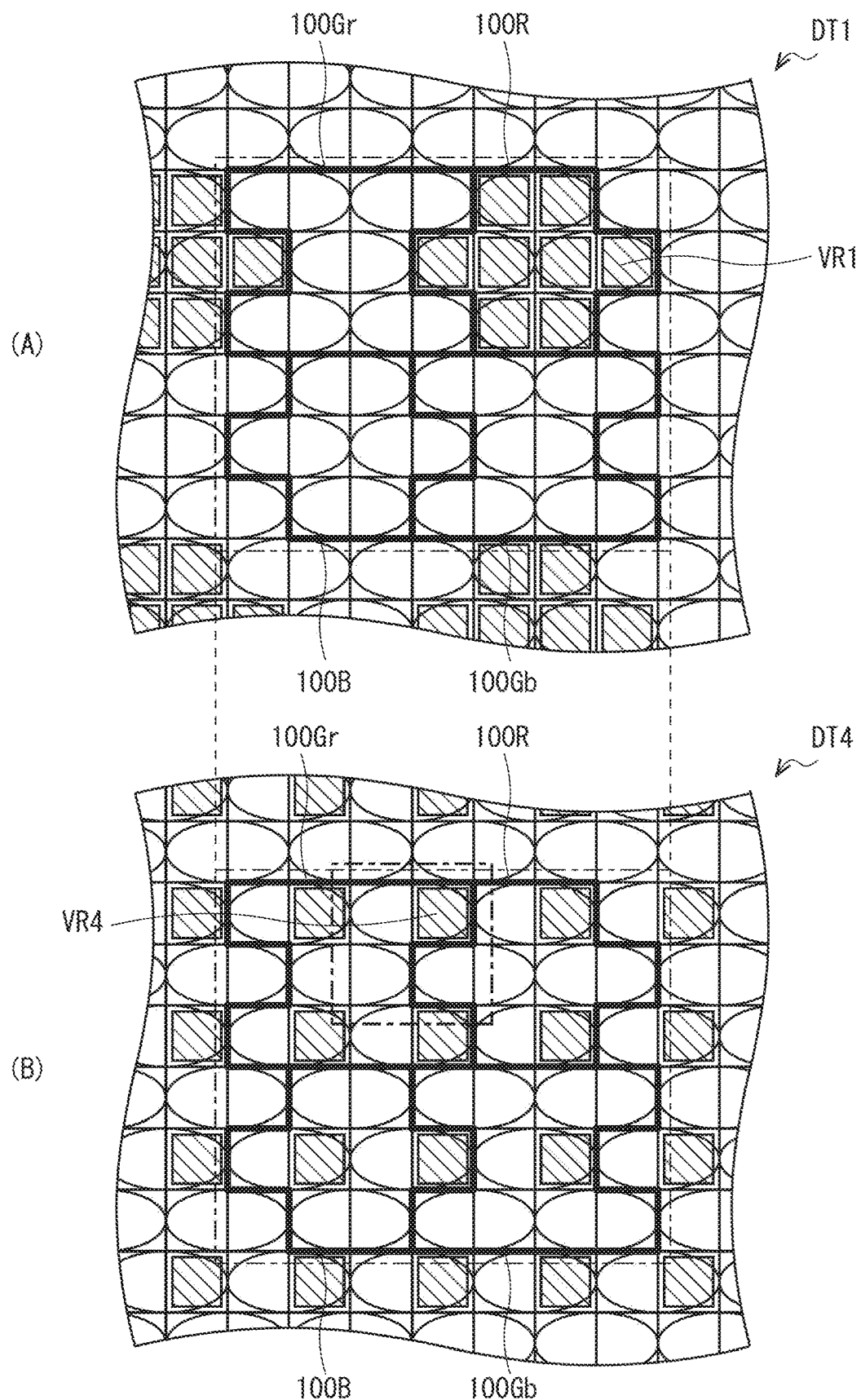

[FIG. 24B]
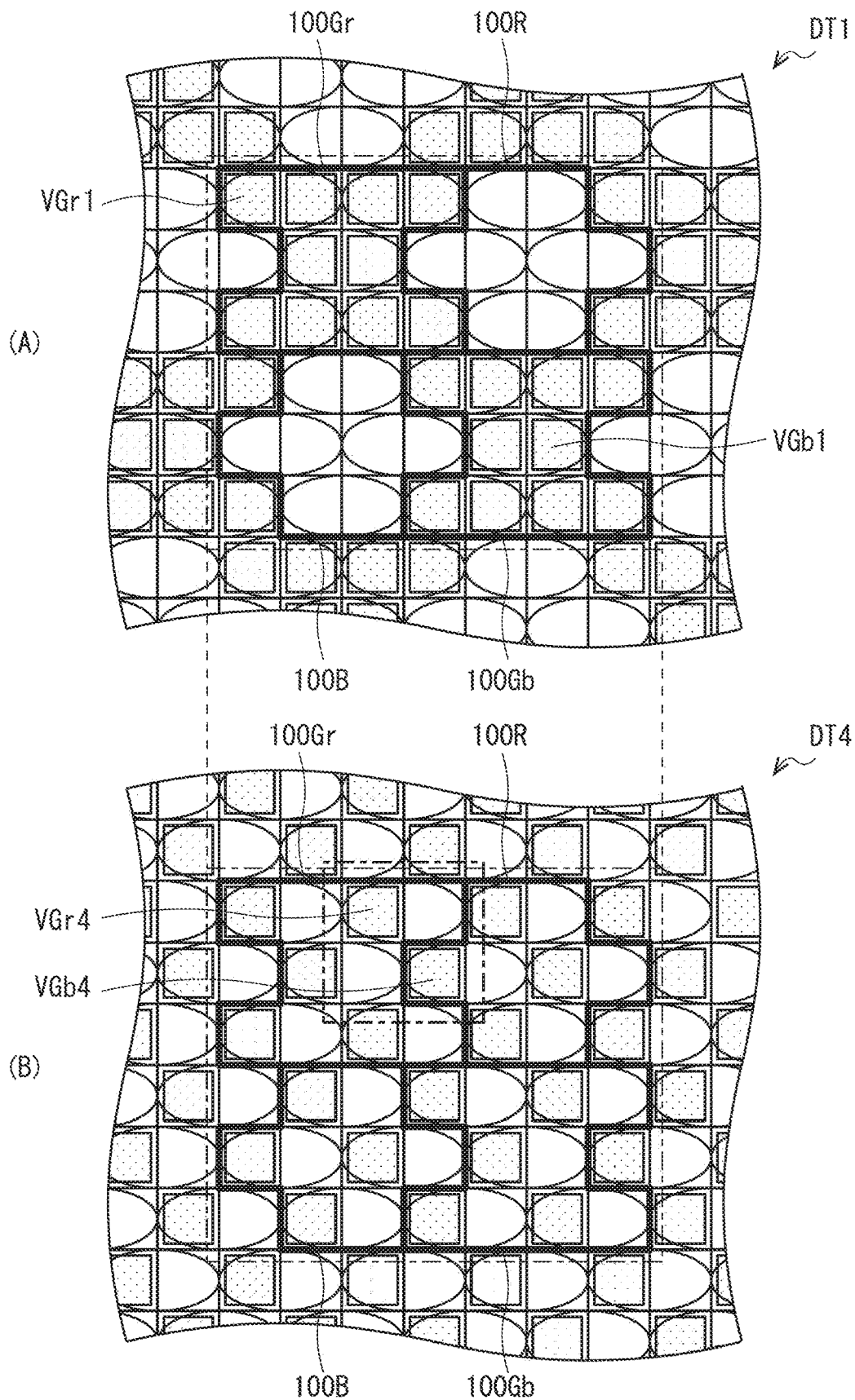

[FIG. 24C]
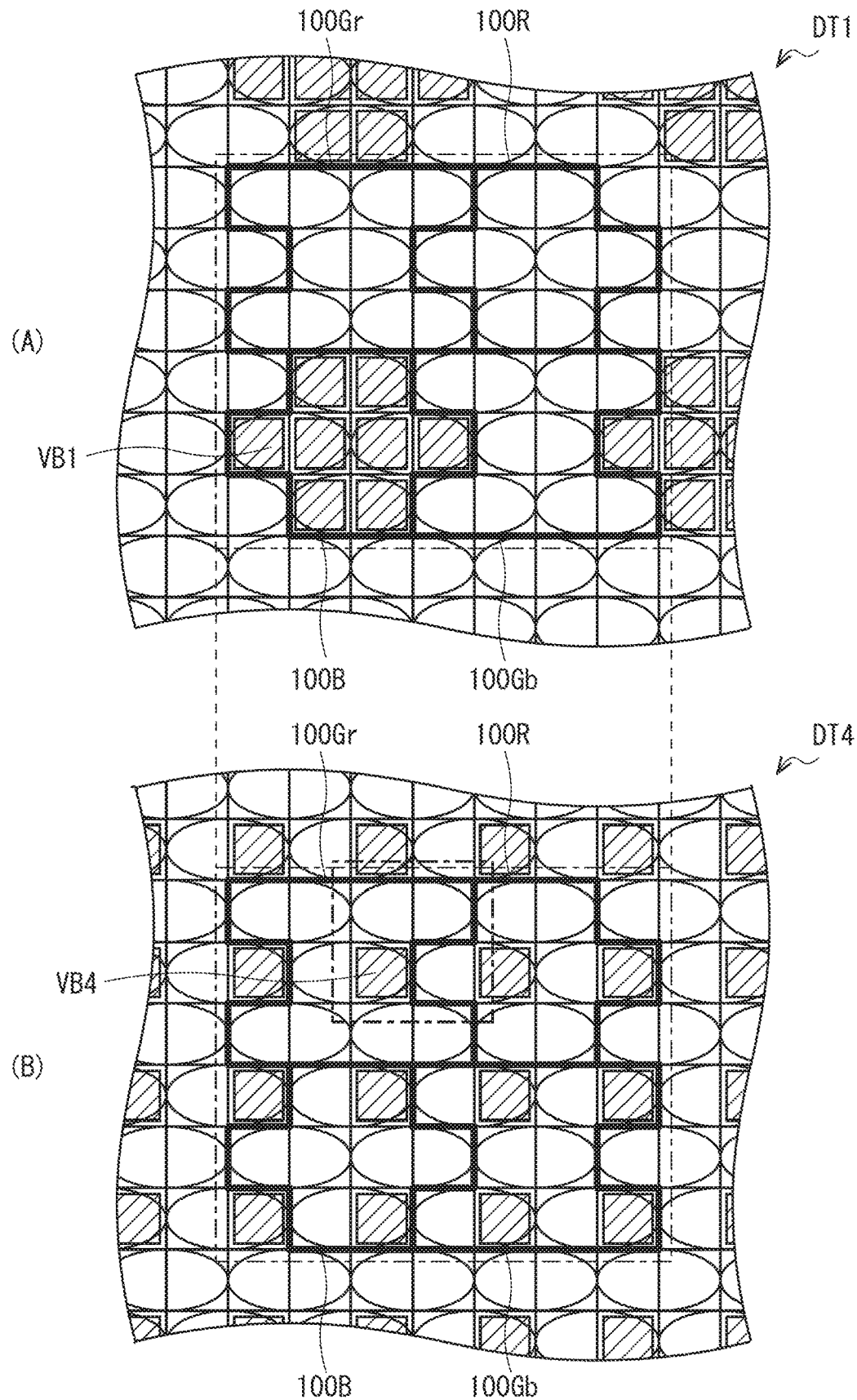

[FIG. 25]
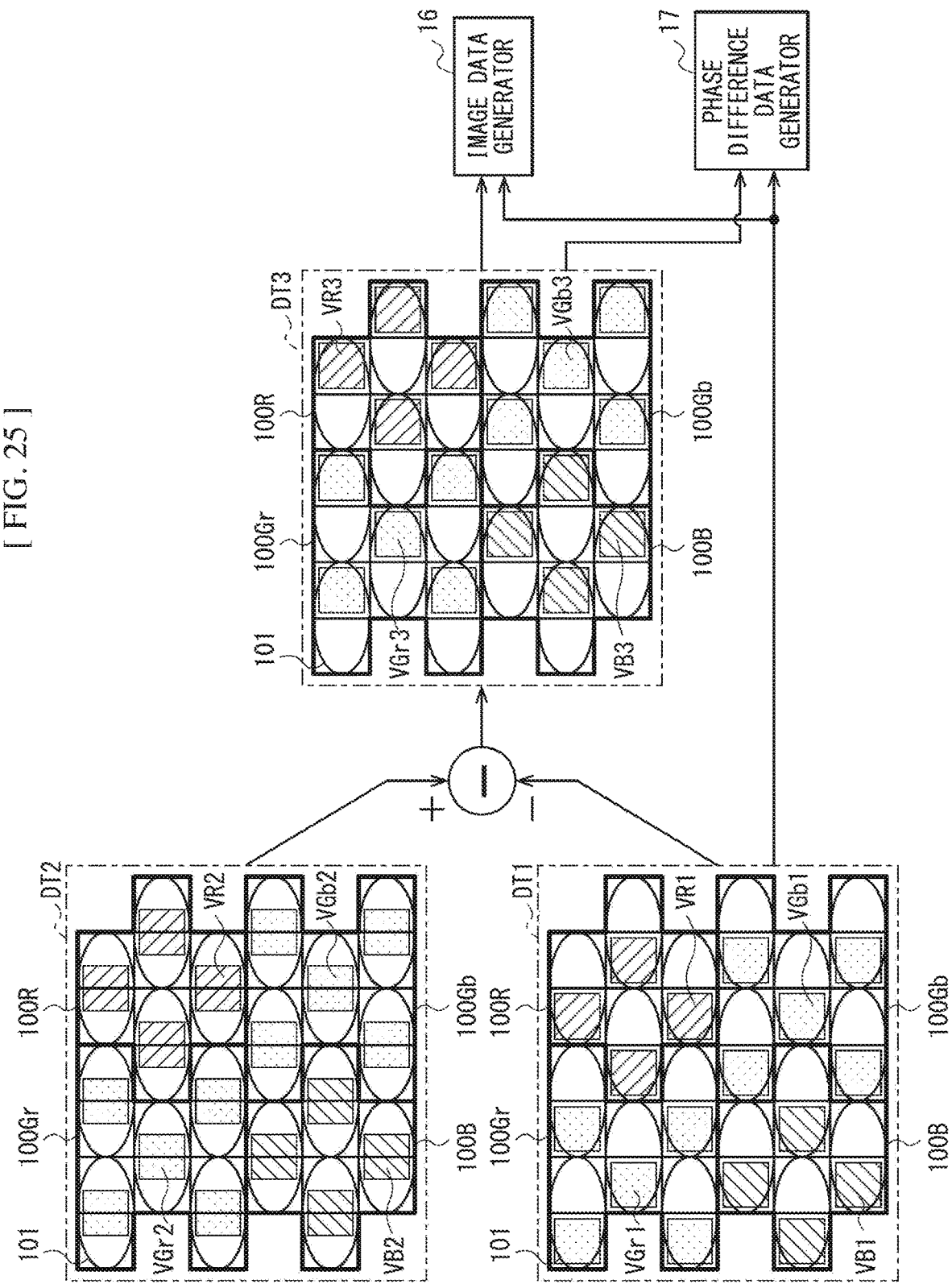

[FIG. 26]
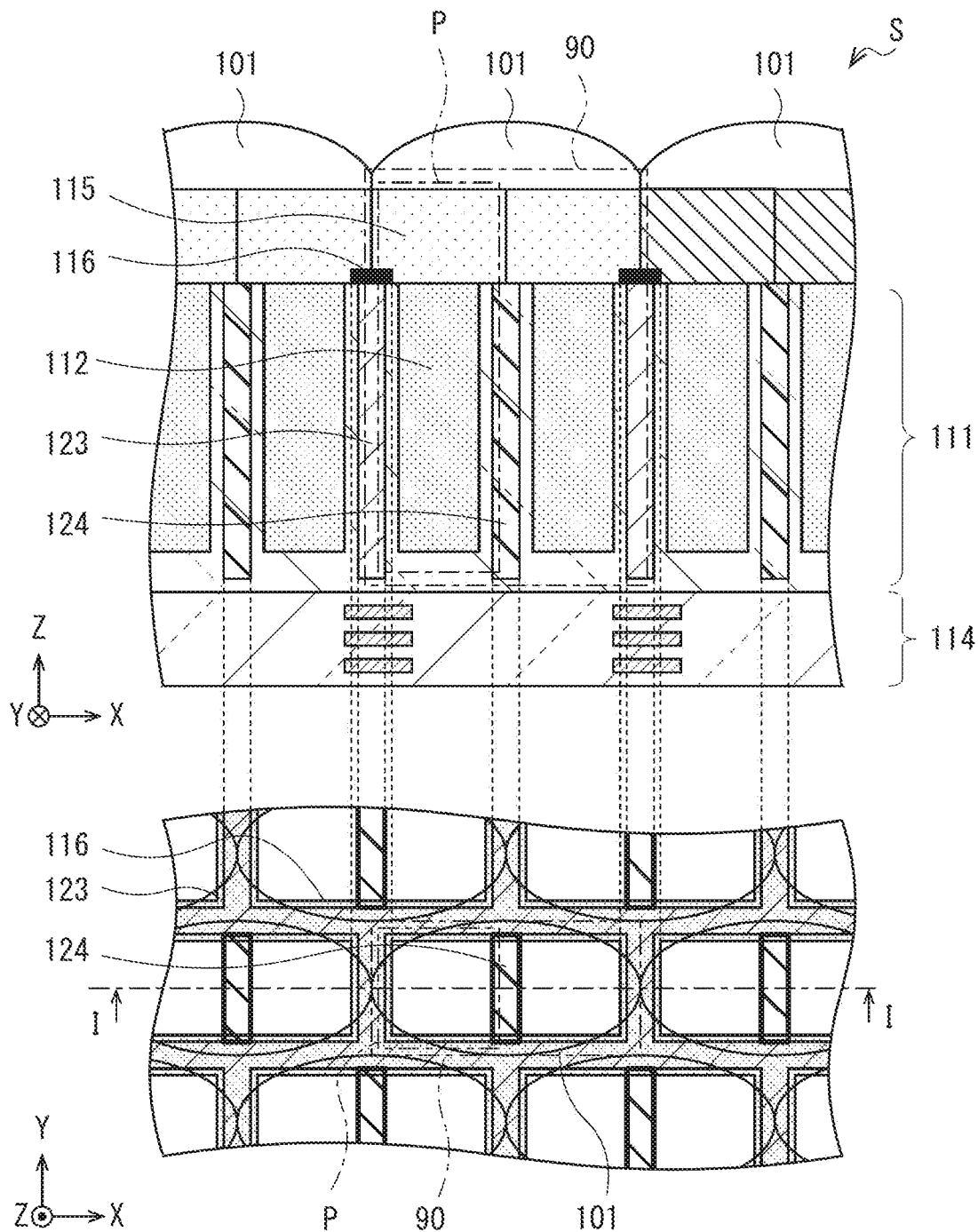

[FIG. 27]
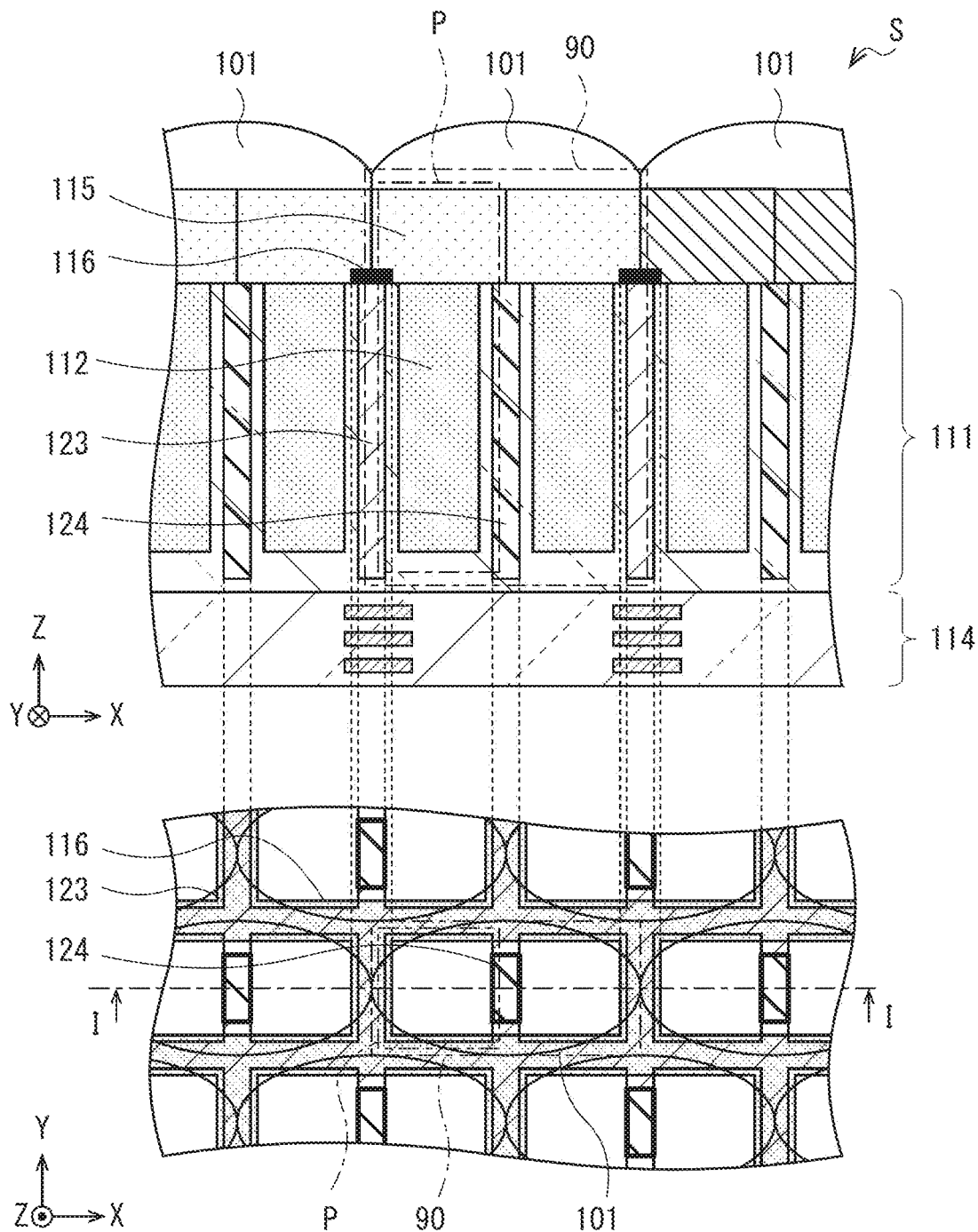

[ FIG. 28 ]
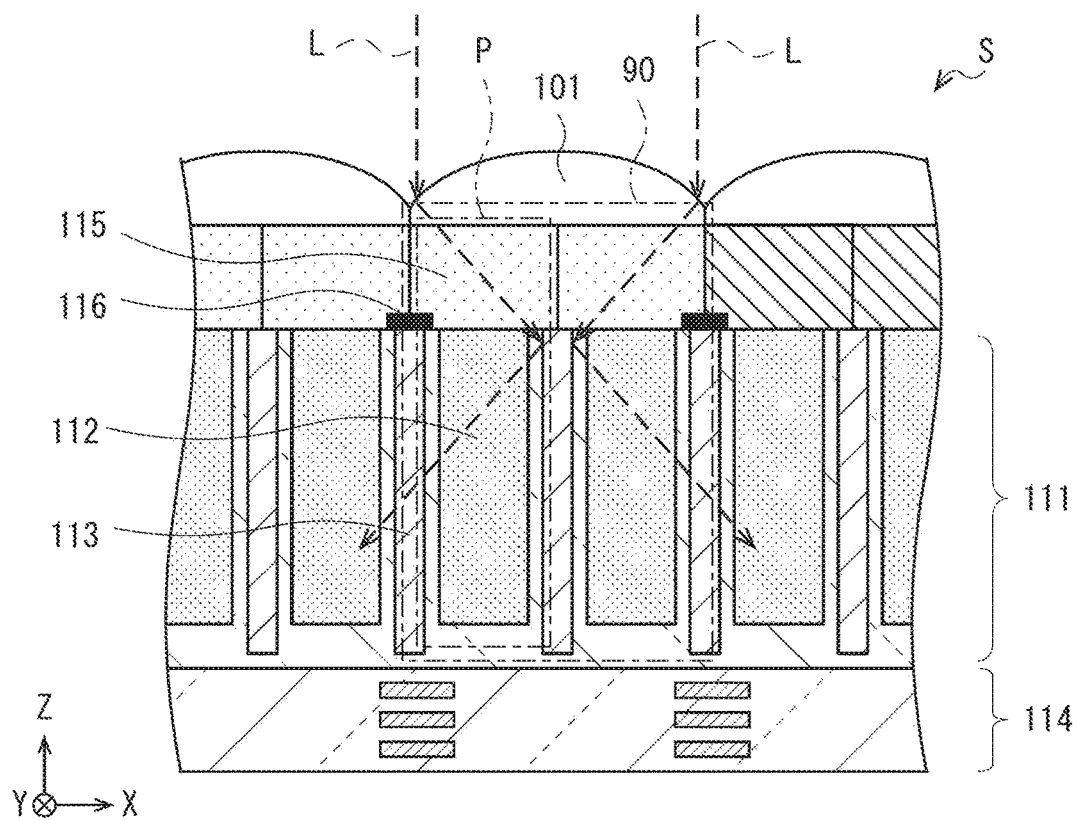
[ FIG. 29 ]
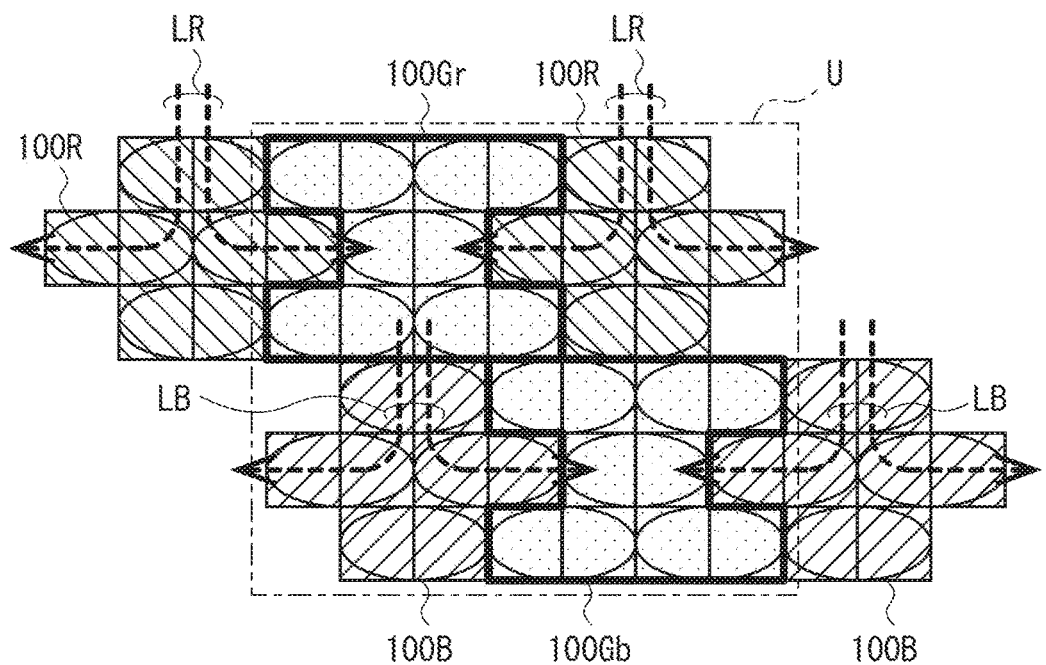

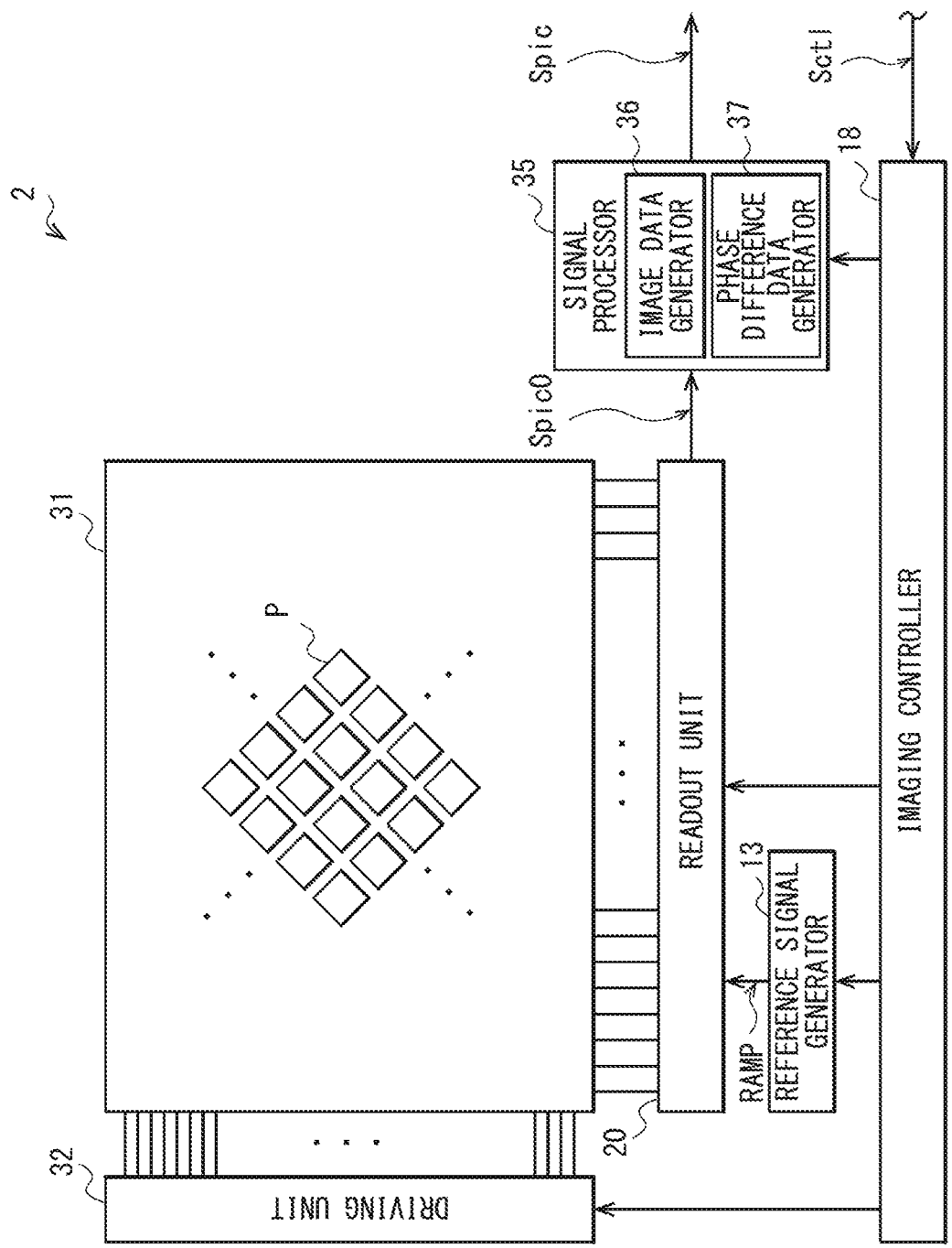
[FIG. 30]

[FIG. 31]
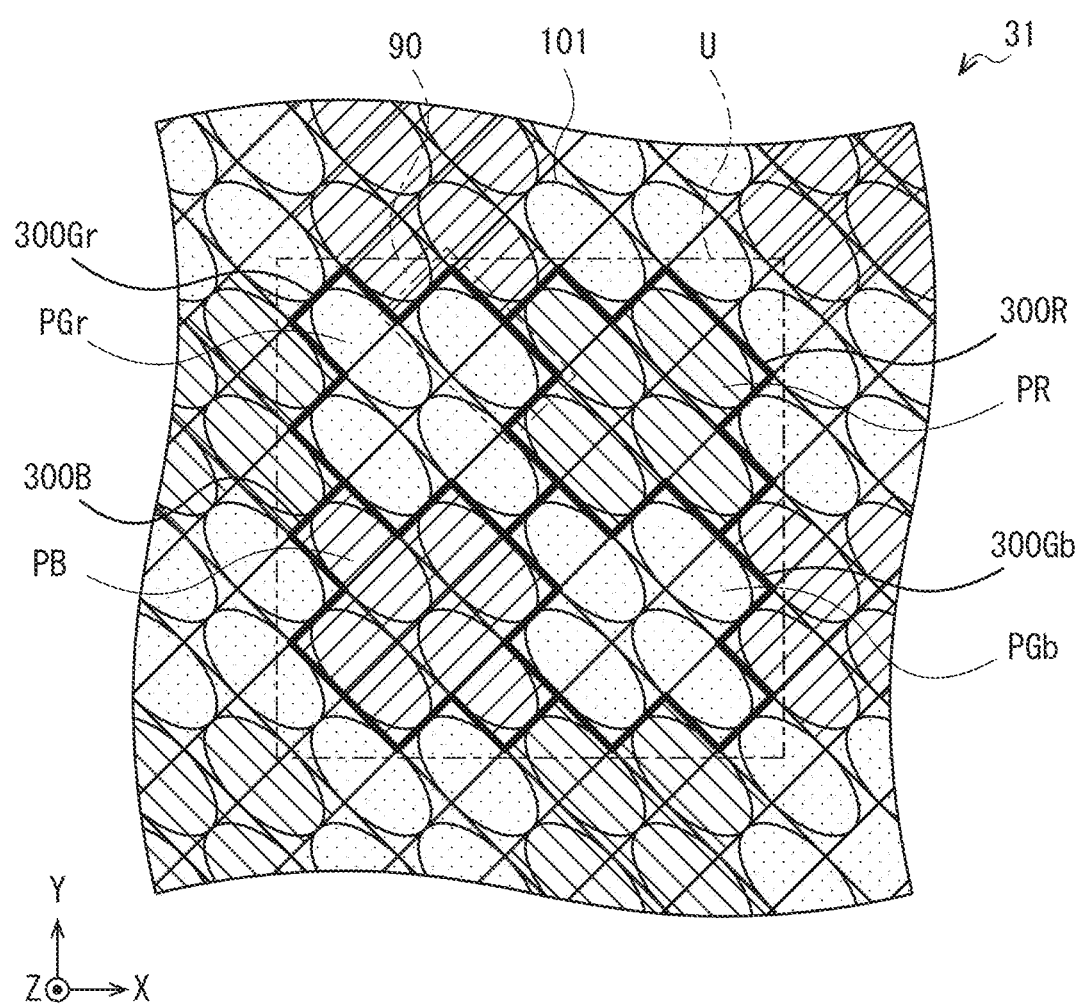

[FIG. 32]
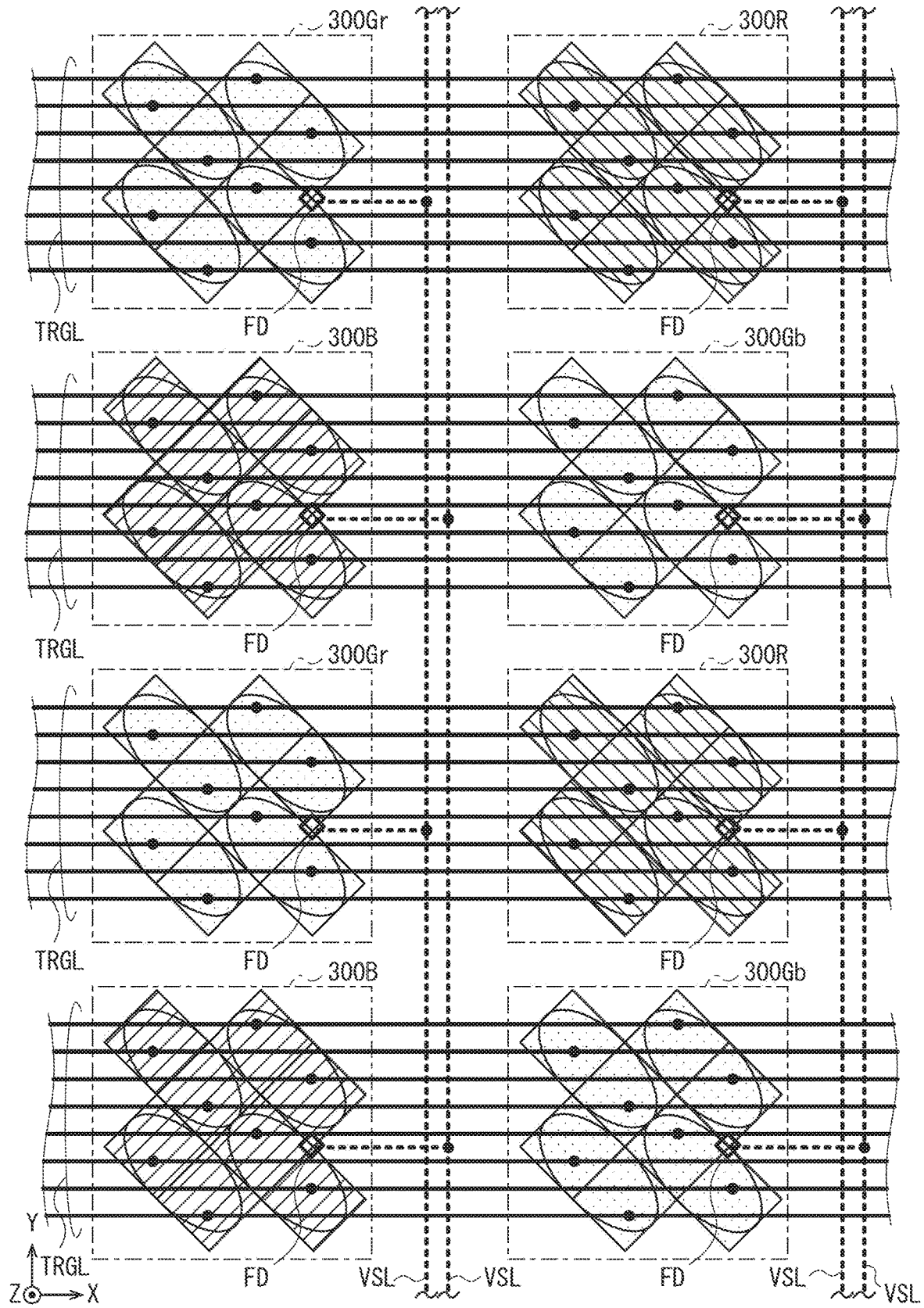

[FIG. 33]
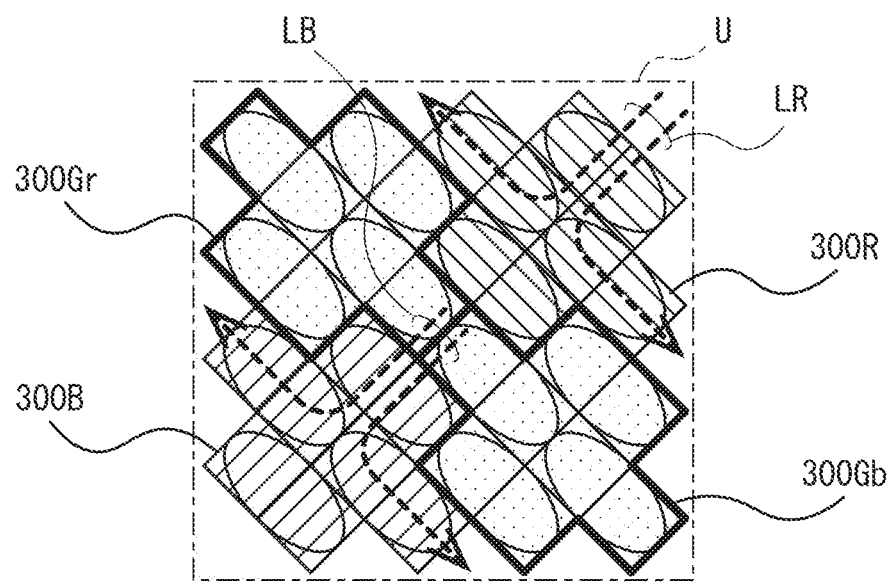

[FIG. 34]
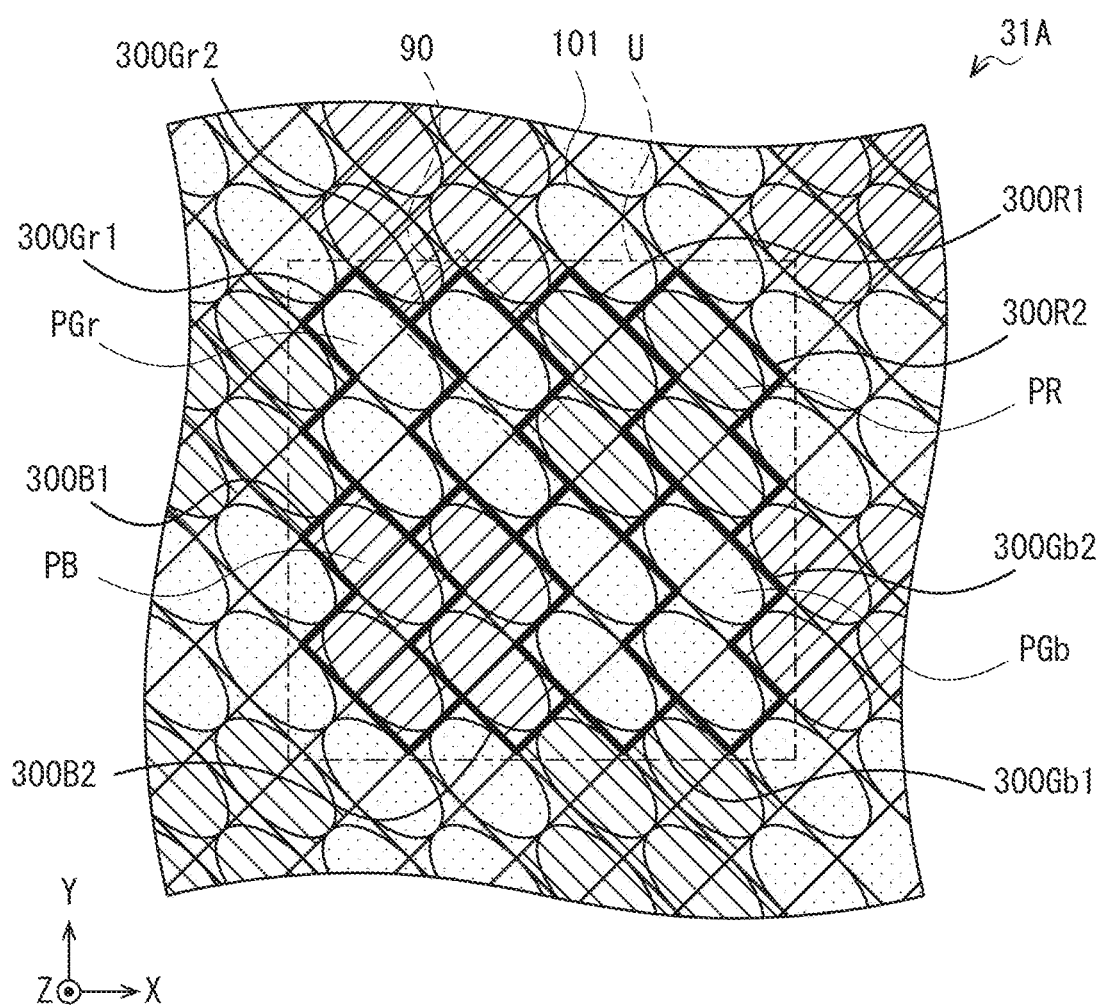

[FIG. 35]
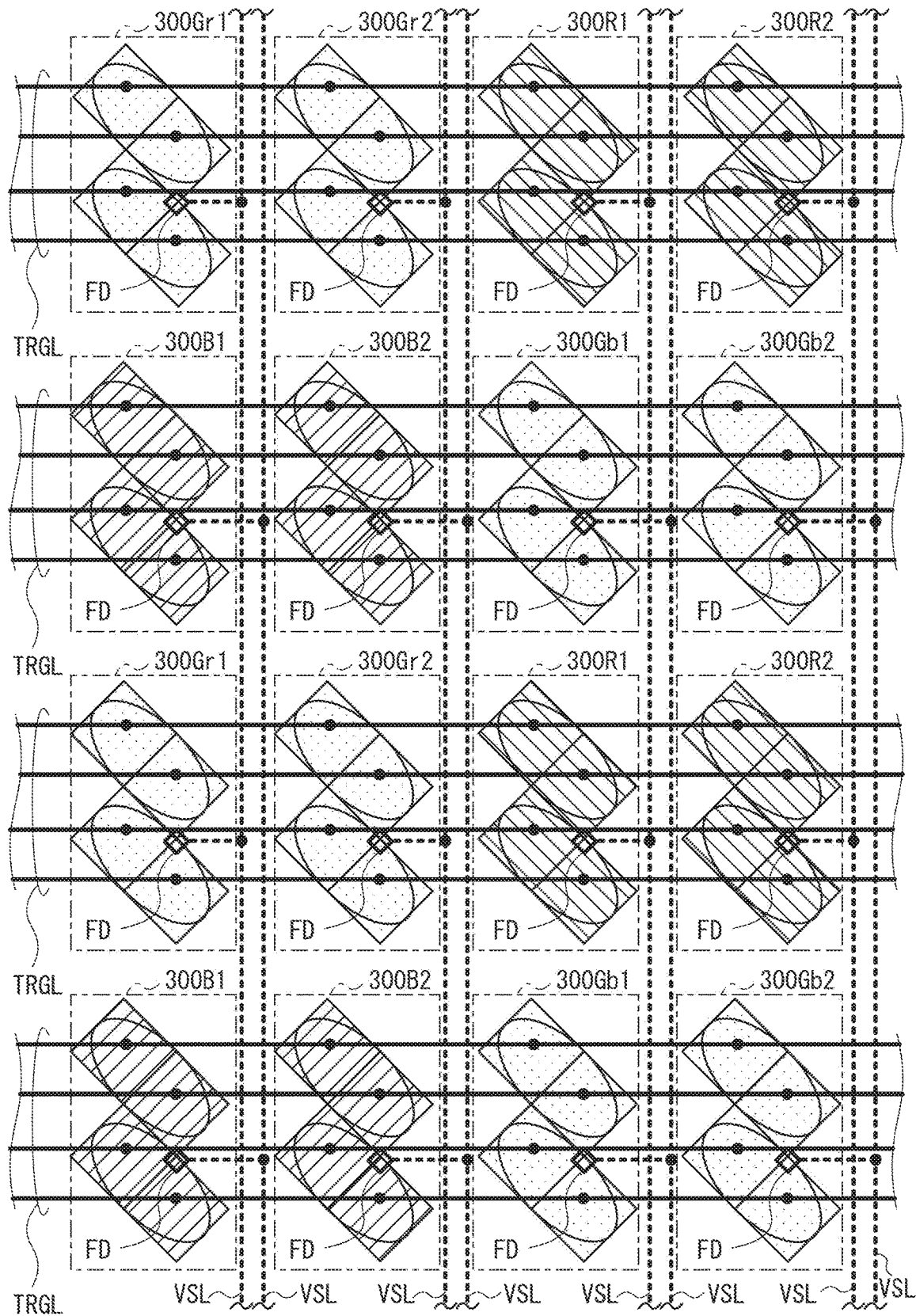

[FIG. 36]
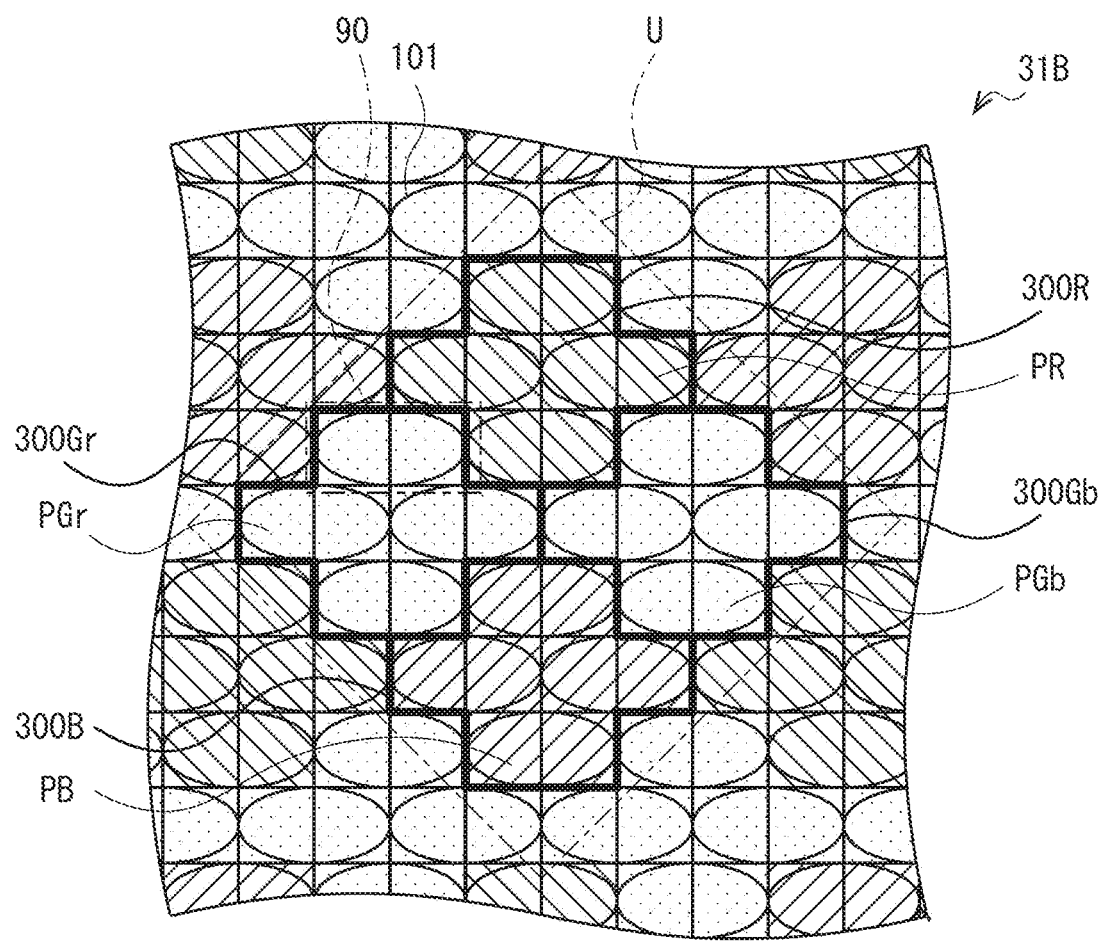

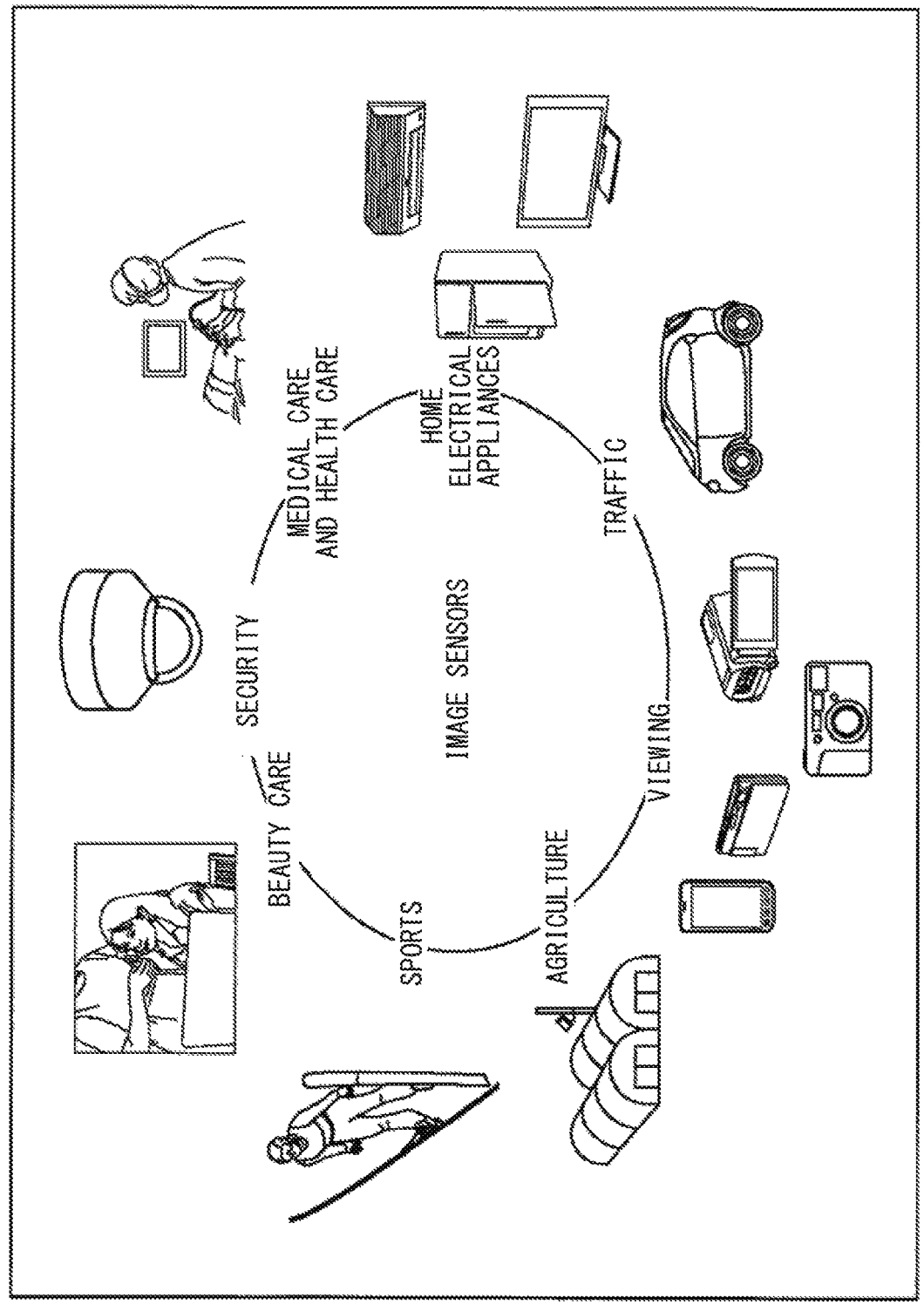
[FIG.37]

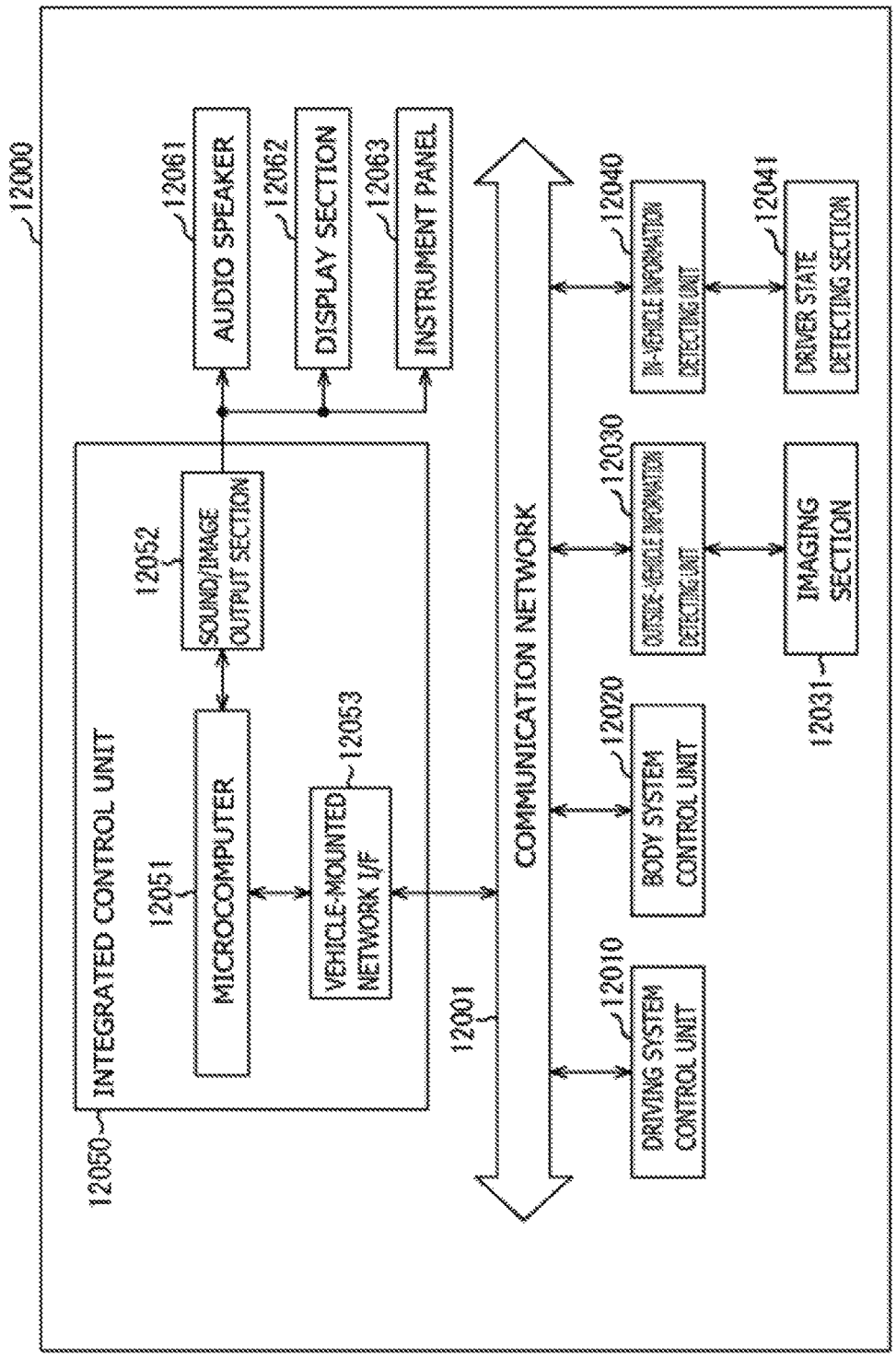
[FIG. 38]

[ FIG. 39 ]
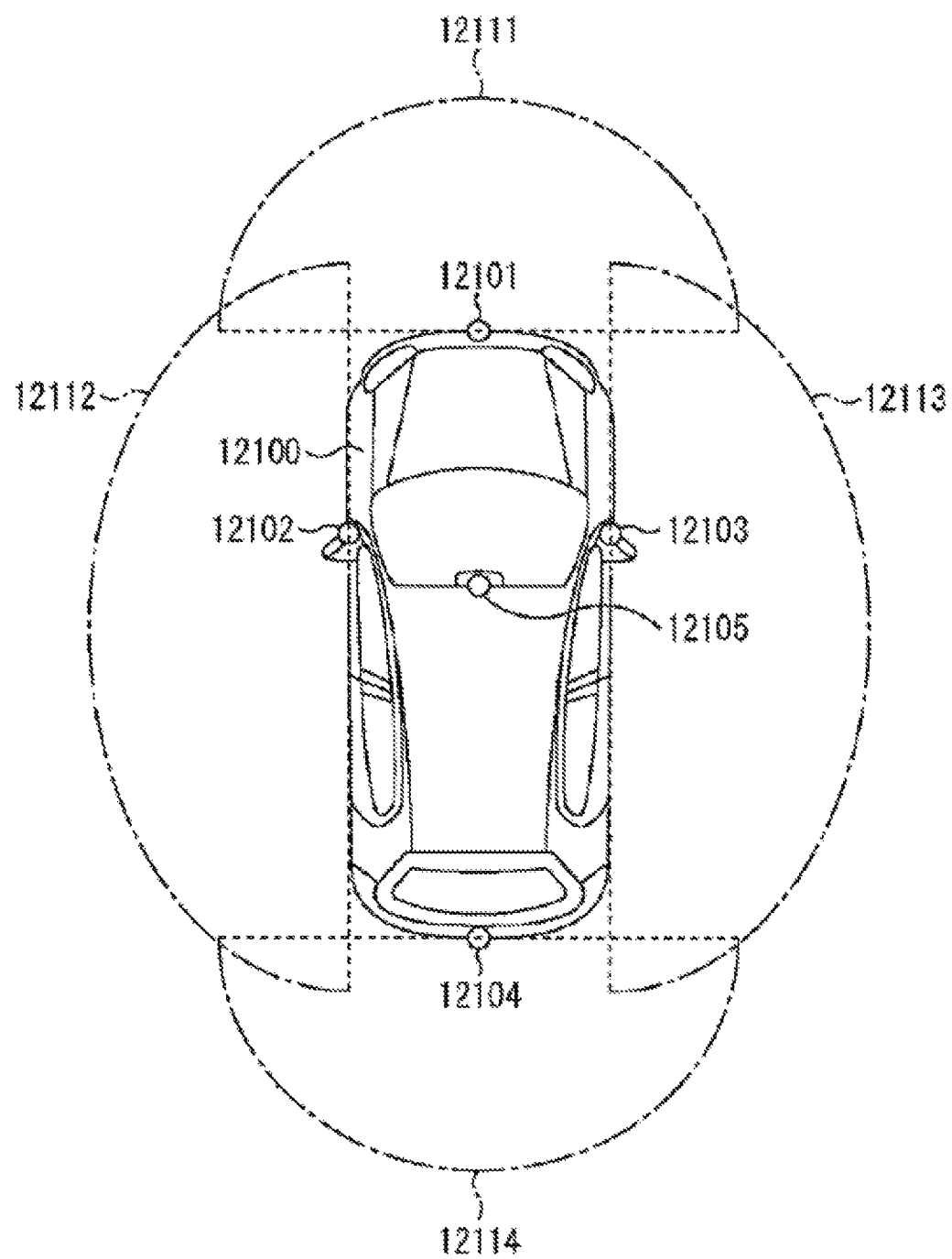

IMAGING APPARATUS

CROSS REFERENCE TO RELATED APPLICATIONS

This is a Continuation application of U.S. patent application Ser. No. 17/766,368, filed Apr. 4, 2022, which is a 371 National Stage Entry of International Application No.: PCT/JP2021/042408, filed on Nov. 18, 2021, which in turn claims priority from Japanese Priority Patent Application JP 2020-208541 filed on Dec. 16, 2020, the entire contents of which are incorporated herein by reference.

TECHNICAL FIELD

The present disclosure relates to an imaging apparatus that captures an image of a subject.

BACKGROUND ART

Some of imaging apparatuses obtain an image-plane phase difference in order to achieve, for example, autofocusing. For example, PTL 1 discloses an imaging apparatus including a normal pixel and a phase difference detection pixel for obtaining the image-plane phase difference.

CITATION LIST

Patent Literature

PTL 1: International Publication No. WO 2016/098640

SUMMARY OF THE INVENTION

Regarding imaging apparatuses, high image quality is desired of captured images and further improvements in image quality are expected.

It is desirable to provide an imaging apparatus that makes it possible to increase image quality.

An imaging apparatus according to one embodiment of the present disclosure includes a plurality of pixel blocks and a plurality of lenses. The plurality of pixel blocks each includes a plurality of light-receiving pixels including color filters of mutually the same color. The plurality of light-receiving pixels is divided into a plurality of pixel pairs each including two light-receiving pixels. The plurality of lenses is provided at respective positions corresponding to the plurality of pixel pairs.

In the imaging apparatus according to one embodiment of the present disclosure, the plurality of light-receiving pixels including the color filters of mutually the same color is provided in each of the plurality of pixel blocks. The plurality of light-receiving pixels is divided into the plurality of pixel pairs each including two light-receiving pixels. The plurality of lenses is provided at the respective positions corresponding to the plurality of pixel pairs.

BRIEF DESCRIPTION OF DRAWING

FIG. 1 is a block diagram illustrating a configuration example of an imaging apparatus according to one embodiment of the present disclosure.

FIG. 2 is an explanatory diagram illustrating a configuration example of a pixel array illustrated in FIG. 1.

FIG. 3 is an explanatory diagram illustrating a configuration example of a light-receiving pixel illustrated in FIG. 2.

FIG. 4 is a circuit diagram illustrating a configuration example of a pixel block illustrated in FIG. 2.

FIG. 5 is a circuit diagram illustrating a configuration example of another pixel block illustrated in FIG. 2.

FIG. 6 is an explanatory diagram illustrating an example of coupling between a plurality of pixel blocks illustrated in FIG. 2.

FIG. 7 is a block diagram illustrating a configuration example of a readout unit illustrated in FIG. 1.

FIG. 8 is an explanatory diagram illustrating a configuration example of an image signal illustrated in FIG. 1.

FIG. 9 is an explanatory diagram illustrating an example of the number of effective pixels in the imaging apparatus illustrated in FIG. 1.

FIG. 10 is an explanatory diagram illustrating an operation example of a plurality of imaging modes of the imaging apparatus illustrated in FIG. 1.

FIG. 11 is an explanatory diagram illustrating an operation example of the imaging apparatus illustrated in FIG. 1.

FIG. 12 is a timing waveform diagram illustrating an example of a readout operation of the imaging apparatus illustrated in FIG. 1.

FIG. 13 is another explanatory diagram illustrating an operation example of the imaging apparatus illustrated in FIG. 1.

FIG. 14 is another explanatory diagram illustrating an operation example of the imaging apparatus illustrated in FIG. 1.

FIG. 15 is another explanatory diagram illustrating an operation example of the imaging apparatus illustrated in FIG. 1.

FIG. 16 is another explanatory diagram illustrating an operation example of the imaging apparatus illustrated in FIG. 1.

FIG. 17 is an explanatory diagram illustrating an example of a remosaic process in the imaging apparatus illustrated in FIG. 1.

FIG. 18A is an explanatory diagram illustrating an example of the remosaic process illustrated in FIG. 17.

FIG. 18B is another explanatory diagram illustrating an example of the remosaic process illustrated in FIG. 17.

FIG. 18C is another explanatory diagram illustrating an example of the remosaic process illustrated in FIG. 17.

FIG. 19 is another explanatory diagram illustrating an operation example of the imaging apparatus illustrated in FIG. 1.

FIG. 20 is another explanatory diagram illustrating an operation example of the imaging apparatus illustrated in FIG. 1.

FIG. 21 is a timing waveform diagram illustrating an example of another readout operation of the imaging apparatus illustrated in FIG. 1.

FIG. 22 is another explanatory diagram illustrating an operation example of the imaging apparatus illustrated in FIG. 1.

FIG. 23 is an explanatory diagram illustrating an example of another remosaic process in the imaging apparatus illustrated in FIG. 1.

FIG. 24A is an explanatory diagram illustrating an example of the remosaic process illustrated in FIG. 23.

FIG. 24B is another explanatory diagram illustrating an example of the remosaic process illustrated in FIG. 23.

FIG. 24C is another explanatory diagram illustrating an example of the remosaic process illustrated in FIG. 23.

FIG. 25 is another explanatory diagram illustrating an operation example of an imaging apparatus according to a modification example.

FIG. 26 is an explanatory diagram illustrating a configuration example of a light-receiving pixel according to another modification example.

FIG. 27 is an explanatory diagram illustrating a configuration example of a light-receiving pixel according to another modification example.

FIG. 28 is an explanatory diagram illustrating an operation example of the light-receiving pixel according to the embodiment.

FIG. 29 is another explanatory diagram illustrating an operation example of the pixel array according to the embodiment.

FIG. 30 is a block diagram illustrating a configuration example of an imaging apparatus according to another modification example.

FIG. 31 is an explanatory diagram illustrating a configuration example of a pixel array illustrated in FIG. 30.

FIG. 32 is an explanatory diagram illustrating an example of coupling between a plurality of pixel blocks illustrated in FIG. 31.

FIG. 33 is an explanatory diagram illustrating an operation example of the pixel array illustrated in FIG. 31.

FIG. 34 is an explanatory diagram illustrating a configuration example of a pixel array according to another modification example.

FIG. 35 is an explanatory diagram illustrating an example of coupling between a plurality of pixel blocks illustrated in FIG. 34.

FIG. 36 is an explanatory diagram illustrating a configuration example of a pixel array according to another modification example.

FIG. 37 is an explanatory diagram illustrating a usage example of the imaging apparatus.

FIG. 38 is a block diagram depicting an example of schematic configuration of a vehicle control system.

FIG. 39 is a diagram of assistance in explaining an example of installation positions of an outside-vehicle information detecting section and an imaging section.

MODES FOR CARRYING OUT THE INVENTION

The following describes embodiments of the present disclosure in detail with reference to the drawings. It is to be noted that the description is given in the following order.
1. Embodiment
2. Usage Example of Imaging apparatus
3. Example of Application to Mobile Body

1. Embodiment

Configuration Example

FIG. 1 illustrates a configuration example of an imaging apparatus (imaging apparatus 1) according to one embodiment. The imaging apparatus 1 includes a pixel array 11, a driving unit 12, a reference signal generator 13, a readout unit 20, a signal processor 15, and an imaging controller 18.

The pixel array 11 includes a plurality of light-receiving pixels P arranged in a matrix. The light-receiving pixels P are each configured to generate a signal SIG including a pixel voltage Vpix corresponding to the amount of received light.

FIG. 2 illustrates an example of arrangement of the light-receiving pixels P in the pixel array 11. FIG. 3 illustrates an example of a schematic cross-sectional structure of the pixel array 11. The pixel array 11 includes a plurality of pixel blocks 100 and a plurality of lenses 101.

The plurality of pixel blocks 100 includes pixel blocks 100R, 100Gr, 100Gb, and 100B. In the pixel array 11, the plurality of light-receiving pixels P is arranged in units (units U) of four pixel blocks 100 (the pixel blocks 100R, 100Gr, 100Gb, and 100B).

The pixel block 100R includes eight light-receiving pixels P (light-receiving pixels PR) that include color filters 115 of red (R). The pixel block 100Gr includes ten light-receiving pixels P (light-receiving pixels PGr) that include color filters 115 of green (G). The pixel block 100Gb includes ten light-receiving pixels P (light-receiving pixels PGb) that include color filters 115 of green (G). The pixel block 100B includes eight light-receiving pixels P (light-receiving pixels PB) that include color filters 115 of blue (B). In FIG. 2, differences between the colors of the color filters are expressed with hatch patterns. An arrangement pattern of the light-receiving pixels PR in the pixel block 100R and an arrangement pattern of the light-receiving pixels PB in the pixel block 100B are identical with each other. An arrangement pattern of the light-receiving pixels PGr in the pixel block 100Gr and an arrangement pattern of the light-receiving pixels PGb in the pixel block 100Gb are identical with each other. In the unit U, the pixel block 100Gr is disposed on the upper left, the pixel block 100R is disposed on the upper right, the pixel block 100B is disposed on the lower left, and the pixel block 100Gb is disposed on the lower right. In such a manner, the pixel blocks 100R, 100Gr, 100Gb, and 100B are arranged in a so-called Bayer arrangement in units of pixel blocks 100.

As illustrated in FIG. 3, the pixel array 11 includes a semiconductor substrate 111, a semiconductor region 112, an insulating layer 113, a multilayer wiring layer 114, the color filters 115, and a light-blocking film 116. The semiconductor substrate 111 is a support substrate to form the imaging apparatus 1, and is a P-type semiconductor substrate. The semiconductor region 112 is a semiconductor region provided at a position corresponding to each of the plurality of light-receiving pixels P in the substrate of the semiconductor substrate 111, in which a photodiode PD is formed by doping with N-type impurities. The insulating layer 113 is provided at a boundary between the plurality of light-receiving pixels P arranged side by side in an XY plane in the substrate of the semiconductor substrate 111, and is, in this example, a DTI (Deep Trench Isolation) configured using an oxide film or the like. The multilayer wiring layer 114 is provided on a surface of the semiconductor substrate 111 opposite to a light entrance surface S of the pixel array 11, and includes a plurality of wiring layers and interlayer insulating films. Wiring lines in the multilayer wiring layer 114 are configured to couple, for example, unillustrated transistors provided on a surface of the semiconductor substrate 111 to the driving unit 12 and the readout unit 20. The color filters 115 are provided on the semiconductor substrate 111 at the light entrance surface S of the pixel array 11. The light-blocking film 116 is provided to surround two light-receiving pixels P (hereinafter also referred to as a pixel pair 90) that are arranged side by side in an X direction at the light entrance surface S of the pixel array 11.

The plurality of lenses 101 is so-called on-chip lenses, and is provided on the color filters 115 at the light entrance surface S of the pixel array 11. The lens 101 is provided over two light-receiving pixels P (pixel pair 90) that are arranged side by side in the X direction. Four lenses 101 are provided over the eight light-receiving pixels P in the pixel block 100R, five lenses 101 are provided over the ten light-receiving pixels P in the pixel block 100Gr, five lenses 101 are provided over the ten light-receiving pixels P in the pixel block 100Gb, and four lenses 101 are provided over the eight light-receiving pixels P in the pixel block 100B. The lenses 101 are arranged side by side in the X direction and a Y direction. The lenses 101 disposed side by side in the Y direction are disposed to be shifted from each other in the X direction by one light-receiving pixel P. In other words, the pixel pairs 90 disposed side by side in the Y direction are disposed to be shifted from each other in the X direction by one light-receiving pixel P.

This configuration causes images to be shifted from each other in the two light-receiving pixels P in the pixel pair 90 corresponding to one lens 101. The imaging apparatus 1 generates phase difference data DF on the basis of a so-called image-plane phase difference detected by the plurality of pixel pairs 90. For example, a camera equipped with the imaging apparatus 1 determines a defocus amount on the basis of the phase difference data DF and moves the position of an imaging lens on the basis of the defocus amount. The camera is able to achieve autofocusing in such a manner.

FIG. 4 illustrates a configuration example of the pixel block 100Gr. FIG. 5 illustrates a configuration example of the pixel block 100R. FIG. 6 illustrates an example of wiring between the pixel blocks 100R, 100Gr, 100Gb, and 100B. Note that in FIG. 6, the plurality of pixel blocks 100 is depicted as being separated away from each other for convenience in description.

The pixel array 11 includes a plurality of control lines TRGL, a plurality of control lines RSTL, a plurality of control lines SELL, and a plurality of signal lines VSL. The control lines TRGL extend in the X direction (a horizontal direction in FIGS. 4 to 6) and have respective one ends coupled to the driving unit 12. The driving unit 12 supplies control signals STRG to the control lines TRGL. The control lines RSTL extend in the X direction and have respective one ends coupled to the driving unit 12. The driving unit 12 supplies control signals SRST to the control lines RSTL. The control lines SELL extend in the X direction and have respective one ends coupled to the driving unit 12. The driving unit 12 supplies control signals SSEL to the control lines SELL. The signal lines VSL extend in the Y direction (a vertical direction in FIGS. 4 to 6) and have respective one ends coupled to the readout unit 20. The signal lines VSL transfer the signals SIG generated by the light-receiving pixels P to the readout unit 20.

The pixel block 100Gr (FIG. 4) includes ten photodiodes PD, ten transistors TRG, a floating diffusion FD, and transistors RST, AMP, and SEL. The ten photodiodes PD and the ten transistors TRG each respectively correspond to the ten light-receiving pixels PGr included in the pixel block 100Gr. The transistors TRG, RST, AMP, and SEL in this example are N-type MOS (Metal Oxide Semiconductor) transistors.

The photodiode PD is a photoelectric conversion element that generates electric charge in an amount corresponding to the amount of received light, and accumulates the generated electric charge inside. The photodiode PD has an anode grounded and a cathode coupled to a source of the transistor TRG.

The transistor TRG has a gate coupled to the control line TRGL, the source coupled to the cathode of the photodiode PD, and a drain coupled to the floating diffusion FD. The gates of the ten transistors TRG are coupled to respective different control lines TRGL among the ten control lines TRGL (in this example, control lines TRGL1 to TRGL6, and TRGL9 to TRGL12).

The floating diffusion FD is configured to accumulate the electric charge transferred from the photodiode PD via the transistor TRG. The floating diffusion FD includes, for example, a diffusion layer formed on a surface of a semiconductor substrate. FIG. 4 illustrates the floating diffusion FD by using a symbol of a capacitor.

The transistor RST has a gate coupled to the control line RSTL, a drain to be supplied with a power supply voltage VDD, and a source coupled to the floating diffusion FD.

The transistor AMP has a gate coupled to the floating diffusion FD, a drain to be supplied with a power supply voltage VDDH, and a source coupled to a drain of the transistor SEL.

The transistor SEL has a gate coupled to the control line SELL, the drain coupled to the source of the transistor AMP, and a source coupled to the signal line VSL.

With this configuration, in the light-receiving pixel P, for example, the electric charge accumulated in the photodiode PD is discharged by turning on of the transistors TRG and RST based on the control signals STRG and SRST. Then, an exposure period T is started by turning off of the transistors TRG and RST, and electric charge in an amount corresponding to the amount of received light is thus accumulated in the photodiode PD. Then, after the exposure period T ends, the light-receiving pixel P outputs the signal SIG including a reset voltage Vreset and the pixel voltage Vpix to the signal line VSL. Specifically, first, the light-receiving pixel P is electrically coupled to the signal line VSL by turning on of the transistor SEL based on the control signal SSEL. The transistor AMP is thereby coupled to a constant current source 21 (described later) of the readout unit 20, thus operating as a so-called source follower. Then, during a P-phase (Pre-Charge phase) period TP after the voltage of the floating diffusion FD is reset by turning on of the transistor RST, as described later, the light-receiving pixel P outputs a voltage corresponding to the voltage of the floating diffusion FD at that time as the reset voltage Vreset. Further, during a D-phase (Data phase) period TD after electric charge is transferred from the photodiode PD to the floating diffusion FD by turning on of the transistor TRG, the light-receiving pixel P outputs a voltage corresponding to the voltage of the floating diffusion FD at that time as the pixel voltage Vpix. A difference voltage between the pixel voltage Vpix and the reset voltage Vreset corresponds to the amount of received light of the light-receiving pixel P during the exposure period T. In such a manner, the light-receiving pixel P outputs the signal SIG including the reset voltage Vreset and the pixel voltage Vpix to the signal line VSL.

The pixel block 100R (FIG. 5) includes eight photodiodes PD, eight transistors TRG, a floating diffusion FD, and transistors RST, AMP, and SEL. The eight photodiodes PD and the eight transistors TRG each respectively correspond to the eight light-receiving pixels PR included in the pixel block 100R. The gates of the eight transistors TRG are coupled to respective different control lines TRGL among the eight control lines TRGL (in this example, the control lines TRGL1, TRGL2, and TRGL5 to TRGL10).

As illustrated in FIG. 6, the pixel blocks 100Gr and 100R arranged in the X direction and belonging to the same row are coupled to a plurality of control lines TRGL among the same twelve control lines TRGL (the control lines TRGL1 to TRGL12). In this example, the control lines TRGL1 to TRGL12 are arranged in this order from bottom to top in FIG. 6. The pixel block 100Gr is coupled to ten control lines TRGL (the control lines TRGL1 to TRGL6, and TRGL5 to TRGL12) among the twelve control lines TRGL (the control lines TRGL1 to TRGL12), and the pixel block 100R is coupled to eight control lines TRGL (the control lines TRGL1, TRGL2, and TRGL5 to TRGL10) among the twelve control lines TRGL (the control lines TRGL1 to TRGL12).

Further, although not illustrated, the pixel blocks 100Gr and 100R arranged in the X direction and belonging to the same row are coupled to one control line RSTL and one control line SELL.

Further, as illustrated in FIG. 6, the pixel blocks 100Gr arranged in the Y direction and belonging to the same column are coupled to one signal line VSL. Similarly, the pixel blocks 100R arranged in the Y direction and belonging to the same column are coupled to one signal line VSL.

The pixel block 100B includes, like the pixel block 100R (FIG. 5), eight photodiodes PD, eight transistors TRG, a floating diffusion FD, and transistors RST, AMP, and SEL. The eight photodiodes PD and the eight transistors TRG each respectively correspond to the eight light-receiving pixels PB included in the pixel block 100B. The gates of the eight transistors TRG are coupled to respective different control lines TRGL among the eight control lines TRGL.

The pixel block 100Gb includes, like the pixel block 100Gr (FIG. 4), ten photodiodes PD, ten transistors TRG, a floating diffusion FD, and transistors RST, AMP, and SEL. The ten photodiodes PD and the ten transistors TRG each respectively correspond to the ten light-receiving pixels PGb included in the pixel block 100Gb. The gates of the ten transistors TRG are coupled to respective different control lines TRGL among the ten control lines TRGL.

As illustrated in FIG. 6, the pixel blocks 100B and 100Gb arranged in the X direction and belonging to the same row are coupled to a plurality of control lines TRGL among the same twelve control lines TRGL. Further, although not illustrated, the pixel blocks 100B and 100Gb arranged in the X direction and belonging to the same row are coupled to one control line RSTL and one control line SELL. Further, as illustrated in FIG. 6, the pixel blocks 100B arranged in the Y direction and belonging to the same column are coupled to one signal line VSL. Similarly, the pixel blocks 100Gb arranged in the Y direction and belonging to the same column are coupled to one signal line VSL.

The driving unit 12 (FIG. 1) is configured to drive the plurality of light-receiving pixels P in the pixel array 11 on the basis of instructions from the imaging controller 18. Specifically, the driving unit 12 drives the plurality of light-receiving pixels P in the pixel array 11 by supplying the plurality of control signals STRG respectively to the plurality of control lines TRGL, supplying the plurality of control signals SRST respectively to the plurality of control lines RSTL, and supplying the plurality of control signals SSEL respectively to the plurality of control lines SELL in the pixel array 11.

The reference signal generator 13 is configured to generate a reference signal RAMP on the basis of instructions from the imaging controller 18. The reference signal RAMP has a so-called ramp waveform in which a voltage level gradually changes with a lapse of time during periods during which the readout unit 20 performs AD conversion (the P-phase period TP and the D-phase period TD). The reference signal generator 13 supplies such a reference signal RAMP to the readout unit 20.

The readout unit 20 is configured to generate an image signal Spic0 on the basis of instructions from the imaging controller 18 by performing AD conversion on the basis of the signal SIG supplied from the pixel array 11 via the signal line VSL.

FIG. 7 illustrates a configuration example of the readout unit 20. Note that FIG. 6 also illustrates the reference signal generator 13, the signal processor 15, and the imaging controller 18 in addition to the readout unit 20. The readout unit 20 includes a plurality of constant current sources 21, a plurality of AD (Analog to Digital) converters ADC, and a transfer controller 27. The plurality of constant current sources 21 and the plurality of AD converters ADC are provided in correspondence with the plurality of respective signal lines VSL. In the following, a description is given of the constant current source 21 and the AD converter ADC corresponding to one signal line VSL.

The constant current source 21 is configured to feed a predetermined current through the corresponding signal line VSL. The constant current source 21 has one end coupled to the corresponding signal line VSL and another end grounded.

The AD converter ADC is configured to perform AD conversion on the basis of the signal SIG on the corresponding signal line VSL. The AD converter ADC includes capacitors 22 and 23, a comparator circuit 24, a counter 25, and a latch 26.

The capacitor 22 has one end that is coupled to the signal line VSL and is to be supplied with the signal SIG, and another end coupled to the comparator circuit 24. The capacitor 23 has one end to be supplied with the reference signal RAMP supplied from the reference signal generator 13, and another end coupled to the comparator circuit 24.

The comparator circuit 24 is configured to generate a signal CP by performing comparison operations on the basis of the signal SIG supplied from the light-receiving pixel P via the signal line VSL and the capacitor 22 and the reference signal RAMP supplied from the reference signal generator 13 via the capacitor 23. The comparator circuit 24 sets an operating point by setting voltages of the capacitors 22 and 23 on the basis of a control signal AZ supplied from the imaging controller 18. In addition, the comparator circuit 24 thereafter performs a comparison operation of comparing the reset voltage Vreset included in the signal SIG and the voltage of the reference signal RAMP during the P-phase period TP, and performs a comparison operation of comparing the pixel voltage Vpix included in the signal SIG and the voltage of the reference signal RAMP during the D-phase period TD.

The counter 25 is configured to perform a counting operation of counting pulses of a clock signal CLK supplied from the imaging controller 18 on the basis of the signal CP supplied from the comparator circuit 24. Specifically, during the P-phase period TP, the counter 25 generates a count value CNTP by counting the pulses of the clock signal CLK until the signal CP transitions, and outputs the count value CNTP as a digital code having a plurality of bits. Further, during the D-phase period TD, the counter 25 generates a count value CNTD by counting the pulses of the clock signal CLK until the signal CP transitions, and outputs the count value CNTD as a digital code having a plurality of bits.

The latch 26 is configured to temporarily hold the digital codes supplied from the counter 25 and to output the digital codes to a bus wiring line BUS on the basis of instructions from the transfer controller 27.

The transfer controller 27 is configured to perform control on the basis of a control signal CTL supplied from the imaging controller 18 to cause the latches 26 of the plurality of AD converters ADC to sequentially output the digital codes to the bus wiring line BUS. The readout unit 20 uses this bus wiring line BUS to sequentially transfer the plurality of digital codes supplied from the plurality of AD converters ADC to the signal processor 15 as the image signals Spic0.

The signal processor 15 (FIG. 1) is configured to generate an image signal Spic by performing predetermined signal processing on the basis of the image signal Spic0 and instructions from the imaging controller 18. The signal processor 15 includes an image data generator 16 and a phase difference data generator 17. The image data generator 16 is configured to generate image data DP representing a captured image by performing predetermined image processing on the basis of the image signal Spic0. The phase difference data generator 17 is configured to generate phase difference data DF representing an image-plane phase difference by performing predetermined image processing on the basis of the image signal Spic0. The signal processor 15 generates the image signal Spic including the image data DP generated by the image data generator 16 and the phase difference data DF generated by the phase difference data generator 17.

FIG. 8 illustrates an example of the image signal Spic. The signal processor 15 generates the image signal Spic by, for example, alternately arranging the image data DP for a plurality of rows of light-receiving pixels P and the phase difference data DF for a plurality of rows of light-receiving pixels P. The signal processor 15 then outputs such an image signal Spic.

The imaging controller 18 is configured to control the operation of the imaging apparatus 1 by supplying control signals to the driving unit 12, the reference signal generator 13, the readout unit 20, and the signal processor 15 and controlling the operations of these circuits. The imaging controller 18 is to be supplied with a control signal Sct1 from an external source. The control signal Sct1 includes, for example, information about a zoom factor of a so-called electronic zoom. The imaging controller 18 controls the operation of the imaging apparatus 1 on the basis of the control signal Sct1.

Here, the light-receiving pixel P corresponds to a specific example of a "light-receiving pixel" in the present disclosure. The pixel pair 90 corresponds to a specific example of a "pixel pair" in the present disclosure. The pixel block 100 corresponds to a specific example of a "pixel block" in the present disclosure. For example, the pixel block 100Gr corresponds to a specific example of a "first pixel block" in the present disclosure. For example, the pixel block 100R corresponds to a specific example of a "second pixel block" in the present disclosure. The lens 101 corresponds to a specific example of a "lens" in the present disclosure. The control line TRGL corresponds to a specific example of a "control line" in the present disclosure. The insulating layer 113 corresponds to a specific example of an "insulating layer" in the present disclosure.

[Operations and Workings]

Next, a description is given of the operations and workings of the imaging apparatus 1 according to the present embodiment.

(Overview of Overall Operation)

First, an overview of an overall operation of the imaging apparatus 1 is described with reference to FIGS. 1 and 7. The driving unit 12 subsequentially drives the plurality of light-receiving pixels P in the pixel array 11 on the basis of instructions from the imaging controller 18. The reference signal generator 13 generates the reference signal RAMP on the basis of instructions from the imaging controller 18. The light-receiving pixel P outputs the reset voltage Vreset as the signal SIG during the P-phase period TP, and outputs the pixel voltage Vpix corresponding to the amount of received light as the signal SIG during the D-phase period TD. The readout unit 20 generates the image signal Spic0 on the basis of the signal SIG supplied from the pixel array 11 via the signal line VSL and instructions from the imaging controller 18. In the signal processor 15, the image data generator 16 generates the image data DP representing a captured image by performing predetermined image processing on the basis of the image signal Spic0, and the phase difference data generator 17 generates the phase difference data DF representing the image-plane phase difference by performing predetermined image processing on the basis of the image signal Spic0. Then, the signal processor 15 generates the image signal Spic including the image data DP and the phase difference data DF. The imaging controller 18 controls the operation of the imaging apparatus 1 by supplying control signals to the driving unit 12, the reference signal generator 13, the readout unit 20, and the signal processor 15 and controlling the operations of these circuits.

(Detailed Operation)

The imaging controller 18 controls the operation of the imaging apparatus 1 on the basis of the control signal Sct1 including the information about the zoom factor of the electronic zoom. A description is given below of a zoom operation of the imaging apparatus 1.

FIG. 9 illustrates an example of the number of the light-receiving pixels P pertaining to a captured image (the number of effective pixels) in a case where the zoom factor is varied from 1× to 10×. In FIG. 9, the solid line represents the number of effective pixels of the imaging apparatus 1. FIG. 10 illustrates an example of the zoom operation of the imaging apparatus 1, in which (A) illustrates an operation in a case where the zoom factor is 1×, (B) illustrates an operation in a case where the zoom factor is 2×, and (C) illustrates an operation in a case where the zoom factor is 3×.

The imaging apparatus 1 has three imaging modes M (imaging modes MA, MB, and MC). The imaging controller 18 selects one of the three imaging modes MA to MC on the basis of the information about the zoom factor included in the control signal Sct1. Specifically, as illustrated in FIG. 9, the imaging controller 18 selects the imaging mode MA in a case where the zoom factor is less than 2, selects the imaging mode MB in a case where the zoom factor is 2 or more and less than 3, and selects the imaging mode MC in a case where the zoom factor is 3 or more.

In the imaging mode MA, as illustrated in (A) of FIG. 10, the imaging apparatus 1 obtains four pixel values V (pixel values VR, VGr, VGb, and VB) for each of a plurality of units or units U. Specific operations will be described later. In such a manner, the imaging apparatus 1 generates the image data DP by generating the pixel values V with a ratio of four pixel values V to 36 light-receiving pixels P. In a case where the number of the light-receiving pixels P in the pixel array 11 is 108 [Mpix], the pixel values V are calculated for 12 [Mpix]. Thus, as illustrated in FIG. 9, the number of effective pixels is 12 [Mpix].

As illustrated in FIG. 9, if the zoom factor is increased from 1 in the imaging mode MA, the number of effective pixels decreases in accordance with the factor. Then, when the zoom factor reaches 2, the imaging mode M turns into the imaging mode MB.

In the imaging mode MB, as illustrated in (B) of FIG. 10, the imaging apparatus 1 obtains 16 pixel values V for each of the plurality of units or units U. Specific operations will be described later. In such a manner, the imaging apparatus 1 generates the image data DP by generating the pixel values V with a ratio of 16 pixel values V to 36 light-receiving pixels P. In the case where the number of the light-receiving pixels Pin the pixel array 11 is 108 [Mpix], the pixel values V are calculated for 48 [Mpix]. In actuality, because the zoom factor is 2×, the imaging region is reduced to ¼ as illustrated in (B) of FIG. 10, and the number of effective pixels is thus 12 [Mpix] (=48 [Mpix]/4).

As illustrated in FIG. 9, if the zoom factor is increased from 2 in the imaging mode MB, the number of effective pixels decreases in accordance with the factor. Then, when the zoom factor reaches 3, the imaging mode M turns into the imaging mode MC.

In the imaging mode MC, as illustrated in (C) of FIG. 10, the imaging apparatus 1 obtains 36 pixel values V for each of the plurality of units or units U. Specific operations will be described later. In such a manner, the imaging apparatus 1 generates the image data DP by generating the pixel values V with a ratio of 36 pixel values V to 36 light-receiving pixels P. In the case where the number of the light-receiving pixels P in the pixel array 11 is 108 [Mpix], it is possible to obtain a captured image of 108 [Mpix]. In actuality, because the zoom factor is 3×, the imaging region is reduced to ⅑ as illustrated in (C) of FIG. 10, and the number of effective pixels is thus 12 [Mpix](=108 [Mpix]/9).

As described above, the imaging apparatus 1 is provided with the three imaging modes M, and therefore it is possible to reduce a change in the image quality of a captured image in a case where the zoom factor is changed. More specifically, for example, in a case where the imaging mode MB is omitted and the two the imaging modes MA and MC are provided, selecting the imaging mode MA in a case where the zoom factor is less than 2× and selecting the imaging mode MC in a case where the zoom factor is 2× or more results in a large change in the number of effective pixels, as illustrated in broken lines in FIG. 9. More specifically, in this example, in a case where the zoom factor is 2×, the imaging mode MC is selected and the number of effective pixels is 27 [Mpix](=108 [Mpix]/4). Therefore, a large difference occurs between the number of effective pixels in a case where the zoom factor is, for example, 1.9× and the number of effective pixels in the case where the zoom factor is 2×. This can result in a large change in the image quality of a captured image. In contrast, the imaging apparatus 1 is provided with the three imaging modes M, and is thus able to reduce a change in the number of effective pixels in the case of changing the zoom factor. This makes it possible to suppress a change in the image quality of a captured image.

(Imaging Mode MA)

FIG. 11 illustrates an operation example of the imaging apparatus 1 in the imaging mode MA. In FIG. 11, the light-receiving pixels P illustrated with "○" represent the light-receiving pixels P that are targeted for the readout operation.

First, as illustrated in (A) of FIG. 11, the imaging apparatus 1 generates image data DT1 by calculating a pixel value V corresponding to the amount of received light of the left light-receiving pixels P in the pixel pairs 90 provided with the lenses 101 in each of the plurality of pixel blocks 100. Specifically, among the ten light-receiving pixels PGr in the pixel block 100Gr, the imaging apparatus 1 targets the five light-receiving pixels PGr disposed on the left in the five pixel pairs 90 for the readout operation, and thus calculates a pixel value VGr1 at a centroid position of the five light-receiving pixels PGr. Further, among the eight light-receiving pixels PR in the pixel block 100R, the imaging apparatus 1 targets the four light-receiving pixels PR disposed on the left in the four pixel pairs 90 for the readout operation, and thus calculates a pixel value VR1 at a centroid position of the four light-receiving pixels PR. Among the eight light-receiving pixels PB in the pixel block 100B, the imaging apparatus 1 targets the four light-receiving pixels PB disposed on the left in the four pixel pairs 90 for the readout operation, and thus calculates a pixel value VB1 at a centroid position of the four light-receiving pixels PB. Among the ten light-receiving pixels PGb in the pixel block 100Gb, the imaging apparatus 1 targets the five light-receiving pixels PGb disposed on the left in the five pixel pairs 90 for the readout operation, and thus calculates a pixel value VGb1 at a centroid position of the five light-receiving pixels PGb. In such a manner, the imaging apparatus 1 generates the image data DT1 ((A) of FIG. 11) including the pixel values VGr1, VR1, VB1, and VGb1.

Next, as illustrated in (B) of FIG. 11, the imaging apparatus 1 generates image data DT2 by calculating pixel values V corresponding to the amounts of received light of all of the light-receiving pixels Pin each of the plurality of pixel blocks 100. Specifically, the imaging apparatus 1 targets the ten light-receiving pixels PGr in the pixel block 100Gr for the readout operation, and thus calculates a pixel value VGr2 at a centroid position of the ten light-receiving pixels PGr. Further, the imaging apparatus 1 targets the eight light-receiving pixels PR in the pixel block 100R for the readout operation, and thus calculates a pixel value VR2 at a centroid position of the eight light-receiving pixels PR. The imaging apparatus 1 targets the eight light-receiving pixels PB in the pixel block 100B for the readout operation, and thus calculates a pixel value VB2 at a centroid position of the eight light-receiving pixels PB. The imaging apparatus 1 targets the ten light-receiving pixels PGb in the pixel block 100Gb for the readout operation, and thus calculates a pixel value VGb2 at a centroid position of the ten light-receiving pixels PGb. In such a manner, the imaging apparatus 1 generates the image data DT2 ((B) of FIG. 11) including the pixel values VGr2, VR2, VB2, and VGb2.

With attention focused on the certain pixel block 100Gr, a description is given below of the readout operation on the ten light-receiving pixels PGr in the pixel block 100Gr.

FIG. 12 illustrates an example of the readout operation, in which (A) illustrates a waveform of the control signal SSEL, (B) illustrates a waveform of the control signal SRST, (C) illustrates a waveform of the control signal STRG (a control signal STRGL) supplied to the light-receiving pixel PGr disposed on the left in the pixel pair 90, (D) illustrates a waveform of the control signal STRG (a control signal STRGR) supplied to the light-receiving pixel PGr disposed on the right in the pixel pair 90, (E) illustrates a waveform of the control signal AZ, (F) illustrates a waveform of the reference signal RAMP, (G) illustrates a waveform of the signal SIG, and (H) illustrates a waveform of the signal CP. In (F) and (G) of FIG. 12, the waveforms of the reference signal RAMP and the signal SIG are illustrated using the same voltage axis. Further, in this description, the waveform of the reference signal RAMP illustrated in (F) of FIG. 12 is the waveform of a voltage supplied to an input terminal of the comparator circuit 24 via the capacitor 23, and the waveform of the signal SIG illustrated in (G) of FIG. 12 is the waveform of a voltage supplied to the input terminal of the comparator circuit 24 via the capacitor 22.

First, a horizontal period H starts at a timing t11. The driving unit 12 thus changes the voltage of the control signal SSEL from the low level to the high level ((A) of FIG. 12). This turns on the transistor SEL in the pixel block 100Gr, and causes the pixel block 100Gr to be electrically coupled to the signal line VSL. Further, at this timing t11, the driving unit 12 changes the voltage of the control signal SRST from the low level to the high level ((B) of FIG. 12). This turns on the transistor RST in the pixel block 100Gr, and causes the voltage of the floating diffusion FD to be set to the power supply voltage VDD (a reset operation). Then, the pixel block 100Gr outputs a voltage corresponding to the voltage of the floating diffusion FD at this time. Further, at this timing t11, the imaging controller 18 changes the voltage of the control signal AZ from the low level to the high level ((E) of FIG. 12). This causes the comparator circuit 24 of the AD converter ADC to set the operating point by setting the voltages of the capacitors 22 and 23. In such a manner, the voltage of the signal SIG is set to the reset voltage Vreset, and the voltage of the reference signal RAMP is set to the same voltage as the voltage of the signal SIG (the reset voltage Vreset) ((F) and (G) of FIG. 12).

Then, at a timing at which a predetermined time has elapsed from the timing t11, the driving unit 12 changes the voltage of the control signal SRST from the high level to the low level ((B) of FIG. 12). This turns off the transistor RST in the pixel block 100Gr, and causes the reset operation to end.

Next, at a timing t12, the imaging controller 18 changes the voltage of the control signal AZ from the high level to the low level ((E) of FIG. 12). This causes the comparator circuit 24 to end the setting of the operating point.

Further, at this timing t12, the reference signal generator 13 sets the voltage of the reference signal RAMP to a voltage V1 ((F) of FIG. 12). This makes the voltage of the reference signal RAMP higher than the voltage of the signal SIG. The comparator circuit 24 thus changes the voltage of the signal CP from the low level to the high level ((H) of FIG. 12).

Then, during a period from a timing t13 to a timing t15 (P-phase period TP), the AD converter ADC performs AD conversion on the basis of the signal SIG. Specifically, first, at the timing t13, the reference signal generator 13 starts decreasing the voltage of the reference signal RAMP from the voltage V1 at a predetermined change rate ((F) of FIG. 12). Further, at this timing t13, the imaging controller 18 starts generating the clock signal CLK. The counter 25 of the AD converter ADC performs the counting operation to thereby count the pulses of the clock signal CLK.

Then, at a timing t14, the voltage of the reference signal RAMP falls below the voltage of the signal SIG (the reset voltage Vreset) ((F) and (G) of FIG. 12). The comparator circuit 24 of the AD converter ADC thus changes the voltage of the signal CP from the high level to the low level ((H) of FIG. 12). The counter 25 of the AD converter ADC stops the counting operation on the basis of the transition of the signal CP. The count value (count value CNTP) of the counter 25 at this time is a value corresponding to the reset voltage Vreset. The latch 26 holds this count value CNTP. The counter 25 then resets the count value.

Next, at the timing t15, the imaging controller 18 stops generating the clock signal CLK at the end of the P-phase period TP. Further, the reference signal generator 13 stops changing the voltage of the reference signal RAMP at this timing t15 ((F) of FIG. 12). Then, during a period from the timing t15 forward, the readout unit 20 supplies the count value CNTP held by the latch 26 to the signal processor 15 as the image signal Spic0.

Next, at a timing t16, the imaging controller 18 sets the voltage of the reference signal RAMP to the voltage V1 ((F) of FIG. 12). This makes the voltage of the reference signal RAMP higher than the voltage of the signal SIG (the reset voltage Vreset). The comparator circuit 24 thus changes the voltage of the signal CP from the low level to the high level ((H) of FIG. 12).

Next, at a timing t17, the driving unit 12 changes the voltage of the control signal STRGL from the low level to the high level ((C) of FIG. 12). This turns on the transistors TRG in the five light-receiving pixels PGr disposed on the left in the pixel pairs 90, and causes the electric charge generated at the photodiodes PD to be transferred to the floating diffusion FD (an electric charge transfer operation). Then, the pixel block 100Gr outputs a voltage corresponding to the voltage of the floating diffusion FD at this time. In such a manner, the voltage of the signal SIG becomes a pixel voltage Vpix1 ((G) of FIG. 12).

Then, at a timing at which a predetermined time has elapsed from the timing t17, the driving unit 12 changes the voltage of the control signal STRGL from the high level to the low level ((C) of FIG. 12). This turns off the transistors TRG in the five light-receiving pixels PGr disposed on the left in the pixel pairs 90, and causes the electric charge transfer operation to end.

Then, during a period from a timing t18 to a timing t20 (D-phase period TD1), the AD converter ADC performs AD conversion on the basis of the signal SIG. Specifically, first, at the timing t18, the reference signal generator 13 starts decreasing the voltage of the reference signal RAMP from the voltage V1 at a predetermined change rate ((F) of FIG. 12). Further, at this timing t18, the imaging controller 18 starts generating the clock signal CLK. The counter 25 of the AD converter ADC performs the counting operation to thereby count the pulses of the clock signal CLK.

Then, at a timing t19, the voltage of the reference signal RAMP falls below the voltage of the signal SIG (the pixel voltage Vpix1) ((F) and (G) of FIG. 12). The comparator circuit 24 of the AD converter ADC thus changes the voltage of the signal CP from the high level to the low level ((H) of FIG. 12). The counter 25 of the AD converter ADC stops the counting operation on the basis of the transition of the signal CP. The count value (count value CNTD1) of the counter 25 at this time is a value corresponding to the pixel voltage Vpix1. The latch 26 holds this count value CNTD1. The counter 25 then resets the count value.

Next, at the timing t20, the imaging controller 18 stops generating the clock signal CLK at the end of the D-phase period TD1. Further, the reference signal generator 13 stops changing the voltage of the reference signal RAMP at this timing t20 ((F) of FIG. 12). Then, during a period from the timing t20 forward, the readout unit 20 supplies the count value CNTD1 held by the latch 26 to the signal processor 15 as the image signal Spic0.

Next, at a timing t21, the imaging controller 18 sets the voltage of the reference signal RAMP to the voltage V1 ((F) of FIG. 12). This makes the voltage of the reference signal RAMP higher than the voltage of the signal SIG (the pixel voltage Vpix1). The comparator circuit 24 thus changes the voltage of the signal CP from the low level to the high level ((H) of FIG. 12).

Next, at a timing t22, the driving unit 12 changes the respective voltages of the control signals STRGL and STRGR from the low level to the high level ((C) and (D) of FIG. 12). This turns on the transistors TRG in the ten light-receiving pixels PGr in the pixel block 100Gr, and causes the electric charge generated at the photodiodes PD to be transferred to the floating diffusion FD (the electric charge transfer operation). Then, the pixel block 100Gr outputs a voltage corresponding to the voltage of the floating diffusion FD at this time. In such a manner, the voltage of the signal SIG becomes a pixel voltage Vpix2 ((G) of FIG. 12).

Then, at a timing at which a predetermined time has elapsed from the timing t22, the driving unit 12 changes the respective voltages of the control signals STRGL and STRGR from the high level to the low level ((C) and (D) of FIG. 12). This turns off the transistors TRG in the ten light-receiving pixels PGr, and causes the electric charge transfer operation to end.

Then, during a period from a timing t23 to a timing t25 (D-phase period TD2), the AD converter ADC performs AD conversion on the basis of the signal SIG. Specifically, first, at the timing t23, the reference signal generator 13 starts decreasing the voltage of the reference signal RAMP from the voltage V1 at a predetermined change rate ((F) of FIG. 12). Further, at this timing t23, the imaging controller 18 starts generating the clock signal CLK. The counter 25 of the AD converter ADC performs the counting operation to thereby count the pulses of the clock signal CLK.

Then, at a timing t24, the voltage of the reference signal RAMP falls below the voltage of the signal SIG (the pixel voltage Vpix2) ((F) and (G) of FIG. 12). The comparator circuit 24 of the AD converter ADC thus changes the voltage of the signal CP from the high level to the low level ((H) of FIG. 12). The counter 25 of the AD converter ADC stops the counting operation on the basis of the transition of the signal CP. The count value (count value CNTD2) of the counter 25 at this time is a value corresponding to the pixel voltage Vpix2. The latch 26 holds this count value CNTD2. The counter 25 then resets the count value.

Next, at the timing t25, the imaging controller 18 stops generating the clock signal CLK at the end of the D-phase period TD2. Further, the reference signal generator 13 stops changing the voltage of the reference signal RAMP at this timing t25 ((F) of FIG. 12). Then, during a period from the timing t25 forward, the readout unit 20 supplies the count value CNTD2 held by the latch 26 to the signal processor 15 as the image signal Spic0.

Next, at a timing t26, the driving unit 12 changes the voltage of the control signal SSEL from the high level to the low level ((A) of FIG. 12). This turns off the transistor SEL in the pixel block 100Gr, and causes the pixel block 100Gr to be electrically uncoupled from the signal line VSL.

In such a manner, the readout unit 20 supplies the image signal Spic0 including the count values CNTP, CNTD1, and CNTD2 to the signal processor 15. The signal processor 15 generates the pixel value VGr1 illustrated in (A) of FIG. 11 and the pixel value VGr2 illustrated in (B) of FIG. 11 by utilizing the principle of correlated double sampling on the basis of the count values CNTP, CNTD1, and CNTD2 included in the image signals Spic0, for example. Specifically, the signal processor 15 generates the pixel value VGr1 by, for example, subtracting the count value CNTP from the count value CNTD1. Because the count value CNTD1 is a value corresponding to the sum of the amounts of received light at the five light-receiving pixels PGr disposed on the left in the five pixel pairs 90 in the pixel block 100Gr, the signal processor 15 is able to generate the pixel value VGr1 illustrated in (A) of FIG. 11 on the basis of the count value CNTD1. Similarly, the signal processor 15 generates the pixel value VGr2 by, for example, subtracting the count value CNTP from the count value CNTD2. Because the count value CNTD2 is a value corresponding to the sum of the amounts of received light at the ten light-receiving pixels PGr in the pixel block 100Gr, the signal processor 15 is able to generate the pixel value VGr2 illustrated in (B) of FIG. 11 on the basis of the count value CNTD2.

Although the description has been given above of the pixel block 100Gr, the same applies to the pixel blocks 100R, 100Gb, and 100B. In such a manner, as illustrated in FIG. 11, the signal processor 15 generates the image data DT1 including the pixel values VR1, VGr1, VGb1, and VB1 and the image data DT2 including the pixel values VR2, VGr2, VGb2, and VB2.

FIG. 13 illustrates an example of image processing by the signal processor 15 in the imaging mode MA.

First, the signal processor 15 generates image data DT3 by performing a subtraction process on the basis of the image data DT1 and DT2.

Specifically, the signal processor 15 subtracts the pixel value VGr1 in the image data DT1 from the pixel value VGr2 in the image data DT2 to thereby calculate a pixel value VGr3. The pixel value VGr3 is a value corresponding to the sum of the amounts of received light at the five light-receiving pixels PGr disposed on the right in the five pixel pairs 90 in the pixel block 100Gr. More specifically, the pixel value VGr1 is a value corresponding to the sum of the amounts of received light at the five light-receiving pixels PGr disposed on the left in the five pixel pairs 90 in the pixel block 100Gr, and the pixel value VGr2 is a value corresponding to the sum of the amounts of received light at the ten light-receiving pixels PGr in the pixel block 100Gr. Therefore, subtracting the pixel value VGr1 from the pixel value VGr2 gives a value corresponding to the sum of the amounts of received light at the five light-receiving pixels PGr disposed on the right in the five pixel pairs 90 in the pixel block 100Gr. Because the pixel value VGr3 is the value corresponding to the sum of the amounts of received light at the five light-receiving pixels PGr disposed on the right in the five pixel pairs 90 as described above, the pixel value VGr3 is disposed at a centroid position of these five light-receiving pixels PGr, as illustrated in FIG. 13.

Similarly, the signal processor 15 subtracts the pixel value VR1 in the image data DT1 from the pixel value VR2 in the image data DT2 to thereby calculate a pixel value VR3. The pixel value VR3 is a value corresponding to the sum of the amounts of received light at the four light-receiving pixels PR disposed on the right in the four pixel pairs 90 in the pixel block 100R. The pixel value VR3 is disposed at a centroid position of the four light-receiving pixels PR disposed on the right in the four pixel pairs 90 in the pixel block 100R.

The signal processor 15 subtracts the pixel value VB1 in the image data DT1 from the pixel value VB2 in the image data DT2 to thereby calculate a pixel value VB3. The pixel value VB3 is a value corresponding to the sum of the amounts of received light at the four light-receiving pixels PB disposed on the right in the four pixel pairs 90 in the pixel block 100B. The pixel value VB3 is disposed at a centroid position of the four light-receiving pixels PB disposed on the right in the four pixel pairs 90 in the pixel block 100B.

The signal processor 15 subtracts the pixel value VGb1 in the image data DT1 from the pixel value VGb2 in the image data DT2 to thereby calculate a pixel value VGb3. The pixel value VGb3 is a value corresponding to the sum of the amounts of received light at the five light-receiving pixels PGb disposed on the right in the five pixel pairs 90 in the pixel block 100Gb. The pixel value VGb3 is disposed at a centroid position of the five light-receiving pixels PGb disposed on the right in the five pixel pairs 90 in the pixel block 100Gb.

Then, the image data generator 16 of the signal processor 15 performs predetermined image processing on the basis of the image data DT2 to thereby generate the image data DP ((A) of FIG. 10) representing the captured image.

Further, the phase difference data generator 17 of the signal processor 15 performs predetermined image processing on the basis of the image data DT1 and DT3 to thereby generate the phase difference data DF representing the image-plane phase difference. More specifically, the image data DT1 includes the pixel values V at the light-receiving pixels P disposed on the left in the plurality of pixel pairs 90, and the image data DT3 includes the pixel values V at the light-receiving pixels P disposed on the right in the plurality of pixel pairs 90. The phase difference data generator 17 is therefore able to generate the phase difference data DF on the basis of the image data DT1 and DT3.

In the imaging apparatus 1, as illustrated in FIG. 2, the lenses 101 are arranged side by side in the X direction and the Y direction in the pixel array 11. This makes it possible to generate the phase difference data DF at high resolution over the entire surface of the pixel array 11. Therefore, for example, a camera equipped with such an imaging apparatus 1 is able to achieve highly accurate autofocusing and, as a result, is able to increase image quality.

Here, the imaging mode MA corresponds to a specific example of a "first imaging mode" in the present disclosure. The pixel value in the image data DT1 corresponds to a specific example of a "first pixel value" in the present disclosure. The pixel value in the image data DT2 corresponds to a specific example of a "second pixel value" in the present disclosure. The pixel value in the image data DT3 corresponds to a specific example of a "third pixel value" in the present disclosure.

(Imaging Mode MB)

FIG. 14 illustrates an operation example of the imaging apparatus 1 in the imaging mode MB. FIG. 15 more specifically illustrates the operation illustrated in FIG. 14. In FIGS. 14 and 15, the light-receiving pixels P illustrated with "○" represent the light-receiving pixels P that are targeted for the readout operation.

In the pixel block 100Gr, as illustrated in (A) of FIG. 15, the imaging apparatus 1 targets the light-receiving pixel PGr disposed on the left in one pixel pair 90 among the five pixel pairs 90 in the pixel block 100Gr for the readout operation, and calculates the pixel value VGr1 at the position of this light-receiving pixel PGr. Then, as illustrated in (B) of FIG. 15, the imaging apparatus 1 next targets the two light-receiving pixels PGr in the pixel pair 90 for the readout operation, and calculates the pixel value VGr2 at a centroid position of the two light-receiving pixels PGr.

Similarly, in the pixel block 100R, as illustrated in (A) of FIG. 15, the imaging apparatus 1 targets the light-receiving pixel PR disposed on the left in one pixel pair 90 among the four pixel pairs 90 in the pixel block 100R for the readout operation, and calculates the pixel value VR1 at the position of this light-receiving pixel PR. Then, as illustrated in (B) of FIG. 15, the imaging apparatus 1 next targets the two light-receiving pixels PR in the pixel pair 90 for the readout operation, and calculates the pixel value VR2 at a centroid position of the two light-receiving pixels PR.

Similarly, in the pixel block 100B, as illustrated in (A) of FIG. 15, the imaging apparatus 1 targets the light-receiving pixel PB disposed on the left in one pixel pair 90 among the four pixel pairs 90 in the pixel block 100B for the readout operation, and calculates the pixel value VB1 at the position of this light-receiving pixel PB. Then, as illustrated in (B) of FIG. 15, the imaging apparatus 1 next targets the two light-receiving pixels PB in the pixel pair 90 for the readout operation, and calculates the pixel value VB2 at a centroid position of the two light-receiving pixels PB.

Similarly, in the pixel block 100Gb, as illustrated in (A) of FIG. 15, the imaging apparatus 1 targets the light-receiving pixel PGb disposed on the left in one pixel pair 90 among the five pixel pairs 90 in the pixel block 100Gb for the readout operation, and calculates the pixel value VGb1 at the position of this light-receiving pixel PGb. Then, as illustrated in (B) of FIG. 15, the imaging apparatus 1 next targets the two light-receiving pixels PGb in the pixel pair 90 for the readout operation, and calculates the pixel value VGb2 at a centroid position of the two light-receiving pixels PGb.

The readout operations in (A) and (B) of FIG. 15 are operations similar to the readout operations in the imaging mode MA (FIG. 12) described above. The imaging apparatus 1 thereafter performs operations of (C) and (D) of FIG. 15, operations of (E) and (F) of FIG. 15, operations of (G) and (H) of FIG. 15, operations of (I) and (J) of FIG. and operations of (K) and (L) of FIG. 15. In such a manner, the imaging apparatus 1 generates the image data DT1 ((A) of FIG. 14) including the pixel values VGr1, VR1, VB1, and VGb1 and the image data DT2 ((B) of FIG. 14) including the pixel values VGr2, VR2, VB2, and VGb2.

FIG. 16 illustrates an example of image processing by the signal processor 15 in the imaging mode MB.

First, the signal processor 15 generates the image data DT3 by performing a subtraction process on the basis of the image data DT1 and DT2.

Specifically, the signal processor 15 subtracts the five pixel values VGr1 in the image data DT1 respectively from the five pixel values VGr2 in the image data DT2 to thereby calculate five pixel values VGr3. This pixel value VGr3 is a value corresponding to the amount of received light at the light-receiving pixel PGr disposed on the right in a pixel pair 90 in the pixel block 100Gr. More specifically, the pixel value VGr1 is a value corresponding to the amount of received light at the light-receiving pixel PGr disposed on the left in a pixel pair 90 in the pixel block 100Gr, and the pixel value VGr2 is a value corresponding to the sum of the amounts of received light at the two light-receiving pixels PGr in the pixel pair 90. Therefore, subtracting the pixel value VGr1 from the pixel value VGr2 gives a value corresponding to the amount of received light at the light-receiving pixel PGr disposed on the right in the pixel pair 90 in the pixel block 100Gr. As described above, the pixel value VGr3 is the value corresponding to the amount of received light at the light-receiving pixel PGr disposed on the right in a pixel pair 90. Therefore, as illustrated in FIG. 16, the pixel value VGr3 is disposed at the position of the light-receiving pixel PGr disposed on the right in the pixel pair 90.

Similarly, the signal processor 15 subtracts the four pixel values VR1 in the image data DT1 respectively from the four pixel values VR2 in the image data DT2 to thereby calculate four pixel values VR3. This pixel value VR3 is a value corresponding to the amount of received light at the light-receiving pixel PR disposed on the right in a pixel pair 90 in the pixel block 100R. The pixel value VR3 is disposed at the position of the light-receiving pixel PR disposed on the right in the pixel pair 90.

The signal processor 15 subtracts the four pixel values VB1 in the image data DT1 respectively from the four pixel values VB2 in the image data DT2 to thereby calculate four pixel values VB3. This pixel value VB3 is a value corresponding to the amount of received light at the light-receiving pixel PB disposed on the right in a pixel pair 90 in the pixel block 100B. The pixel values VB3 are disposed at the positions of the four light-receiving pixels PB disposed on the right in the pixel pairs 90.

The signal processor 15 subtracts the five pixel values VGb1 in the image data DT1 respectively from the five pixel values VGb2 in the image data DT2 to thereby calculate five pixel values VGb3. This pixel value VGb3 is a value corresponding to the amount of received light at the light-receiving pixel PGb disposed on the right in a pixel pair 90 in the pixel block 100Gb. The pixel value VGb3 is disposed at the position of the light-receiving pixel PGb disposed on the right in the pixel pair 90.

Then, as illustrated in FIG. 16, the image data generator 16 of the signal processor 15 performs predetermined image processing on the basis of the image data DT2 to thereby generate the image data DP ((B) of FIG. 10) representing the captured image. The predetermined image processing includes a remosaic process of performing corrections of the pixel values V and performing rearrangement of the pixel values V.

FIG. 17 illustrates an example of the remosaic process in the imaging mode M2, in which (A) illustrates the image data DT2, (B) illustrates the positions of the pixel values V before and after the remosaic process, and (C) illustrates image data DT4 generated by the remosaic process on the basis of the image data DT2. In (B) of FIG. 17, "○" represents the position of the pixel value V in the image data DT2, and "□" represents the position of the pixel value V in the image data DT4.

FIG. 18A illustrates the remosaic process on the pixel block 100R. FIG. 18B illustrates the remosaic process on the pixel blocks 100Gr and 100Gb. FIG. 18C illustrates the remosaic process on the pixel block 100B. In FIGS. 18A to 18C, (A) illustrates the image data DT2, and (B) illustrates the image data DT4 generated by the remosaic process.

As illustrated in (A) of FIG. 17, the image data DT2 includes the pixel values V with a ratio of 18 pixel values V to 36 light-receiving pixels P. For example, in a case where the number of the light-receiving pixels P in the pixel array 11 is 108 [Mpix], the image data DT2 includes the pixel values V for 54 [Mpix]. Meanwhile, as illustrated in (C) of FIG. 17, the image data DT4 includes the pixel values V with a ratio of 16 pixel values V to 36 light-receiving pixels P. For example, in a case where the number of the light-receiving pixels P in the pixel array 11 is 108 [Mpix], the image data DT4 includes the pixel values V for 48 [Mpix]. Further, in the image data DT4, four pixel values VGr4, VR4, VB4, VGb4 are arranged in the Bayer arrangement. The image data generator 16 generates such image data DT4 by performing corrections of the pixel values V in the image data DT2 and performing rearrangement of the pixel values V.

Specifically, as illustrated in FIG. 18A, the image data generator 16 performs, for example, a complementing process on the basis of a plurality of pixel values VR2 in the image data DT2 to thereby calculate pixel values V over a surface, and generates the pixel value VR4 on the basis of the pixel values V over the surface. Similarly, as illustrated in FIG. 18B, the image data generator 16 performs, for example, the complementing process on the basis of a plurality of pixel values VGr2 and VGb2 in the image data DT2 to thereby calculate pixel values V over a surface, and generates the pixel values VGr4 and VGb4 on the basis of the pixel values V over the surface. As illustrated in FIG. 18C, the image data generator 16 performs, for example, the complementing process on the basis of a plurality of pixel values VB2 in the image data DT2 to thereby calculate pixel values V over a surface, and generates the pixel value VB4 on the basis of the pixel values V over the surface.

In such a manner, the image data generator 16 generates the image data DT4 illustrated in (C) of FIG. 17 on the basis of the image data DT2 illustrated in (A) of FIG. 17. Then, the image data generator 16 performs the predetermined image processing on the basis of the image data DT4 to thereby generate the image data DP ((B) of FIG. 10) representing the captured image.

Further, as illustrated in FIG. 16, the phase difference data generator 17 of the signal processor 15 performs the predetermined image processing on the basis of the image data DT1 and DT3 to thereby generate the phase difference data DF representing the image-plane phase difference. More specifically, the image data DT1 includes the pixel values V at the light-receiving pixels P disposed on the left in the plurality of pixel pairs 90, and the image data DT3 includes the pixel values V at the light-receiving pixels P disposed on the right in the plurality of pixel pairs 90. The phase difference data generator 17 is therefore able to generate the phase difference data DF on the basis of the image data DT1 and DT3.

The phase difference data generator 17 generates the phase difference data DF by performing rearrangement of the pixel values V on the basis of the image data DT1 and DT3, similarly to the image data generator 16. More specifically, the image data DT1 and DT3 include the left and right pixel values V for the pixel pairs 90 with a ratio of 18 pixel values V to 36 light-receiving pixels P. The phase difference data generator 17 thus performs rearrangement of the pixel values V to include the left and right pixel values V for the pixel pairs 90 with a ratio of 16 pixel values V to 36 light-receiving pixels P. The phase difference data generator 17 is thereby able to generate the phase difference data DF corresponding to the image data DP generated by the image data generator 16.

Here, the imaging mode MB corresponds to a specific example of a "second imaging mode" in the present disclosure. The pixel value in the image data DT1 corresponds to a specific example of the "first pixel value" in the present disclosure. The pixel value in the image data DT2 corresponds to a specific example of the "second pixel value" in the present disclosure. The pixel value in the image data DT3 corresponds to a specific example of the "third pixel value" in the present disclosure. The pixel value in the image data DT4 corresponds to a specific example of a "fourth pixel value" in the present disclosure.

(Imaging Mode C)

FIG. 19 illustrates an operation example of the imaging apparatus 1 in the imaging mode MC. FIG. 20 more specifically illustrates the operation illustrated in FIG. 19. In FIGS. 19 and 20, the light-receiving pixels P illustrated with "○" represent the light-receiving pixels P that are targeted for the readout operation.

In the pixel block 100Gr, as illustrated in (A) of FIG. 20, the imaging apparatus 1 targets one light-receiving pixel PGr among the ten light-receiving pixels PGr in the pixel block 100Gr for the readout operation, and calculates the pixel value VGr1 at the position of this light-receiving pixel PGr.

FIG. 21 illustrates an example of the readout operation, in which (A) illustrates the waveform of the control signal SSEL, (B) illustrates the waveform of the control signal SRST, (C) illustrates the waveform of the control signal STRG supplied to the light-receiving pixel PGr targeted for the readout operation, (D) illustrates the waveform of the control signal AZ, (E) illustrates the waveform of the reference signal RAMP, (F) illustrates the waveform of the signal SIG, and (G) illustrates the waveform of the signal CP. This readout operation corresponds to the readout operation (FIG. 12) in the imaging modes MA and MB from which the operations during the period from the timing t21 to the timing t26 are omitted. In such a manner, the readout unit 20 supplies the image signal Spic0 including the count values CNTP and CNTD1 to the signal processor 15. The signal processor 15 generates the pixel value VGr1 by utilizing the principle of correlated double sampling on the basis of the count values CNTP and CNTD1 included in the image signal Spic0, for example. Specifically, the signal processor 15 generates the pixel value VGr1 by, for example, subtracting the count value CNTP from the count value CNTD1.

Similarly, in the pixel block 100R, as illustrated in (A) of FIG. 20, the imaging apparatus 1 targets one light-receiving pixel PR among the eight light-receiving pixels PR in the pixel block 100R for the readout operation, and calculates the pixel value VR1 at the position of this light-receiving pixel PR.

Similarly, in the pixel block 100B, as illustrated in (A) of FIG. 20, the imaging apparatus 1 targets one light-receiving pixel PB among the eight light-receiving pixels PB in the pixel block 100B for the readout operation, and calculates the pixel value VB1 at the position of this light-receiving pixel PB.

Similarly, in the pixel block 100Gb, as illustrated in (A) of FIG. 20, the imaging apparatus 1 targets one light-receiving pixel PGb among the ten light-receiving pixels PGb in the pixel block 100Gb for the readout operation, and calculates the pixel value VGb1 at the position of this light-receiving pixel PGb.

The imaging apparatus 1 thereafter performs the operations of (B) to (L) of FIG. 20. In such a manner, the imaging apparatus 1 generates the image data DT1 (FIG. 19) including the pixel values VGr1, VR1, VB1, and VGb1.

FIG. 22 illustrates an example of image processing by the signal processor 15 in the imaging mode MC.

The image data generator 16 of the signal processor 15 performs predetermined image processing on the basis of the image data DT1 to thereby generate the image data DP ((C) of FIG. 10) representing the captured image. The predetermined image processing includes the remosaic process of performing corrections of the pixel values V and performing rearrangement of the pixel values V.

FIG. 23 illustrates an example of the remosaic process in the imaging mode MC, in which (A) illustrates the image data DT1, (B) illustrates the positions of the pixel values V before and after the remosaic process, and (C) illustrates the image data DT4 generated by the remosaic process on the basis of the image data DT1. In (B) of FIG. 23, "○" represents the position of the pixel value V in the image data DT1, and "□" represents the position of the pixel value V in the image data DT4.

FIG. 24A illustrates the remosaic process on the pixel block 100R. FIG. 24B illustrates the remosaic process on the pixel blocks 100Gr and 100Gb. FIG. 24C illustrates the remosaic process on the pixel block 100B. In FIGS. 24A to 24C, (A) illustrates the image data DT1, and (B) illustrates the image data DT4 generated by the remosaic process.

In the image data DT4, the four pixel values VGr4, VR4, VB4, VGb4 are arranged in the Bayer arrangement. The image data generator 16 generates such image data DT4 by performing corrections of the pixel values V in the image data DT1 and performing rearrangement of the pixel values V.

Specifically, as illustrated in FIG. 24A, the image data generator 16 performs, for example, a complementing process on the basis of a plurality of pixel values VR1 in the image data DT1 to thereby calculate pixel values V over a surface, and generates the pixel value VR4 on the basis of the pixel values V over the surface. Similarly, as illustrated in FIG. 24B, the image data generator 16 performs, for example, the complementing process on the basis of a plurality of pixel values VGr1 and VGb1 in the image data DT1 to thereby calculate pixel values V over a surface, and generates the pixel values VGr4 and VGb4 on the basis of the pixel values V over the surface. As illustrated in FIG. 24C, the image data generator 16 performs, for example, the complementing process on the basis of a plurality of pixel values VB1 in the image data DT1 to thereby calculate pixel values V over a surface, and generates the pixel value VB4 on the basis of the pixel values V over the surface.

In such a manner, the image data generator 16 generates the image data DT4 illustrated in (C) of FIG. 23 on the basis of the image data DT1 illustrated in (A) of FIG. 23. Then, the image data generator 16 performs the predetermined image processing on the basis of the image data DT4 to thereby generate the image data DP ((C) of FIG. 10) representing the captured image.

Further, as illustrated in FIG. 22, the phase difference data generator 17 of the signal processor 15 performs the predetermined image processing on the basis of the image data DT1 to thereby generate the phase difference data DF representing the image-plane phase difference. More specifically, the image data DT1 includes image data (image data DT11) including the pixel values V at the light-receiving pixels P disposed on the left in the plurality of pixel pairs 90, and image data (image data DT12) including the pixel values V at the light-receiving pixels P disposed on the right in the plurality of pixel pairs 90. The phase difference data generator 17 is therefore able to generate the phase difference data DF on the basis of the image data DT1 (image data DT11 and DT12).

Here, the imaging mode MC corresponds to a specific example of a "third imaging mode" in the present disclosure. The pixel value in the image data DT1 corresponds to a specific example of the "first pixel value" in the present disclosure. The pixel value in the image data DT2 corresponds to a specific example of the "second pixel value" in the present disclosure. The pixel value in the image data DT3 corresponds to a specific example of the "third pixel value" in the present disclosure. The pixel value in the image data DT4 corresponds to a specific example of the "fourth pixel value" in the present disclosure.

As described above, the imaging apparatus 1 is provided with the plurality of pixel blocks 100 that each includes the plurality of light-receiving pixels P including the color filters of mutually the same color. The plurality of light-receiving pixels P is divided into the plurality of pixel pairs 90 each including two light-receiving pixels P. The plurality of lenses 101 is provided at the respective positions corresponding to the plurality of pixel pairs 90. This makes it possible for the imaging apparatus 1 to generate the phase difference data DF at high resolution over the entire surface of the pixel array 11. Therefore, for example, a camera equipped with such an imaging apparatus 1 is able to achieve highly accurate autofocusing with various zoom factors, for example. As a result, the imaging apparatus 1 makes it possible to increase image quality.

Further, in the imaging apparatus 1, the number of the plurality of light-receiving pixels in a certain pixel block 100 is greater than the number of the plurality of light-receiving pixels in another certain pixel block 100. Specifically, in this example, the number of the light-receiving pixels PGr in the pixel block 100Gr and the number of the light-receiving pixels PGb in the pixel block 100Gb are greater than the number of the light-receiving pixels PR in the pixel block 100R and the number of the light-receiving pixels PB in the pixel block 100B. This makes it possible to, for example, increase the light-receiving sensitivity to green to thereby increase the image quality of a captured image.

Further, the imaging apparatus 1 is provided with the three imaging modes MA to MC to perform the remosaic process in the imaging modes MB and MC. Thus, in the imaging apparatus 1, the remosaic process in the imaging mode MB adjusts the number of effective pixels in the imaging mode MB, in particular, to make it possible to reduce a change in the number of effective pixels in a case where the zoom factor is changed. It is thus possible to suppress a change in the image quality of a captured image.

[Effects]

As described above, in the present embodiment, the plurality of pixel blocks is provided that each includes the plurality of light-receiving pixels including the color filters of mutually the same color. The plurality of light-receiving pixels P is divided into the plurality of pixel pairs 90 each including two light-receiving pixels P. In addition, the plurality of lenses is provided at the respective positions corresponding to the plurality of pixel pairs 90. This makes it possible to achieve highly accurate autofocusing, thus making it possible to increase image quality.

In the present embodiment, the number of the plurality of light-receiving pixels in a certain pixel block is greater than the number of the plurality of light-receiving pixels in another certain pixel block. This makes it possible to increase the image quality of a captured image.

In the present embodiment, the three imaging modes MA to MC are provided to perform the remosaic process in the imaging modes MB and MC. This makes it possible to reduce a change in the image quality of a captured image in a case where the zoom factor is changed.

Modification Example 1

In the embodiment described above, in the imaging mode MC, the imaging apparatus 1 targets the plurality of individual light-receiving pixels P for the readout operation separately as illustrated in FIGS. 19 and 20; however, this is non-limiting. Alternatively, for example, in the imaging mode MC also, as in the case of the imaging mode MB (FIGS. 14 and 15), the light-receiving pixel P disposed on the left in a pixel pair may be targeted for the readout operation to thereby generate a pixel value V and thereafter the two light-receiving pixels P in the pixel pair 90 may be targeted for the readout operation to thereby generate a pixel value V. In this case, in the imaging mode MC, as in the case of the imaging mode MB, the signal processor 15 generates the image data DT1 illustrated in (A) of FIG. 14 and the image data DT2 illustrated in (B) of FIG. 14 by the readout operation. A description is given below of the operation of the signal processor 15 in this case.

FIG. 25 illustrates an example of the image processing by the signal processor in the imaging mode MC.

First, the signal processor 15 generates the image data DT3 by performing the subtraction process, as in the case of the imaging mode MB (FIG. 16), on the basis of the image data DT1 and DT2.

Then, as illustrated in FIG. 25, the image data generator 16 of the signal processor 15 performs predetermined image processing on the basis of the image data DT1 and DT3 to thereby generate the image data DP ((C) of FIG. 10) representing the captured image. More specifically, because the image data DT1 includes the pixel values V at the light-receiving pixels P disposed on the left in the plurality of pixel pairs 90 and the image data DT3 includes the pixel values V at the light-receiving pixels P disposed on the right in the plurality of pixel pairs 90, the image data DT1 and DT3 include the pixel values V at all of the light-receiving pixels. Therefore, the image data generator 16 generates the image data DP by performing predetermined image processing on the basis of the image data DT1 and DT3. The predetermined image processing includes a remosaic process of performing corrections of the pixel values V and performing rearrangement of the pixel values V. This remosaic process is similar to that in the case of the embodiment described above (FIGS. 23 and 24A to 24C).

Further, as illustrated in FIG. 25, the phase difference data generator 17 of the signal processor 15 performs predetermined image processing on the basis of the image data DT1 to thereby generate the phase difference data DF representing the image-plane phase difference. More specifically, the image data DT1 includes the pixel values V at the light-receiving pixels P disposed on the left in the plurality of pixel pairs 90, and the image data DT3 includes the pixel values V at the light-receiving pixels P disposed on the right in the plurality of pixel pairs 90. The phase difference data generator 17 is therefore able to generate the phase difference data DF on the basis of the image data DT1 and DT3.

Thus, the imaging device according to the present modification example makes it possible to increase the frame rate in the imaging mode MC. More specifically, in the embodiment described above, the readout operation illustrated in FIG. 21 is performed in each of (A) to (L) of FIG. 20. Therefore, the readout operation illustrated in FIG. 21 is performed twelve times. In contrast, in the present modification example, the readout operation illustrated in FIG. 12 is performed in each of (A) and (B) of FIG. 15, (C) and (D) of FIG. 15, (E) and (F) of FIG. 15, (G) and (H) of FIG. 15, (I) and (J) of FIG. 15, and (K) and (L) of FIG. 15. Therefore, the readout operation illustrated in FIG. 12 is performed six times. A time necessary to perform the readout operation illustrated in FIG. 12 six times is shorter than a time necessary to perform the readout operation illustrated in FIG. 21 twelve times. Thus, the present modification example makes it possible to increase the frame rate.

Modification Example 2

In the embodiment described above, as illustrated in FIG. 3, the insulating layer 113 is provided at a boundary between the plurality of light-receiving pixels P in the substrate of the semiconductor substrate 111; however, this is non-limiting. Alternatively, for example, as illustrated in FIG. 26, an insulating layer 123 may be provided at a boundary between the plurality of pixel pairs 90 in the substrate of the semiconductor substrate 111 and, for example, an impurity layer 124 doped with P-type impurities may be provided between the two light-receiving pixels P in a pixel pair 90. Note that this is non-limiting and, for example, as illustrated in FIG. 27, the impurity layer 124 may be provided in part between the two light-receiving pixels P in a pixel pair 90. This makes it possible to reduce a difference between the amount of received light of the light-receiving pixel PGr and the amount of received light of the light-receiving pixel PGb, as described below.

More specifically, in the pixel array 11 (FIG. 3) according to the case of the embodiment described above, the insulating layer 113 configured using, for example, an oxide film or the like is provided between the two light-receiving pixels P in a pixel pair 90. Therefore, for example, as illustrated in FIG. 28, light L entering the pixel array 11 and condensed by the lens 101 can be reflected at, for example, an upper portion of the insulating layer 113, and the reflected light can enter the semiconductor region 112 to travel straight forward as it is, and can enter the semiconductor region 112 of the adjacent light-receiving pixel P via the insulating layer 113. Therefore, as illustrated in FIG. 29, for example, light of red LR having entered a light-receiving pixel PR of a pixel block 100R can thereafter enter the semiconductor region 112 of a light-receiving pixel PGr of a pixel block 100Gr adjacent to that pixel block 100R. In this case, the light-receiving pixel PGr of this pixel block 100Gr detects not only light of green but also the light of red LR. Similarly, for example, light of blue LB having entered a light-receiving pixel PB of a pixel block 100B can thereafter enter the semiconductor region 112 of a light-receiving pixel PGb of a pixel block 100Gb adjacent to that pixel block 100B. In this case, the light-receiving pixel PGb of this pixel block 100Gb detects not only light of green but also the light of blue LB. In this way, the light-receiving pixel PGr for green detects not only the light of green but also the light of red LR, and the light-receiving pixel PGb for green detects not only the light of green but also the light of blue LB. Therefore, even in a case where uniform light of green enters, a difference occurs between the amount of received light at the light-receiving pixel PGr and the amount of received light at the light-receiving pixel PGb depending on a balance between the light intensity of the light of red LR and the light intensity of the light of blue LB.

In contrast, in a case of the present modification example (FIGS. 26 and 27), the impurity layer 124 is provided between the two light-receiving pixels P in a pixel pair 90. Because a difference between a refractive index at the semiconductor substrate 111 and a refractive index at the impurity layer 124 is small, it is possible to reduce the possibility of reflection of the entering light L. This makes it possible to reduce the possibility that the light-receiving pixel PGr for green can detect the light of red LR and the possibility that the light-receiving pixel PGb for green can detect the light of blue LB. It is therefore possible to reduce the possibility of occurrence of a difference between the amount of received light at the light-receiving pixel PGr and the amount of received light at the light-receiving pixel PGb.

Note that in this example, as illustrated in FIGS. 26 and 27, the impurity layer 124 is provided, in place of the insulating layer 123, in entirety or in part between the two light-receiving pixels P in each of all the pixel pairs 90 in the pixel array 11; however, this is non-limiting. For example, the impurity layer 124 may be provided, in place of the insulating layer 123, in entirety or in part between the two light-receiving pixels P for only the pixel pairs 90 that include the color filters 115 of red. Further, the impurity layer 124 may be provided, in place of the insulating layer 123, in entirety or in part between the two light-receiving pixels P for only the pixel pairs 90 that include the color filters 115 of red and the pixel pairs 90 that include the color filters 115 of blue.

Modification Example 3

In the embodiment described above, as illustrated in FIG. 2, the pixel blocks 100Gr and 100Gb each including ten light-receiving pixels P and the pixel blocks 100R and 100B each including eight light-receiving pixel P are provided; however, this is non-limiting. A detailed description is given below with reference to some examples.

FIG. 30 illustrates a configuration example of an imaging apparatus 2 according to the present modification example. The imaging apparatus 2 includes a pixel array 31, a driving unit 32, and a signal processor 35.

FIG. 31 illustrates an example of arrangement of the light-receiving pixels P in the pixel array 31. The pixel array 31 includes a plurality of pixel blocks 300 and a plurality of lenses 101.

The plurality of pixel blocks 300 includes pixel blocks 300R, 300Gr, 300Gb, and 300B. In the pixel array 31, the plurality of light-receiving pixels P is arranged in units (units U) of four pixel blocks 300 (the pixel blocks 300R, 300Gr, 300Gb, and 300B).

The pixel block 300R includes eight light-receiving pixels P (light-receiving pixels PR) that include the color filters 115 of red (R). The pixel block 300Gr includes eight light-receiving pixels P (light-receiving pixels PGr) that include the color filters 115 of green (G). The pixel block 300Gb includes ten light-receiving pixels P (light-receiving pixels PGb) that include the color filters 115 of green (G). The pixel block 300B includes eight light-receiving pixels P (light-receiving pixels PB) that include the color filters 115 of blue (B). An arrangement pattern of the light-receiving pixels PR in the pixel block 300R, an arrangement pattern of the light-receiving pixels PGr in the pixel block 300Gr, an arrangement pattern of the light-receiving pixels PGb in the pixel block 300Gb, and an arrangement pattern of the light-receiving pixels PB in the pixel block 300B are identical with each other. In the unit U, the pixel block 300Gr is disposed on the upper left, the pixel block 300R is disposed on the upper right, the pixel block 300B is disposed on the lower left, and the pixel block 300Gb is disposed on the lower right. In such a manner, the pixel blocks 300R, 300Gr, 300Gb, and 300B are arranged in the so-called Bayer arrangement in units of pixel blocks 300.

In the pixel array 31, the plurality of light-receiving pixels P is arranged side by side in a diagonal direction. More specifically, in the pixel array 11 (FIG. 2) according to the embodiment described above, the plurality of light-receiving pixels P is arranged side by side in the X direction and the Y direction, whereas in the pixel array 31 (FIG. 31), the plurality of light-receiving pixels P is arranged side by side in the diagonal direction. Thus, the two light-receiving pixels P in a pixel pair 90 are also arranged side by side in the diagonal direction. The lens 101 is provided over the pixel pair 90.

The pixel blocks 300 (the pixel blocks 300R, 300Gr, 300Gb, and 300B) each have a configuration similar to that of the pixel block 100R (FIG. 5) according to the embodiment described above, and each include eight photodiodes PD, eight transistors TRG, the floating diffusion FD, and the transistors RST, AMP, and SEL. The eight photodiodes PD and the eight transistors TRG each respectively correspond to the eight light-receiving pixels P included in the pixel block 300.

FIG. 32 illustrates an example of wiring between the pixel blocks 300R, 300Gr, 300Gb, and 300B. Note that in FIG. 32, the plurality of pixel blocks 300 is depicted as being separated away from each other for convenience in description.

Like the pixel array 11 according to the embodiment described above, the pixel array 31 includes a plurality of control lines TRGL, a plurality of control lines RSTL, a plurality of control lines SELL, and a plurality of signal lines VSL. The control lines TRGL extend in the X direction and have respective one ends coupled to the driving unit 32. The control lines RSTL extend in the X direction and have respective one ends coupled to the driving unit 32. The control lines SELL extend in the X direction and have respective one ends coupled to the driving unit 32. The signal lines VSL extend in the Y direction and have respective one ends coupled to the readout unit 20.

The pixel block 300Gr and the pixel block 300R arranged in the X direction and belonging to the same row are coupled to the same eight control lines TRGL. Further, although not illustrated, the pixel blocks 300Gr and 300R arranged in the X direction and belonging to the same row are coupled to one control line RSTL and one control line SELL. Further, the pixel blocks 300Gr arranged in the Y direction and belonging to the same column are coupled to one signal line VSL. Similarly, the pixel blocks 300R arranged in the Y direction and belonging to the same column are coupled to one signal line VSL.

Similarly, the pixel blocks 300B and 300Gb arranged in the X direction and belonging to the same row are coupled to the same eight control lines TRGL. Further, although not illustrated, the pixel blocks 300B and 300Gb arranged in the X direction and belonging to the same row are coupled to one control line RSTL and one control line SELL. Further, the pixel blocks 300B arranged in the Y direction and belonging to the same column are coupled to one signal line VSL. Similarly, the pixel blocks 300Gb arranged in the Y direction and belonging to the same column are coupled to one signal line VSL.

Thus, the pixel array 31 allows, for example, a line density of the control lines TRGL to be lower than that in the pixel array 11 according to the embodiment described above. Specifically, in the pixel array 11 (FIGS. 2 and 6) according to the embodiment described above, the line density of the control lines TRGL is four per length of one side of the light-receiving pixel P. In contrast, in the pixel array 31 (FIGS. 31 and 32) according to the present modification example, the line density of the control lines TRGL is 2.83 (=2 √2) per length of one side of the light-receiving pixel P. Thus, the pixel array 31 makes it possible to, for example, carry out wiring of the control lines TRGL more easily, or makes it possible to reduce a pitch of the light-receiving pixels P to thereby increase resolution.

The driving unit 32 (FIG. 30) is configured to drive the plurality of light-receiving pixels P in the pixel array 31 on the basis of instructions from the imaging controller 18. The signal processor 35 is configured to generate the image signal Spic by performing predetermined signal processing on the basis of the image signal Spic0 and instructions from the imaging controller 18. The signal processor 35 includes an image data generator 36 and a phase difference data generator 37.

The imaging apparatus 2 is able to select, for example, a first imaging mode M in a case where the zoom factor is less than 2, select a second imaging mode M in a case where the zoom factor is 2 or more and less than 2 √2, and select a third imaging mode M in a case where the zoom factor is 2 √2 or more.

In this way, by arranging the light-receiving pixels P as illustrated in FIG. 31 in the imaging apparatus 2, it is possible to reduce the possibility of occurrence of a difference between the amount of received light at the light-receiving pixel PGr and the amount of received light at the light-receiving pixel PGb even in a case where light L reflects at the insulating layer 113 as in FIG. 28.

More specifically, as illustrated in FIG. 33, even in this case, there is a possibility that the light-receiving pixel PGr for green can detect not only light of green but also light of red LR, and the light-receiving pixel PGb for green can detect not only light of green but also light of blue LB. However, the position where the pixel block 300Gr is disposed and the position where the pixel block 300Gb is disposed are symmetrical with respect to the pixel block 300R, and are similarly symmetrical with respect to the pixel block 300B. Therefore, for example, a light amount of the light of red LR leaking from the pixel block 300R to the pixel block 300Gr is substantially the same as a light amount of the light of red LR leaking from the pixel block 300R to the pixel block 300Gb. Similarly, for example, a light amount of the light of blue LB leaking from the pixel block 300B to the pixel block 300Gr is substantially the same as a light amount of the light of blue LB leaking from the pixel block 300B to the pixel block 300Gb. Therefore, it is possible to reduce the possibility of occurrence of a difference between the amount of received light at the light-receiving pixel PGr and the amount of received light at the light-receiving pixel PGb depending on the balance between the light intensity of the light of red LR and the light intensity of the light of blue LB, for example.

Although the four pixel blocks 300 (the pixel blocks 300R, 300Gr, 300Gb, and 300B) are provided as a unit (unit U) of arrangement in this example, this is non-limiting. A detailed description is given below with reference to an example in which eight pixel blocks are provided as a unit of arrangement. An imaging apparatus 2A according to the present modification example includes a pixel array 31A, a driving unit 32A, and a signal processor 35A, similarly to the imaging apparatus 2 (FIG. 30).

FIG. 34 illustrates an example of arrangement of the light-receiving pixels P in the pixel array 31A. The pixel array 31A includes a plurality of pixel blocks 300 and a plurality of lenses 101.

The pixel array 31A includes the plurality of pixel blocks 300 and the plurality of lenses 101, similarly to the pixel array 31 (FIG. 31).

The plurality of pixel blocks 300 includes pixel blocks 300R1, 300R2, 300Gr1, 300Gr2, 300Gb1, 300Gb2, 300B1, and 300B2. The pixel blocks 300 (the pixel blocks 300R1, 300R2, 300Gr1, 300Gr2, 300Gb1, 300Gb2, 300B1, and 300B2) each include four light-receiving pixels P. Specifically, each of the pixel blocks 300R1 and 300R2 includes four light-receiving pixels PR, each of the pixel blocks 300Gr1 and 300Gr2 includes four light-receiving pixels PGr, each of the pixel blocks 300Gb1 and 300Gb2 includes four light-receiving pixels PGb, and each of the pixel blocks 300B1 and 300B2 includes four light-receiving pixels PB. The pixel blocks 300 each include four photodiodes PD, four transistors TRG, the floating diffusion FD, and the transistors RST, AMP, and SEL. The four photodiodes PD and the four transistors TRG each respectively correspond to the four light-receiving pixels P included in the pixel block 300.

FIG. 35 illustrates an example of wiring between the pixel blocks 300R1, 300R2, 300Gr1, 300Gr2, 300Gb1, 300Gb2, 300B1, and 300B2. Note that in FIG. 34, the plurality of pixel blocks 300 is depicted as being separated away from each other for convenience in description.

The pixel blocks 300Gr1, 300Gr2, 300R1, and 300R2 arranged in the X direction and belonging to the same row are coupled to the same four control lines TRGL. Further, although not illustrated, the pixel blocks 300Gr1, 300Gr2, 300R1, and 300R2 arranged in the X direction and belonging to the same row are coupled to one control line RSTL and one control line SELL. Further, the pixel blocks 300Gr1 arranged in the Y direction and belonging to the same column are coupled to one signal line VSL, and the pixel blocks 300Gr2 arranged in the Y direction and belonging to the same column are coupled to one signal line VSL. Similarly, the pixel blocks 300R1 arranged in the Y direction and belonging to the same column are coupled to one signal line VSL, and the pixel blocks 300R2 arranged in the Y direction and belonging to the same column are coupled to one signal line VSL Similarly, the pixel blocks 300B1, 300B2, 300Gb1, and 300Gb2 arranged in the X direction and belonging to the same row are coupled to the same four control lines TRGL. Further, although not illustrated, the pixel blocks 300B1, 300B2, 300Gb1, and 300Gb2 arranged in the X direction and belonging to the same row are coupled to one control line RSTL and one control line SELL. Further, the pixel blocks 300B1 arranged in the Y direction and belonging to the same column are coupled to one signal line VSL, and the pixel blocks 300B2 arranged in the Y direction and belonging to the same column are coupled to one signal line VSL. Similarly, the pixel blocks 300Gb1 arranged in the Y direction and belonging to the same column are coupled to one signal line VSL, and the pixel blocks 300Gb2 arranged in the Y direction and belonging to the same column are coupled to one signal line VSL.

Thus, the pixel array 31A allows, for example, the line density of the control lines TRGL to be lower than that in the pixel array 31 according to the above-described modification example. Specifically, in this pixel array 31A, the line density of the control lines TRGL is 1.41 ($=\sqrt{2}$) per length of one side of the light-receiving pixel P. Thus, the pixel array 31A makes it possible to, for example, carry out wiring of the control lines TRGL more easily, or makes it possible to reduce the pitch of the light-receiving pixels P.

The driving unit 32A is configured to drive the plurality of light-receiving pixels P in the pixel array 31 on the basis of instructions from the imaging controller 18. The signal processor 35A is configured to generate the image signal Spic by performing predetermined signal processing on the basis of the image signal Spic0 and instructions from the imaging controller 18. The signal processor 35A includes an image data generator 36A and a phase difference data generator 37A.

In the above example, the two light-receiving pixels P in a pixel pair 90 are arranged side by side in the diagonal direction; however, this is non-limiting. Alternatively, for example, the two light-receiving pixels P in a pixel pair 90 may be arranged side by side in the X direction as in a pixel array 31B illustrated in FIG. 36, for example.

Other Modification Examples

Further, two or more of these modification examples may be combined.

2. Usage Example of Imaging Apparatus

FIG. 37 illustrates a usage example of the imaging apparatus 1 according to the embodiment described above. For example, the imaging apparatus 1 described above is usable in a variety of cases of sensing light, including visible light, infrared light, ultraviolet light, and X-rays as follows.

Apparatuses that shoot images for viewing, including digital cameras and mobile equipment having a camera function Apparatuses for traffic use, including onboard sensors that shoot images of the front, back, surroundings, inside, and so on of an automobile for safe driving such as automatic stop and for recognition of a driver's state, monitoring cameras that monitor traveling vehicles and roads, and distance measuring sensors that measure distances including a vehicle-to-vehicle distance Apparatuses for use in home electrical appliances including televisions, refrigerators, and air-conditioners to shoot images of a user's gesture and bring the appliances into operation in accordance with the gesture Apparatuses for medical care and health care use, including endoscopes and apparatuses that shoot images of blood vessels by receiving infrared light Apparatuses for security use, including monitoring cameras for crime prevention and cameras for individual authentication Apparatuses for beauty care use, including skin measuring apparatuses that shoot images of skin and microscopes that shoot images of scalp Apparatuses for sports use, including action cameras and wearable cameras for sports applications and the like Apparatuses for agricultural use, including cameras for monitoring the states of fields and crops 3. Example of Application to Mobile Body The technology (the present technology) according to the present disclosure is applicable to a variety of products. For example, the technology according to the present disclosure may be achieved as an apparatus to be installed aboard any type of mobile body such as an automobile, an electric vehicle, a hybrid electric vehicle, a motorcycle, a bicycle, a personal mobility, an airplane, a drone, a vessel, or a robot.

FIG. 38 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 38, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 38, an audio speaker 12061, a display section 12062, and an instrument panel 12063 are illustrated as the output device. The display section 12062 may, for example, include at least one of an on-board display and a head-up display.

FIG. 39 is a diagram depicting an example of the installation position of the imaging section 12031.

In FIG. 39, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 39 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 among the above-described components. The imaging apparatus to be installed aboard a vehicle makes it possible to increase the image quality of a captured image. As a result, it is possible for the vehicle control system 12000 to achieve, with high accuracy, a collision avoidance or collision mitigation function for the vehicle, a following driving function based on vehicle-to-vehicle distance, a vehicle speed maintaining driving function, a warning function against collision of the vehicle, a warning function against deviation of the vehicle from a lane, and the like.

Although the present technology has been described above with reference to the embodiment, modification examples, and specific application examples thereof, the present technology is not limited to these embodiment and the like, and is modifiable in a variety of ways.

For example, the arrangement of the pixel blocks in the pixel array, and the arrangement of the light-receiving pixels P in the pixel blocks are not limited to the arrangements described in the embodiment and the like described above, and various arrangements are possible.

It is to be noted that the effects described in the present specification are merely exemplary and non-limiting, and other effects may also be achieved.

It is to be noted that the present technology may have the following configurations. The present technology having the following configurations makes it possible to increase the image quality of a captured image.

(1)

An imaging apparatus including:
a plurality of pixel blocks that each includes a plurality of light-receiving pixels including color filters of mutually same color, the plurality of light-receiving pixels being divided into a plurality of pixel pairs each including two light-receiving pixels; and
a plurality of lenses provided at respective positions corresponding to the plurality of pixel pairs.

(2)

The imaging apparatus according to (1), in which
the two light-receiving pixels are arranged side by side in a first direction, and
in each of the plurality of pixel blocks, two of the pixel pairs disposed side by side in a second direction intersecting with the first direction are disposed to be shifted from each other in the first direction.

(3)

The imaging apparatus according to (2), further including two control lines coupled respectively to the two light-receiving pixels and extending in the first direction.

(4)

The imaging apparatus according to (2), further including two control lines coupled respectively to the two light-receiving pixels and extending in a third direction different from the first direction and the second direction.

(5)

The imaging apparatus according to any one of (1) to (4), in which
the plurality of pixel blocks includes a first pixel block and a second pixel block,
in the first pixel block, the plurality of light-receiving pixels is arranged in a first arrangement pattern, and
in the second pixel block, the plurality of light-receiving pixels is arranged in a second arrangement pattern.

(6)

The imaging apparatus according to (5), in which
a number of the plurality of light-receiving pixels in the first pixel block is greater than a number of the plurality of light-receiving pixels in the second pixel block, and
the plurality of light-receiving pixels included in the first pixel block includes the color filters of green.

(7)

The imaging apparatus according to any one of (1) to (4), in which, in each of the plurality of pixel blocks, the plurality of light-receiving pixels is arranged in a predetermined arrangement pattern.

(8)

The imaging apparatus according to any one of (1) to (7), further including an insulating layer provided between adjacent pixel pairs of the plurality of pixel pairs.

(9)

The imaging apparatus according to (8), further including an impurity layer that is provided in part between the two light-receiving pixels in each of the plurality of pixel pairs in each of the plurality of pixel blocks, in which the insulating layer is provided between the two light-receiving pixels at a portion where the impurity layer is not provided.

(10)

The imaging apparatus according to (8), further including an impurity layer that is provided in part between the two light-receiving pixels in each of the plurality of pixel pairs in a pixel block that includes the plurality of light-receiving pixels including the color filters of a first color among the plurality of pixel blocks, in which
  in the pixel block, the insulating layer is provided between the two light-receiving pixels at a portion where the impurity layer is not provided.

(11)

The imaging apparatus according to (8), further including an impurity layer that is provided between the two light-receiving pixels in each of the plurality of pixel pairs in each of the plurality of pixel blocks.

(12)

The imaging apparatus according to (8), further including an impurity layer that is provided between the two light-receiving pixels in each of the plurality of pixel pairs in a pixel block that includes the plurality of light-receiving pixels including the color filters of a first color among the plurality of pixel blocks.

(13)

The imaging apparatus according to any one of (1) to (12), further including a signal processor that generates image data and phase difference data on the basis of amounts of received light in the plurality of pixel blocks.

(14)

The imaging apparatus according to (13), in which
  the imaging apparatus has a first imaging mode, and
  in the first imaging mode, the signal processor
    calculates, for each of the plurality of pixel blocks, a first pixel value of the plurality of pixel pairs on the basis of an amount of received light of one of the two light-receiving pixels in each of the plurality of pixel pairs, and calculates a second pixel value of the plurality of pixel pairs on the basis of amounts of received light of both of the two light-receiving pixels in each of the plurality of pixel pairs;
    calculates a third pixel value by subtracting the first pixel value from the second pixel value; and
    generates the image data on the basis of the second pixel value and generates the phase difference data on the basis of the first pixel value and the third pixel value.

(15)

The imaging apparatus according to (13), in which
  the imaging apparatus has a second imaging mode, and
  in the second imaging mode, the signal processor
    calculates, for each of the plurality of pixel blocks, a plurality of first pixel values of the plurality of pixel pairs individually on the basis of an amount of received light of one of the two light-receiving pixels in each of the plurality of pixel pairs, and calculates a plurality of second pixel values of the plurality of pixel pairs individually on the basis of amounts of received light of both of the two light-receiving pixels in each of the plurality of pixel pairs;
    calculates a plurality of third pixel values individually by subtracting the plurality of first pixel values from the plurality of second pixel values, respectively; and
    generates the image data on the basis of the plurality of second pixel values and generates the phase difference data on the basis of the plurality of first pixel values and the plurality of third pixel values.

(16)

The imaging apparatus according to (15), in which the signal processor performs an interpolation process on the basis of the plurality of second pixel values and thereby generates a plurality of fourth pixel values at a plurality of pixel positions different from a plurality of pixel positions of the plurality of second pixel values to thereby generate the image data.

(17)

The imaging apparatus according to (16), in which a number of the plurality of fourth pixel values is smaller than a number of the plurality of second pixel values.

(18)

The imaging apparatus according to (13), in which
  the imaging apparatus has a third imaging mode, and
  in the third imaging mode, the signal processor
    calculates, for each of the plurality of pixel blocks, a plurality of first pixel values of the plurality of light-receiving pixels individually on the basis of respective amounts of received light of the plurality of light-receiving pixels; and
    generates the image data on the basis of the plurality of first pixel values and generates the phase difference data on the basis of, among the plurality of first pixel values, a plurality of pixel values relating to one of the two light-receiving pixels and a plurality of pixel values relating to another of the two light-receiving pixels.

(19)

The imaging apparatus according to (18), in which the signal processor performs an interpolation process on the basis of the plurality of first pixel values and thereby generates a plurality of fourth pixel values at a plurality of pixel positions different from a plurality of pixel positions of the plurality of first pixel values to thereby generate the image data.

(20)

The imaging apparatus according to (13), in which
  the imaging apparatus has a third imaging mode, and
  in the third imaging mode, the signal processor
    calculates, for each of the plurality of pixel blocks, a plurality of first pixel values of the plurality of pixel pairs individually on the basis of an amount of received light of one of the two light-receiving pixels in each of the plurality of pixel pairs, and calculates a plurality of second pixel values of the plurality of pixel pairs individually on the basis of amounts of received light of both of the two light-receiving pixels in each of the plurality of pixel pairs;
    calculates a plurality of third pixel values individually by subtracting the plurality of first pixel values from the plurality of second pixel values, respectively; and
    generates the image data on the basis of the plurality of first pixel values and the plurality of third pixel values and generates the phase difference data on the basis of the plurality of first pixel values and the plurality of third pixel values.

This application claims the priority on the basis of Japanese Patent Application No. 2020-208541 filed with Japan Patent Office on Dec. 16, 2020, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device comprising:
a plurality of pixel blocks including a first pixel block and a second pixel block, each of the plurality pixel blocks including a plurality of light-receiving pixels, all of the light-receiving pixels of the first pixel block including color filters corresponding to a first wavelength of light, all of the light-receiving pixels of the second pixel block including color filters corresponding to a second wavelength of light, the plurality of light-receiving pixels being divided into a plurality of pixel pairs each including two light-receiving pixels;
a plurality of lenses provided at respective positions corresponding to the plurality of pixel pairs; and
an imaging controller configured to select from among a first imaging mode, a second imaging mode and a third imaging mode based upon zoom factor information, wherein
the first pixel block has a first number of pixels, and the second pixel block has a second number of pixels that is different from the first number of pixels.

2. The imaging device according to claim 1, wherein the first imaging mode, the second imaging mode and the third imaging mode respectively correspond to different zoom factors identified by the zoom factor information.

3. The imaging device according to claim 2, wherein the first imaging mode is selected for a first zoom factor, the first zoom factor being less than a first threshold value.

4. The imaging device according to claim 3, wherein the second imaging mode is selected for a second zoom factor, the second zoom factor being greater than or equal to the first threshold value and less than a second threshold value.

5. The imaging device according to claim 4, wherein the third imaging mode is selected for a third zoom factor, the third zoom factor being greater than or equal to the second threshold value.

6. The imaging device according to claim 1, wherein the first pixel block has a first pattern, and the second pixel block has a second pattern that is different from the first pattern.

7. The imaging device according to claim 1, wherein pixel values respectively correspond to each of the plurality of pixel blocks.

8. An imaging device comprising:
a plurality of pixel blocks including a first pixel block and a second pixel block, each of the plurality pixel blocks including a plurality of light-receiving pixels, all of the light-receiving pixels of the first pixel block including color filters corresponding to a first wavelength of light, all of the light-receiving pixels of the second pixel block including color filters corresponding to a second wavelength of light, the plurality of light-receiving pixels being divided into a plurality of pixel pairs each including two light-receiving pixels;
a plurality of lenses provided at respective positions corresponding to the plurality of pixel pairs; and
an imaging controller configured to select from among a first imaging mode, a second imaging mode and a third imaging mode based upon zoom factor information, wherein
a first pixel value corresponds to the first imaging mode, a second pixel value corresponds to the second imaging mode, a third pixel value corresponds to the third imaging mode, the first pixel value is nine times the third pixel value, and the second pixel value is four times the third pixel value.

9. An imaging device comprising:
a plurality of pixel blocks including a first pixel block and a second pixel block, each of the plurality pixel blocks including a plurality of light-receiving pixels, all of the light-receiving pixels of the first pixel block including color filters corresponding to a first wavelength of light, all of the light-receiving pixels of the second pixel block including color filters corresponding to a second wavelength of light, the plurality of light-receiving pixels being divided into a plurality of pixel pairs each including two light-receiving pixels;
a plurality of lenses provided at respective positions corresponding to the plurality of pixel pairs; and
an imaging controller configured to select from among a first imaging mode, a second imaging mode and a third imaging mode based upon zoom factor information, wherein
the first imaging mode, the second imaging mode, and the third imaging mode have a same maximum number of effective pixels.

10. The imaging device according to claim 9, wherein the same maximum number of effective pixels is 12M pixels.

11. An imaging device comprising:
a plurality of pixel blocks including a first pixel block and a second pixel block, each of the plurality pixel blocks including a plurality of light-receiving pixels, all of the light-receiving pixels of the first pixel block including color filters corresponding to a first wavelength of light, all of the light-receiving pixels of the second pixel block including color filters corresponding to a second wavelength of light, the plurality of light-receiving pixels being divided into a plurality of pixel pairs each including two light-receiving pixels;
a plurality of lenses provided at respective positions corresponding to the plurality of pixel pairs; and
an imaging controller configured to select from among a first imaging mode, a second imaging mode and a third imaging mode based upon zoom factor information, wherein
in the first imaging mode, the imaging controller
calculates, for each of the plurality of pixel blocks, a first pixel value of the plurality of pixel pairs on a basis of an amount of received light of one of the two light-receiving pixels in each of the plurality of pixel pairs, and calculates a second pixel value of the plurality of pixel pairs on a basis of amounts of received light of both of the two light-receiving pixels in each of the plurality of pixel pairs;
calculates a third pixel value by subtracting the first pixel value from the second pixel value; and
generates image data on a basis of the second pixel value and generates phase difference data on a basis of the first pixel value and the third pixel value.

12. The imaging device according to claim 11, wherein
in the second imaging mode, the imaging controller
calculates, for each of the plurality of pixel blocks, a plurality of first pixel values of the plurality of pixel pairs individually on a basis of an amount of received light of one of the two light-receiving pixels in each of the plurality of pixel pairs, and calculates a plurality of second pixel values of the plurality of pixel pairs individually on a basis of amounts of received light of both of the two light-receiving pixels in each of the plurality of pixel pairs;
calculates a plurality of third pixel values individually by subtracting the plurality of first pixel values from the plurality of second pixel values, respectively; and generates the image data on a basis of the plurality of second pixel values and generates the phase difference data on a basis of the plurality of first pixel values and the plurality of third pixel values.

13. The imaging device according to claim 12, wherein in the third imaging mode, the imaging controller calculates, for each of the plurality of pixel blocks, a plurality of first pixel values of the plurality of light-receiving pixels individually on a basis of respective amounts of received light of the plurality of light-receiving pixels; and generates the image data on a basis of the plurality of first pixel values and generates the phase difference data on a basis of, among the plurality of first pixel values, a plurality of pixel values relating to one of the two light-receiving pixels and a plurality of pixel values relating to another of the two light-receiving pixels.

14. An imaging device comprising:

a plurality of pixel blocks including a first pixel block and a second pixel block, each of the plurality pixel blocks including a plurality of light-receiving pixels, all of the light-receiving pixels of the first pixel block including color filters corresponding to a first wavelength of light, all of the light-receiving pixels of the second pixel block including color filters corresponding to a second wavelength of light, the plurality of light-receiving pixels being divided into a plurality of pixel pairs each including two light-receiving pixels;

a plurality of lenses provided at respective positions corresponding to the plurality of pixel pairs; and circuitry configured to output image data with a pixel value which is changeable among a first imaging mode, a second imaging mode and a third imaging mode based upon zoom factor information, wherein the first pixel block has a first number of pixels, and the second pixel block has a second number of pixels that is different from the first number of pixels.

15. The imaging device according to claim 14, wherein the first imaging mode, the second imaging mode and the third imaging mode respectively correspond to different zoom factors identified by the zoom factor information.

16. The imaging device according to claim 15, wherein the first imaging mode is selected for a first zoom factor, the first zoom factor being less than a first threshold value.

17. The imaging device according to claim 16, wherein the second imaging mode is selected for a second zoom factor, the second zoom factor being greater than or equal to the first threshold value and less than a second threshold value.

18. The imaging device according to claim 17, wherein the third imaging mode is selected for a third zoom factor, the third zoom factor being greater than or equal to the second threshold value.

19. The imaging device according to claim 18, wherein the first pixel block has a first pattern, and the second pixel block has a second pattern that is different from the first pattern.

20. The imaging device according to claim 14, wherein pixel values respectively correspond to each of the plurality of pixel blocks.

21. The imaging device according to claim 20, wherein a first pixel value corresponds to the first imaging mode, a second pixel value corresponds to the second imaging mode, a third pixel value corresponds to the third imaging mode, the first pixel value is nine times the third pixel value, and the second pixel value is four times the third pixel value.

22. The imaging device according to claim 21, wherein the first imaging mode, the second imaging mode, and the third imaging mode have a same maximum number of effective pixels.

23. The imaging device according to claim 22, wherein the same maximum number of effective pixels is 12M pixels.

* * * * *